(12) United States Patent
Chung et al.

(10) Patent No.: US 9,564,435 B2
(45) Date of Patent: Feb. 7, 2017

(54) SEMICONDUCTOR DEVICE INCLUDING FINFETS HAVING DIFFERENT GATE STRUCTURES AND METHOD OF MANUFACTURING THE SEMICONDUCTOR DEVICE

(71) Applicants: Eun-ae Chung, Hwaseong-si (KR); Jung-dal Choi, Hwaseong-si (KR); Toshiro Nakanishi, Seongnam-si (KR); Yu-bin Kim, Suwon-si (KR); Gab-jin Nam, Seoul (KR); Dong-kyu Lee, Suwon-si (KR); Guangfan Jiao, Suwon-si (KR)

(72) Inventors: Eun-ae Chung, Hwaseong-si (KR); Jung-dal Choi, Hwaseong-si (KR); Toshiro Nakanishi, Seongnam-si (KR); Yu-bin Kim, Suwon-si (KR); Gab-jin Nam, Seoul (KR); Dong-kyu Lee, Suwon-si (KR); Guangfan Jiao, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 14/754,400

(22) Filed: Jun. 29, 2015

(65) Prior Publication Data
US 2016/0104705 A1  Apr. 14, 2016

(30) Foreign Application Priority Data
Oct. 13, 2014 (KR) ........................ 10-2014-0137857

(51) Int. Cl.
H01L 27/01 (2006.01)
H01L 27/12 (2006.01)
(Continued)

(52) U.S. Cl.
CPC ....... *H01L 27/0886* (2013.01); *H01L 27/1211* (2013.01); *H01L 21/823412* (2013.01); *H01L 21/823431* (2013.01)

(58) Field of Classification Search
CPC ............ H01L 29/785; H01L 29/66795; H01L 27/1211; H01L 21/845; H01L 27/0924; H01L 29/41791; H01L 27/0886; H01L 27/10826
(Continued)

(56) References Cited

U.S. PATENT DOCUMENTS 6,706,571 B1   3/2004   Yu et al.
6,909,147 B2   6/2005   Aller et al.
(Continued)

FOREIGN PATENT DOCUMENTS

JP   2005-21748    8/2005
JP   2005-217418   8/2005
(Continued)

*Primary Examiner* — Thien F Tran
(74) *Attorney, Agent, or Firm* — Myers Bigel, P.A.

(57) ABSTRACT

A semiconductor device includes a substrate having a logic device region including logic devices thereon, and an input/output (I/O) device region including I/O devices thereon adjacent the logic device region. A first fin field-effect transistor (FinFET) on the logic device region includes a first semiconductor fin protruding from the substrate, and a triple-gate structure having a first gate dielectric layer and a first gate electrode thereon. A second FinFET on the I/O device region includes a second semiconductor fin protruding from the substrate, and a double-gate structure having a second gate dielectric layer and a second gate electrode thereon. The first and second gate dielectric layers have different thicknesses. Related devices and fabrication methods are also discussed.

28 Claims, 42 Drawing Sheets

(51) Int. Cl.
  *H01L 31/0392* (2006.01)
  *H01L 27/088* (2006.01)
  *H01L 21/8234* (2006.01)

(58) Field of Classification Search
  USPC .......................... 257/347, E29.264, E29.275
  See application file for complete search history.

(56) References Cited

U.S. PATENT DOCUMENTS

| | | | |
|---|---|---|---|
| 7,224,029 B2 | 5/2007 | Anderson et al. | |
| 7,368,354 B2 | 5/2008 | Anderson et al. | |
| 7,534,669 B2 | 5/2009 | Anderson et al. | |
| 8,373,238 B2 | 2/2013 | Lee et al. | |
| 8,673,709 B2 | 3/2014 | Lee et al. | |
| 8,748,993 B2 | 6/2014 | Lee et al. | |
| 8,937,353 B2 | 1/2015 | Chen et al. | |
| 2007/0278585 A1 | 12/2007 | Dyer et al. | |
| 2008/0157225 A1* | 7/2008 | Datta ................ | H01L 27/105 257/401 |
| 2009/0008716 A1 | 1/2009 | Goto et al. | |
| 2009/0242987 A1 | 10/2009 | Van Dal et al. | |
| 2010/0190308 A1 | 7/2010 | Orlowski et al. | |
| 2011/0068405 A1 | 3/2011 | Yuan et al. | |
| 2012/0299110 A1 | 11/2012 | Hung et al. | |
| 2013/0056826 A1 | 3/2013 | Liu et al. | |
| 2013/0093026 A1 | 4/2013 | Wann et al. | |
| 2013/0119482 A1 | 5/2013 | Wann et al. | |
| 2013/0244392 A1 | 9/2013 | Oh et al. | |
| 2013/0270559 A1 | 10/2013 | Hafez et al. | |
| 2014/0106528 A1 | 4/2014 | Quyang et al. | |
| 2014/0117447 A1 | 5/2014 | Basker et al. | |
| 2014/0284723 A1 | 9/2014 | Lee et al. | |

FOREIGN PATENT DOCUMENTS

| | | |
|---|---|---|
| JP | 2007-149942 | 6/2007 |
| JP | 2007-201021 | 8/2007 |
| JP | 2011-119724 | 6/2011 |
| JP | 2013-162076 | 8/2013 |
| KR | 1020110033039 | 3/2001 |
| KR | 10200600004659 | 1/2006 |
| KR | 1020070006441 | 1/2007 |
| KR | 1020110099156 | 9/2011 |
| KR | 1020130040686 | 4/2013 |

* cited by examiner

SEMICONDUCTOR DEVICE INCLUDING FINFETS HAVING DIFFERENT GATE STRUCTURES AND METHOD OF MANUFACTURING THE SEMICONDUCTOR DEVICE

CROSS-REFERENCE TO RELATED APPLICATION

This application claims the benefit of Korean Patent Application No. 10-2014-0137857, filed on Oct. 13, 2014, in the Korean Intellectual Property Office, the disclosure of which is incorporated by reference herein in its entirety.

BACKGROUND

The inventive concepts relate to semiconductor devices, and more particularly, to semiconductor devices including a field-effect transistor (FET) having fin structures and methods of manufacturing the same.

Sizes of semiconductor devices have been reduced in order to form high capacity, high performance, and highly integrated devices. For example, in order to increase the degrees of integration of semiconductor devices per unit area, densities of the semiconductor devices may be increased by decreasing sizes of the semiconductor devices and reducing intervals between the semiconductor devices. However, when semiconductor devices have a two-dimensional (2D) planar structure, as sizes of the semiconductor devices are reduced, lengths of horizontal channels may be reduced, and thus, short channel effects may occur. In order to reduce or prevent such short channel effects, FinFETs having vertical fin structures may be used. Due to structural characteristics of the FinFETs, the FinFETs may reduce or prevent short channel effects by ensuring effective channel lengths and may increase levels of operating currents by increasing gate widths.

SUMMARY

The inventive concepts provide a semiconductor device including fin field-effect transistors (FinFETs) having different gate structures which may improve the performance of a logic device including FinFETs having various sizes, may improve the performance of a logic device according to fin scaling, may improve the reliability of an input/output (I/O) device, and may reduce or prevent a leakage current, and a method of manufacturing the semiconductor device.

According to some embodiments, a semiconductor device includes a substrate including a logic device region having logic devices thereon and an input/output (I/O) device region having I/O devices thereon adjacent the logic device region. A first fin field-effect transistor (FinFET) on the logic device region includes a first semiconductor fin protruding from the substrate, and a triple-gate structure including a first gate dielectric layer and a first gate electrode thereon. A second FinFET on the I/O device region includes a second semiconductor fin protruding from the substrate, and a double-gate structure including a second gate dielectric layer and a second gate electrode thereon. The first and second gate dielectric layers have different thicknesses.

In some embodiments, a thickness of the second gate dielectric layer at a top portion of the second semiconductor fin may be sufficient to prevent formation of a channel region at the top portion thereof during operation of the second FinFET, and a thickness of the first gate dielectric layer at a top portion of the first semiconductor fin may be sufficient to allow formation of a channel region at the top portion thereof during operation of the first FinFET.

In some embodiments, the second gate dielectric layer may include a capping insulating film on the top portion of the second semiconductor fin, and an outer dielectric film having a uniform thickness that extends on the capping insulating film and along opposing sidewalls of the second semiconductor fin. The outer dielectric film may have a same thickness as the first gate dielectric layer.

In some embodiments, the capping insulating film and/or the outer dielectric film may be an etch-stop film.

In some embodiments, a top portion of the second semiconductor fin may be free of the second gate electrode, and a surface of the second gate dielectric layer opposite the top portion of the second semiconductor fin may be coplanar with a surface of a second gate electrode.

In some embodiments, the first and second gate electrodes may be electrically isolated portions of a same conductive layer.

In some embodiments, the first and second gate electrodes may have a substantially uniform thickness on sidewalls and on top surfaces of the respective fins.

In some embodiments, a height of a first semiconductor fin relative to a surface of the substrate may be greater than or equal to a height of a second semiconductor fin relative to the surface of the substrate, and/or a width of the second semiconductor fin may be greater than or equal to a width of the first semiconductor fin.

In some embodiments, a third FinFET may be provided on the logic device region. The third FinFET may include a third semiconductor fin protruding from the substrate, and a double-gate structure including a third gate dielectric layer and a third gate electrode thereon. A thickness of the third gate dielectric layer may be greater than that of the first gate dielectric layer.

In some embodiments, respective gate spacers may be provided on the first and second semiconductor fins between the first and second gate electrodes thereon and respective source/drain regions at ends thereof. The respective source/drain regions may be epitaxial structures that are larger than respective channel regions of the first and second semiconductor fins in at least one dimension.

According to an aspect of the inventive concepts, there is provided a semiconductor device including a substrate, a first fin field-effect transistor (FinFET) having a triple-gate structure that is formed on the substrate, and a second FinFET having a double-gate structure that is formed on the substrate.

According to another aspect of the inventive concepts, there is provided a semiconductor device including a substrate, a first fin field-effect transistor (FinFET) having a triple-structure that is formed in a first region on the substrate, and a second FinFET having a double-gate structure that is formed in a second region on the substrate, wherein the first region is a region where logic devices are disposed and the second region is a region where input/output (I/O) devices are disposed, wherein a height of a first fin of the first FinFET from the substrate is equal to or greater than a height of a second fin of the second FinFET from the substrate.

According to another aspect of the inventive concepts, there is provided a method of manufacturing a semiconductor device, the method including preparing a substrate where a first region and a second region are defined, forming a fin in each of the first region and the second region, and forming a fin field-effect transistor (FinFET) by forming a gate electrode that covers the fin, wherein the forming of the fin includes forming in the first region a first fin that extends in a first direction and has a first height and forming in the second region a second fin that extends in the first direction and, has a second height, and the forming of the FinFET includes forming in the first region a first FinFET by forming a first gate electrode having a triple-gate structure that covers both side surfaces and a top surface of the first fin and forming a second FinFET by forming in the second region a second gate electrode having a double-gate structure that covers both side surfaces of the second fin.

According to another aspect of the inventive concepts, there is provided a method of manufacturing a semiconductor device, the method including preparing a substrate, forming on the substrate a first fin that extends in a first direction and has a first height and a second fin that extends in the first direction and has a second height, and forming a first fin field-effect transistor (FinFET) by forming a first gate electrode having a triple-gate structure that covers both side surfaces and a top surface of the first fin and forming a second FinFET by forming a second gate electrode having a double-gate structure that covers both side surfaces of the second fin.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EMBODIMENTS

Figure 1:
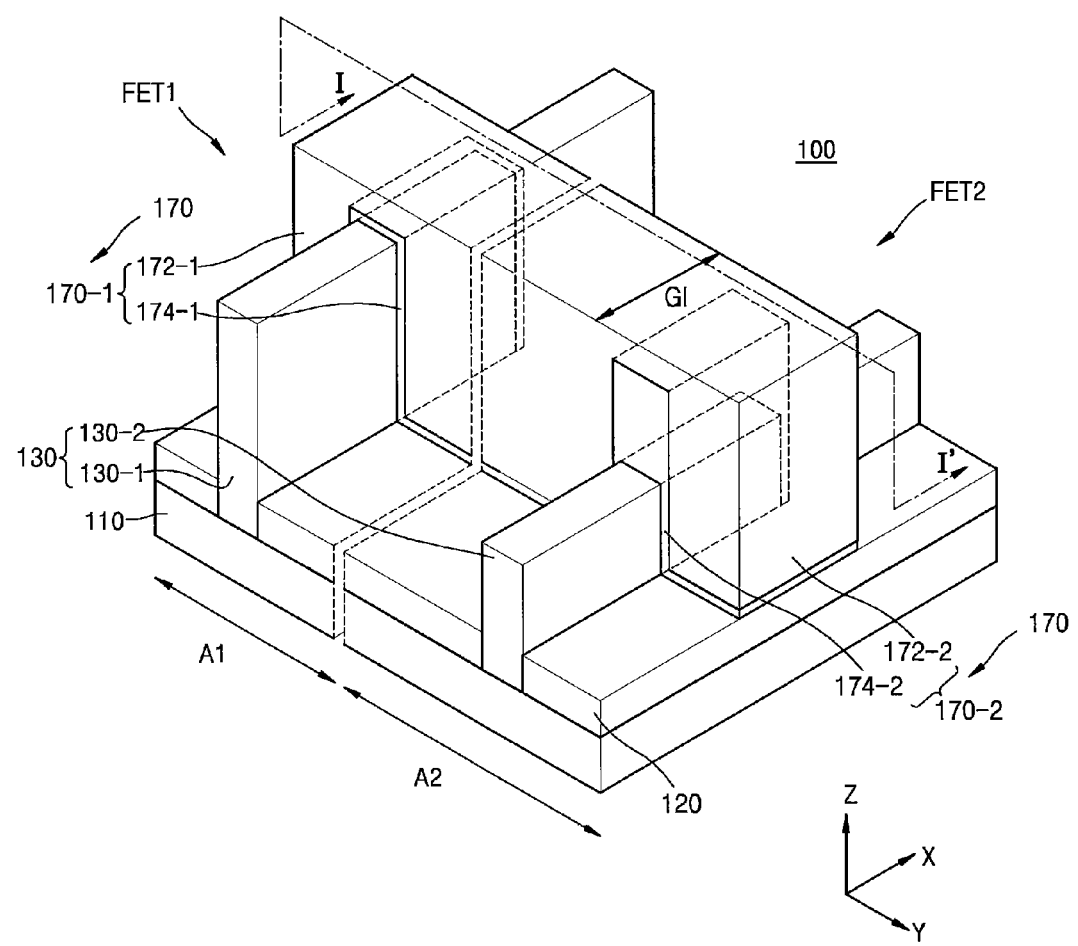
FIG. 1 is a perspective view illustrating a semiconductor device including field-effect transistors (FETs) having different gate structures, according to some embodiments.

The inventive concepts now will be described more fully hereinafter with reference to the accompanying drawings, in which elements of the inventive concepts are shown. The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art. The same reference numbers indicate the same components throughout the specification. Structures or sizes of elements in the drawings are exaggerated for convenience of description and clarity and parts in the drawings unrelated to the detailed description are omitted. The terminology used herein is for the purpose of describing example embodiments only and is not intended to be limiting of example embodiments.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Expressions such as "at least one of," when preceding a list of elements, modify the entire list of elements and do not modify the individual elements of the list.

Variations from the shapes of the illustrations as a result, for example, of manufacturing techniques and/or tolerances, are to be expected. Thus, embodiments of the inventive concepts should not be construed as being limited to the particular shapes of regions illustrated herein but are to include deviations in shapes that result, for example, from manufacturing.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
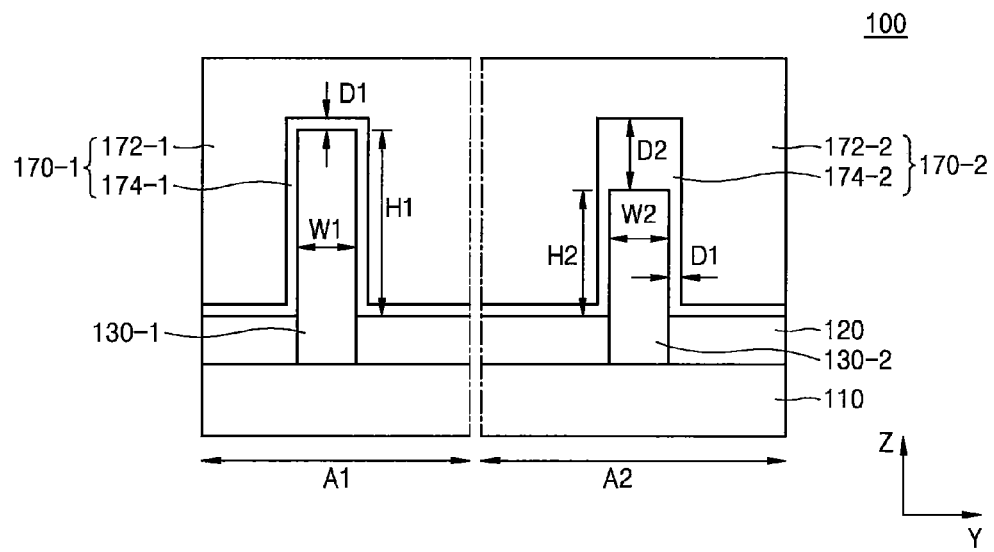
FIG. 2 is a cross-sectional view taken along line I-I' of the semiconductor device of FIG. 1, according to some embodiments.

FIG. 1 is a perspective view illustrating a semiconductor device 100 including field-effect transistors (FETs) having different gate structures, according to some embodiments. FIG. 2 is a cross-sectional view taken along line I-I' of the semiconductor device 100 of FIG. 1, according to some embodiments.

Referring to FIGS. 1 and 2, the semiconductor device 100 of the present example embodiment may include first and second fin field-effect transistors (FinFETs) FET1 and FET2 having different gate structures on a substrate 110. For example, the semiconductor device 100 of the present example embodiment may include the first FinFET FET1 that is provided on the substrate 110 in a first region A1 and the second FinFET FET2 that is provided on the substrate 110 in a second region A2, and gate structures of the first FinFET FET1 may differ from those of the second FinFET FET2.

In further detail, the semiconductor device 100 may include the substrate 110, a device isolation film 120, a semiconductor layer 130, and a gate structure 170.

The substrate 110 may include silicon (Si), for example, single-crystalline silicon, polycrystalline silicon, or amorphous silicon. However, a material of the substrate 110 is not limited to silicon. For example, in some embodiments, the substrate 110 may include a group IV semiconductor such as germanium (Ge), a group IV-IV compound semiconductor such as silicon germanium (SiGe) or silicon carbide (SiC), or a group III-V compound semiconductor such as gallium arsenide (GaAs), indium arsenide (InAs), or indium phosphide (InP).

The substrate 110 may be based on a silicon bulk substrate or a silicon-on-insulator (SOI) substrate. In the semiconductor device 100 of the present example embodiment, the substrate 110 may be based on a silicon bulk substrate. In some embodiments, the substrate 110 may not be limited to a bulk substrate or SOI substrate, and may be a substrate based on, for example, an epitaxial wafer, a polished wafer, or an annealed wafer. The semiconductor device 100 based on an SOI substrate will be explained below in detail with reference to FIGS. 6 through 10.

Although not shown in FIGS. 1 and 2, the substrate 110 may include conductive regions, for example, wells doped with impurities, or various structures doped with impurities. Also, the substrate 110 may be a P-type substrate or an N-type substrate according to a type of doped impurities.

The substrate 110 may be divided into various regions according to types of devices that are formed on the substrate 110. For example, the substrate 110 may be divided into a first region A1 where logic devices or operation devices are formed and a second region A2 where input/output (I/O) devices or interface-related devices are formed. However, the substrate 110 is not limited to the first region A1 and the second region A2. For example, the substrate 110 may be divided into three or more regions according to types of devices that are formed on the substrate 110.

The device isolation film 120 may be disposed on the substrate 110 to have a predetermined height, and may be formed of an insulating material. For example, the device isolation film 120 may include an oxide film, a nitride film, and/or an oxynitride film. Since the device isolation film 120 is disposed between first fins 130-1 and between second fins 130-2, the device isolation film 120 may function to electrically separate the first fins 130-1 from each other and electrically separate the second fins 130-2 from each other.

The semiconductor layer 130 may have a fin shape, and may include the first fin 130-1 that is formed in the first region A1 and the second fin 130-2 that is formed in the second region A2. A plurality of the semiconductor layers 130 may be disposed in and spaced apart along a second direction (y direction), and may extend in a first direction (x direction) to be parallel to one another. The semiconductor layer 130 may extend from the substrate 110 and may protrude from a top surface of the device isolation film 120 in a third direction (z direction). Although one first fin 130-1 is shown in the first region A1 and one second fin 130-2 is shown in the second region A2 in FIGS. 1 and 2 for convenience of description, the present example embodiment is not limited thereto. For example, two or more first fins 130-1 may be formed in the first region A1 and two or more second fins 130-2 may be formed in the second region A2.

Structures of the first fin 130-1 may be different from or the same as those of the second fin 130-2. In the semiconductor device 100 of the present example embodiment, structures of the first fin 130-1 may differ from those the second fin 130-2. In detail, the first fin 130-1 may protrude from the substrate 110 and may extend in the first direction (x direction). The second fin 130-2 may also protrude from the substrate 110 and may extend in the first direction (x direction). Directions in which the first fin 130-1 and the second fin 130-2 extend may be the same, as shown in FIG. 1. However, directions in which the first fin 130-1 and the second fin 130-2 extend may not need to be the same.

The first fin 130-1 may have a first width W1 in the second direction (y direction), and may have a first height H1 in the third direction (z direction) from the top surface of the device isolation film 120. The second fin 130-2 may have a second width W2 in the second direction, and may have a second height H2 in the third direction from the top surface of the device isolation film 120. The first height H1 may be greater than the second height H2. Also, the first width W1 may be equal to or less than the second width W2. Accordingly, an aspect ratio of the first fin 130-1 may be greater than an aspect ratio of the second fin 130-2. In some embodiments, an aspect ratio of the first fin 130-1 may be substantially the same as that of a second fin 130-2d, like in a semiconductor device 100h of FIG. 11.

The first fin 130-1 and the second fin 130-2 may be formed based on the substrate 110. Accordingly, the first fin 130-1 and the second fin 130-2 may be formed of the same material as that of the substrate 110. Portions of the first fin 130-1 and the second fin 130-2, on both side surfaces of a gate electrode 172-1 or 172-2 in the first direction (x direction), may be heavily doped with impurity ions to form source/drain regions.

The gate structure 170 may be formed on the device isolation film 120 to cover portions of the first fin 130-1 and the second fin 130-2 and to extend in the second direction (y direction). Although one gate structure 170 is provided in FIG. 1 for convenience of description, the present example embodiment is not limited thereto, and for example, two or more gate structures 170 may be formed in the first direction.

The gate structure 170 may include a first gate structure 170-1 that is formed on the first fin 130-1 and a second gate structure 170-2 that is formed on the second fin 130-2. The first gate structure 170-1 may be different than the second gate structure 170-2.

In detail, the first gate structure 170-1 may include a first dielectric film 174-1 and a first gate electrode 172-1, and the second gate structure 170-2 may include a second dielectric film 174-2 and a second gate electrode 172-2. The first dielectric film 174-1 may cover both side surfaces and a top surface of the first fin 130-1 and may have a uniform thickness. For example, the first dielectric film 174-1 may have a first thickness D1 on the both side surfaces and the top surface of the first fin 130-1. The second dielectric film 174-2 may cover both side surfaces and a top surface of the second fin 130-2, and a thickness of the second dielectric film 174-2 on the top surface of the second fin 130-2 may be greater than a thickness of the second dielectric film 174-2 on the side surfaces of the second fin 130-2. For example, the second dielectric film 174-2 on the both side surfaces of the second fin 130-2 may have the first thickness D1, and the second dielectric film 174-2 on the top surface of the second fin 130-2 may have a second thickness D2. The second thickness D2 may be greater than the first thickness D1. For example, the second thickness D2 may be greater than the first thickness D1 by about five times or more.

The second thickness D2 may be great enough not to form or sufficient to prevent formation of a channel on the top surface of the second fin 130-2 when an operating voltage is applied to the second gate electrode 172-2 that is disposed on the second fin 130-2. Since the second dielectric film 174-2 is formed such that the second dielectric film 174-2 on the top surface of the second fin 130-2 is thicker than the second dielectric film 174-2 on the both side surfaces of the second fin 130-2, the second FinFET FET2 may have a double-gate structure. For reference, the term 'double-gate structure' may refer to a structure in which two surfaces, that is, both side surfaces, in a three-dimensional (3D) fin are used as a channel region. A structure in which not only both side surfaces but also a top surface of a fin are used as a channel region may be referred to as a triple-gate structure, and the first FinFET FET1 may have a triple-gate structure.

Each of the first dielectric film 174-1 and the second dielectric film 174-2 may be formed of an insulating material. For example, each of the first dielectric film 174-1 and the second dielectric film 174-2 may be formed of an oxide such as silicon oxide ($SiO_2$) or a nitride such as silicon nitride (SiNx).

Each of the first dielectric film 174-1 and the second dielectric film 174-2 may be formed of a high-k dielectric material. For example, each of the first dielectric film 174-1 and the second dielectric film 174-2 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}T_{0.5}aO_3$), or lead zinc niobate ($PbZnNbO_3$).

Each of the first dielectric film 174-1 and the second dielectric film 174-2 may be formed of a metal oxide, a silicate thereof, or an aluminate thereof. Examples of the metal oxide may include $HfO_2$, $ZrO_2$, $TiO_2$, and $Al_2O_3$. In some embodiments, each of the first dielectric film 174-1 and the second dielectric film 174-2 may be formed of a metal oxynitride, a silicate thereof, or an aluminate thereof. Examples of the metal oxynitride may include aluminum oxynitride (AlON), zirconium oxynitride (ZrON), hafnium oxynitride (HfON), lanthanum oxynitride (LaON), and yttrium oxynitride (YON). Examples of the silicate or the aluminate may include ZrSiON, HfSiON, LaSiON, YSiON, ZrAlON, and HfAlON.

Each of the first dielectric film 174-1 and the second dielectric film 174-2 may be formed of a perovskite-type oxide, a niobate or tantalite system material, a tungsten-bronze system material, or a Bi-layered pervoskite system material.

Each of the first dielectric film 174-1 and the second dielectric film 174-2 may be formed by using any of various deposition methods such as chemical vapor deposition (CVD), low pressure CVD (LPCVD), atmospheric pressure CVD (APCVD), low temperature CVD (LTCVD), plasma-enhanced CVD (PECVD), atomic layer CVD (ALCVD), atomic layer deposition (ALD), or physical vapor deposition (PVD).

As shown in FIGS. 1 and 2, the first dielectric film 174-1 and the second dielectric film 174-2 may also be formed on the device isolation film 120. On the device isolation film 120, each of the first dielectric film 174-1 and the second dielectric film 174-2 may have the first thickness D1. In some embodiments, the first dielectric film 174-1 and the second dielectric film 174-2 may not extend on or be formed on the device isolation film 120.

The first gate electrode 172-1 may cover portions of both side surfaces and the top surface of the first fin 130-1 with the first dielectric film 174-1 disposed between the first gate electrode 172-1 and the first fin 130-1, and the second gate electrode 172-2 may cover portions of both side surfaces and the top surface of the second fin 130-2 with the second dielectric film 174-2 disposed between the second gate electrode 172-2 and the second fin 130-2. Accordingly, the first fin 130-1, the first dielectric film 174-1, and the first gate electrode 172-1 may constitute or define the first FinFET FET1, and the second fin 130-2, the second dielectric film 174-2, and the second gate electrode 172-2 may constitute or define the second FinFET FET2. Each of the first gate electrode 172-1 and the second gate electrode 172-2 of the gate structure 170 may extend in the second direction (y direction) as described above. The first gate electrode 172-1 and the second gate electrode 172-2 may not be electrically connected to each other. This is because an operating voltage of the first gate electrode 172-1 required by devices in the first region A1 may be different than an operating voltage of the second gate electrode 172-2 required by devices in the second region A2.

As shown in FIGS. 1 and 2, widths of the first gate electrode 172-1 may be the same as those of the second gate electrode 172-2 in the first direction (x direction). However, in some embodiments, widths of the first gate electrode 172-1 may be different than those of the second gate electrode 172-2 in the first direction (x direction). For example, the first gate electrode 172-1 and the second gate electrode 172-2 may be formed such that a width of the first gate electrode 172-1 in the first direction is less than a width of the second gate electrode 172-2 in the first direction. Each of the widths of the first gate electrode 172-1 and the second gate electrode 172-2 in the first direction may correspond to a gate length GI of each of the first FinFET FET1 and the second FinFET FET2. The gate length GI may correspond to a channel length. For reference, a channel width may be defined as a length of a surface of a fin that contacts a gate electrode in a direction perpendicular to a channel length. For example, in the first FinFET FET1, a channel width may be about 2*H1+W1. In the second FinFET FET, since the top surface is not used to form a channel, a channel width may be about 2*H2.

Each of the first gate electrode 172-1 and the second gate electrode 172-2 may be formed of polycrystalline silicon, or a conductive material obtained by doping polycrystalline silicon with a metal material such as aluminum (Al), nickel (Ni), tungsten (W), titanium (Ti), or tantalum (Ta). In some embodiments, each of the first gate electrode 172-1 and the second gate electrode 172-2 may be formed of a metal. For example, each of the first gate electrode 172-1 and the second gate electrode 172-2 may be formed of titanium nitride (TiN), tantalum nitride (TaN), titanium carbide (TiC), or tantalum carbide (TaC). Each of the first gate electrode 172-1 and the second gate electrode 172-2 may be formed to have a single-layer or multi-layer structure.

According to the semiconductor device 100 of the present example embodiment, since a FinFET having a triple-gate structure is formed in the first region A1 where logic devices are formed and a FinFET having a double-gate structure is formed in the second region A2 where I/O devices are formed, the performance of the logic devices may be improved, the reliability of the I/O devices may be improved, and a leakage current may be reduced or prevented. Also, FinFETs having various sizes may be formed according to functions of the logic devices. Accordingly, according to the semiconductor device 100 of the present example embodiment, since FinFETs having a triple-gate structure and a double-gate structure are combined and formed to be suitable for the logic devices in the first region A1, the performance of all of the logic devices may be improved.

For reference, the logic devices that are formed in the first region A1 may be applied to low-power chips such as graphic card chips or mobile application processors. The logic devices that are devices (e.g., central processing units (CPUs)) for actually performing operations may perform various arithmetic and logical operations, and a ratio of an effective current value to a leakage current value may be important to the logic devices. For example, CPUs may require a high effective current value despite a high leakage current value, and graphic card chips may require a lower leakage current value than CPUs but an effective current value may be important to the graphic card chips. Also, mobile application processors may require a low leakage current value because power consumption as well as an effective current value may be important to the mobile application processors.

In contrast, the I/O devices that are formed in the second region A2 and are devices for interfacing with devices for performing different functions, for example, memory devices, may function to receive an external voltage and transmit the external voltage to the logic devices, and/or to receive an input from the logic devices and output the input to the outside. Since the I/O devices receive an external signal, unless an external voltage is changed, an operating voltage of the I/O devices may not be changed, and thus a gate length of the I/O devices may not be changed. For example, when an operating voltage of the I/O devices is reduced and a gate length is reduced, a desired output may not be obtained. Accordingly, a gate length and an operating voltage of the I/O devices may not be changed, unlike the logic devices.

However, as a process for a fin structure that is suitable for the logic devices is performed, reliability characteristics such as hot carrier injection (HCI), bias temperature instability (BTI), time-dependent dielectric breakdown (TDDB) and leakage current characteristics of the I/O devices are degraded. For example, as a width of a fin for the logic devices is reduced and a width of a fin for the I/O devices is reduced, a lateral field that generates a hot carrier, a band to band tunneling (BTBT) that generates a gate-induced drain leakage (GIDL), and an oxide film that increases BTI and TDDB at the top of the fin may be increased or maximized. In other words, as a width of a fin is reduced and thus an aspect ratio thereof is increased, gate controllability may be increased and may be maximized at the top of the fin. Accordingly, the lateral field, BTBT, and oxide field at the top of the fin may be maximized. As to the logic devices, as a width of a fin is reduced due to scaling and thus an aspect ratio thereof is increased, an operating voltage of the logic devices may also be reduced, and thus may not be problematic. However, as to the I/O devices, since an operating voltage of the I/O devices is not changed as described above, an increase in BTBT and field at the top of a fin may increase a leakage current and degrade reliability characteristics such as HCI, BTI, and TDDB.

According to the semiconductor device 100 of the present example embodiment, since a FinFET having a triple-gate structure is formed in the first region A1 where logic devices are formed and a FinFET having a double-gate structure is formed in the second region A2 where I/O devices are formed, one problem of the I/O devices, that is, a high leakage current and reduced reliability, may be addressed or solved. That is, since a FinFET applied to the I/O devices is formed to have a double-gate structure in which a channel is not formed on a top surface of a fin, even when an aspect ratio of the fin is increased due to scaling, the problem of high BTBT and field at the top of the fin may be alleviated or solved. Since a FinFET applied to the logic devices also has a triple-gate structure, the performance of the logic devices may be improved due to the scaling. Furthermore, FinFETs having various sizes and structures may be used for the logic devices, and a FinFET, to which a predetermined voltage or higher has to be applied, may exist for a function of the logic devices, like in the I/O devices. Accordingly, since a double-gate structure is also applied to the FinFET for the logic devices having the function, the performance may be improved due to scaling and problems relating to leakage current and/or reduced reliability may be addressed or solved.

Figure 3:
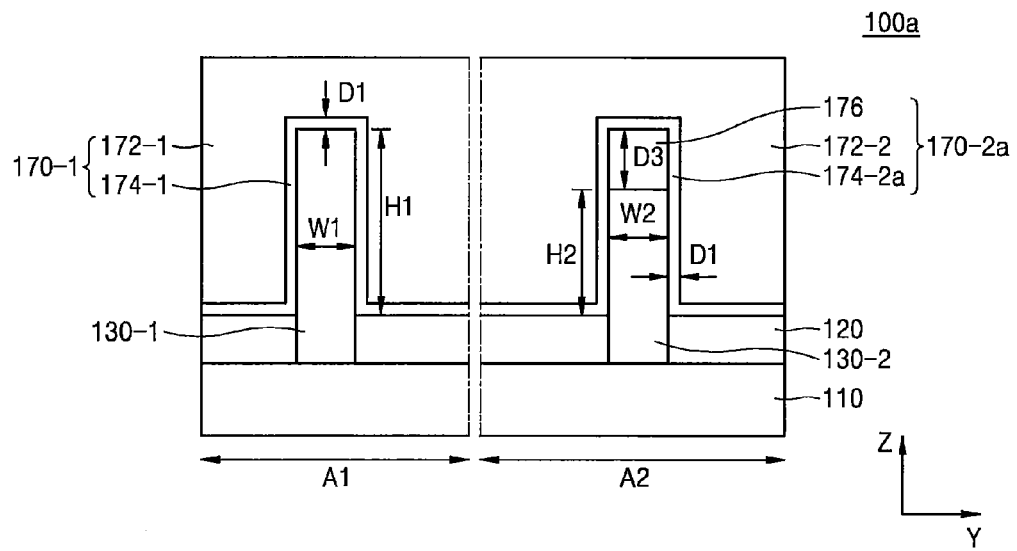
FIGS. 3 through 5 are cross-sectional views corresponding to the cross-sectional view taken along line I-I' of the semiconductor device of FIG. 1, according to some embodiments.
Figure 4:
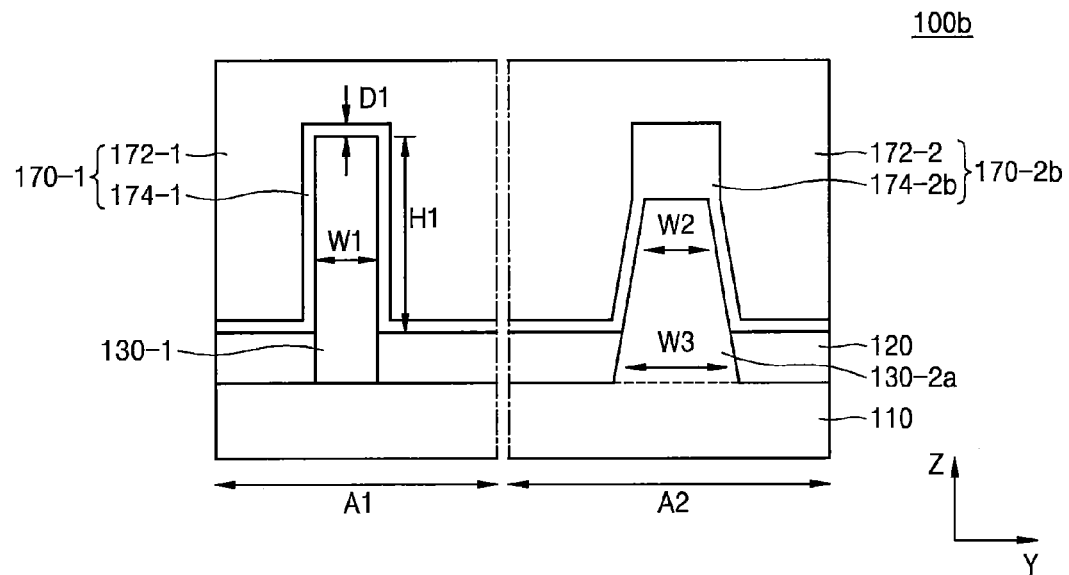
Figure 5:
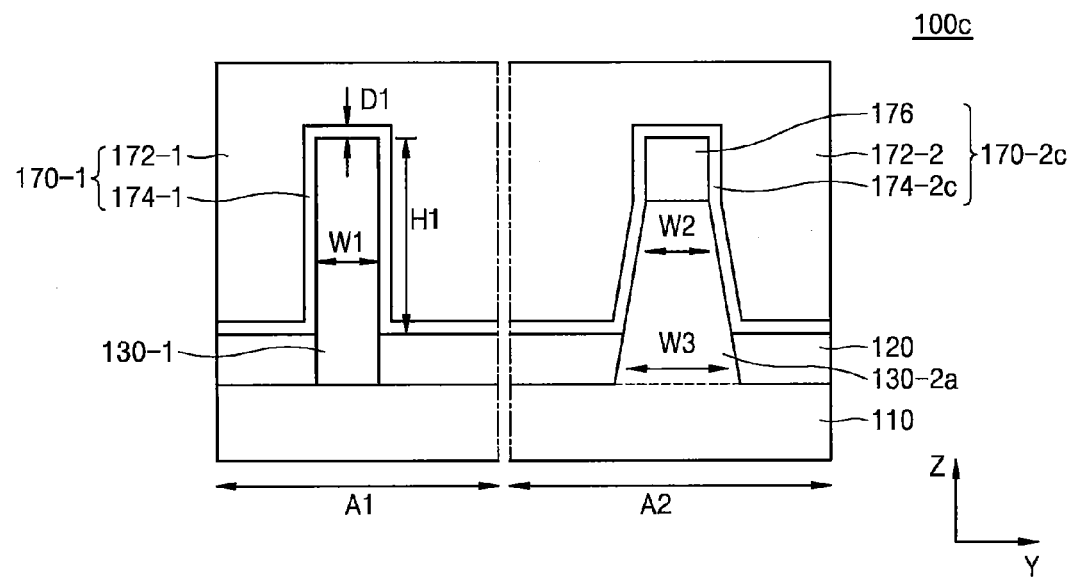

FIGS. 3 through 5 are cross-sectional views corresponding to the cross-sectional view taken along line I-I' of the semiconductor device 100 of FIG. 1, according to some embodiments. The description already made with reference to FIG. 1 will be briefly repeated or omitted for convenience of description.

Referring to FIG. 3, a difference between a semiconductor device 100a of the present example embodiment and the semiconductor device 100 of FIG. 1 is a second gate structure 170-2a. In detail, the second gate structure 170-2a may be formed in the second region A2, and may include a second dielectric film 174-2a, a capping insulating film 176, and the second gate electrode 172-2. The second fin 130-2 and the second gate electrode 172-2 are the same as those of the semiconductor device 100 of FIG. 1.

The second dielectric film 174-2a may be formed to have a uniform thickness throughout, like the first dielectric film 174-1. For example, thicknesses of the second dielectric film 174-2a on both side surfaces and a top surface of the second fin 130-2 may be the same. However, the second dielectric film 174-2a may be formed to cover the second fin 130-2 and the capping insulating film 176, unlike the first dielectric film 174-1. That is, the second dielectric film 174-2a may cover the both side surfaces of the second fin 130-2, and both side surfaces and a top surface of the capping insulating film 176. A material of the second dielectric film 174-2a can be the same as that in the semiconductor device 100 of FIG. 1.

The second gate structure 170-2a in the semiconductor device 100a of the present example embodiment may further include the capping insulating film 176, unlike the second gate structure 170-2 of the semiconductor device 100 of FIG. 1. The capping insulating film 176 may be formed on the top surface of the second fin 130-2, and may be formed of an insulating material, like the second dielectric film 174-2a. For example, the capping insulating film 176 may be formed of an oxide such as silicon oxide ($SiO_2$), a nitride such as silicon nitride (SiNx), or an insulating material such as oxynitride. Also, the capping insulating film 176 may be formed of a high-k dielectric material. The material of the capping insulating film 176 may be the same as or different than that of the second dielectric film 174-2a.

The capping insulating film 176 may be formed to have a third thickness D3. The third thickness D3 may be greater than a thickness of the second dielectric film 174-2a. The third thickness D3 may be great enough to allow the second FinFET FET2 to have a double-gate structure, with the thickness of the second dielectric film 174-2a. In further detail, a total thickness of the third thickness D3 of the capping insulating film 176 and the thickness of the second dielectric film 174-2a may be sufficient to prevent formation of (i.e., great enough not to form) a channel on the top surface of the second fin 130-2 when an operating voltage is applied to the second gate electrode 172-2.

Accordingly, the semiconductor device 100a of the present example embodiment may be the same as the semiconductor device 100 of FIG. 1 in that a FinFET having a double-gate structure is formed in the second region A2 where I/O devices are formed, although a structure of the second gate structure 170-2a is a difference between the semiconductor device 100a and the semiconductor device 100. Accordingly, the effect or functionality of the semiconductor device 100a of the present example embodiment can be the same as that of the semiconductor device 100 of FIG. 1. Also, the second gate structure 170-2a may be formed in the first region A1 as well as in the second region A2, in some embodiments.

Referring to FIG. 4, a difference between a semiconductor device 100b of the present example embodiment and the semiconductor device 100 of FIG. 1 is a second fin 130-2a and a second gate structure 170-2b.

A vertical cross-section of the second fin 130-2a may have a trapezoidal shape or a tapered shape in which an upper end (also referred to herein as an upper side) is narrow and a lower end (also referred to herein as a lower side) is wide. That is, while a vertical cross-section of the second fin 130-2 in the semiconductor device 100 of FIG. 1 has a rectangular shape in which an upper side and a lower side have the same length, the vertical cross-section of the second fin 130-2a in the semiconductor device 100b of the present example embodiment has a tapered shape in which a width in the second direction (y direction) is reduced upward. For example, the second fin 130-2a may have a second width W2 on a top part and a third width W3 on a bottom part, and the third width W3 may be greater than the second width W2. As such, when the second fin 130-2a is formed to have a tapered shape, the problem of high BTBT and field at the top may be reduced due to structural characteristics of the second fin 130-2a.

The second fin 130-2a having the tapered shape may be formed by adjusting an anisotropic etching rate by appropriately adjusting an etching gas and an etching process condition when the second fin 130-2a is formed on the substrate 110. Also, the first fin 130-1 may be formed to have a rectangular shape and the second fin 130-2a may be formed to have a tapered shape by separately etching the first fin 130-1 and the second fin 130-2a. In some embodiments, both the first fin 130-1 and the second fin 130-2a may be formed to have tapered shapes by simultaneously etching the first fin 130-1 and the second fin 130-2a.

The second dielectric film 174-2b may be formed to surround or otherwise on both side surfaces and the top surface of the second fin 130-2a, like the second dielectric film 174-2 of the semiconductor device 100 of FIG. 1. However, since the side surfaces of the second fin 130-2a are formed to be inclined, the second dielectric film 174-2b may be formed to be inclined along the side surfaces of the second fin 130-2a. The second dielectric film 174-2b may also be formed on the both side surfaces of the second fin 130-2a to have a lesser thickness and may be formed on the top surface of the second fin 130-2a to have a greater thickness. The thickness of the second dielectric film 174-2b on the top surface of the second fin 130-2a may be great enough not to form or sufficient to prevent formation of a channel on the top surface of the second fin 130-2a. Accordingly, the second FinFET FET2 of the present example embodiment may also have a double-gate structure.

Referring to FIG. 5, a difference between a semiconductor device 100c of the present example embodiment and the semiconductor device 100a of FIG. 3 is a second gate structure 170-2c. In detail, the second gate structure 170-2c may be formed in the second region A2, and may include a second dielectric film 174-2c, the capping insulating film 176, and the second gate electrode 172-2. A structure of the second fin 130-2a can be the same as that in the semiconductor device 100b of FIG. 4.

The second dielectric film 174-2c may be formed to entirely have a uniform thickness, like the second dielectric film 174-2a of the semiconductor device 100a of FIG. 3, and may be formed to cover the second fin 130-2a and the capping insulating film 176. However, since side surfaces of the second fin 130-2a are formed to be inclined, the second dielectric film 174-2c may be formed to be inclined along the side surfaces of the second fin 130-2a.

The capping insulating film 176 may be formed on the top surface of the second fin 130-2a to have the third thickness D3 (see FIG. 3). A material or a thickness of the capping insulating film 176 can be the same as that in the semiconductor device 100a of FIG. 3.

Even in the semiconductor device 100c of the present example embodiment, the second FinFET FET2 may be formed to have a double-gate structure in the second region A2 due to the second dielectric film 174-2c and the capping insulating film 176.

Figure 6:
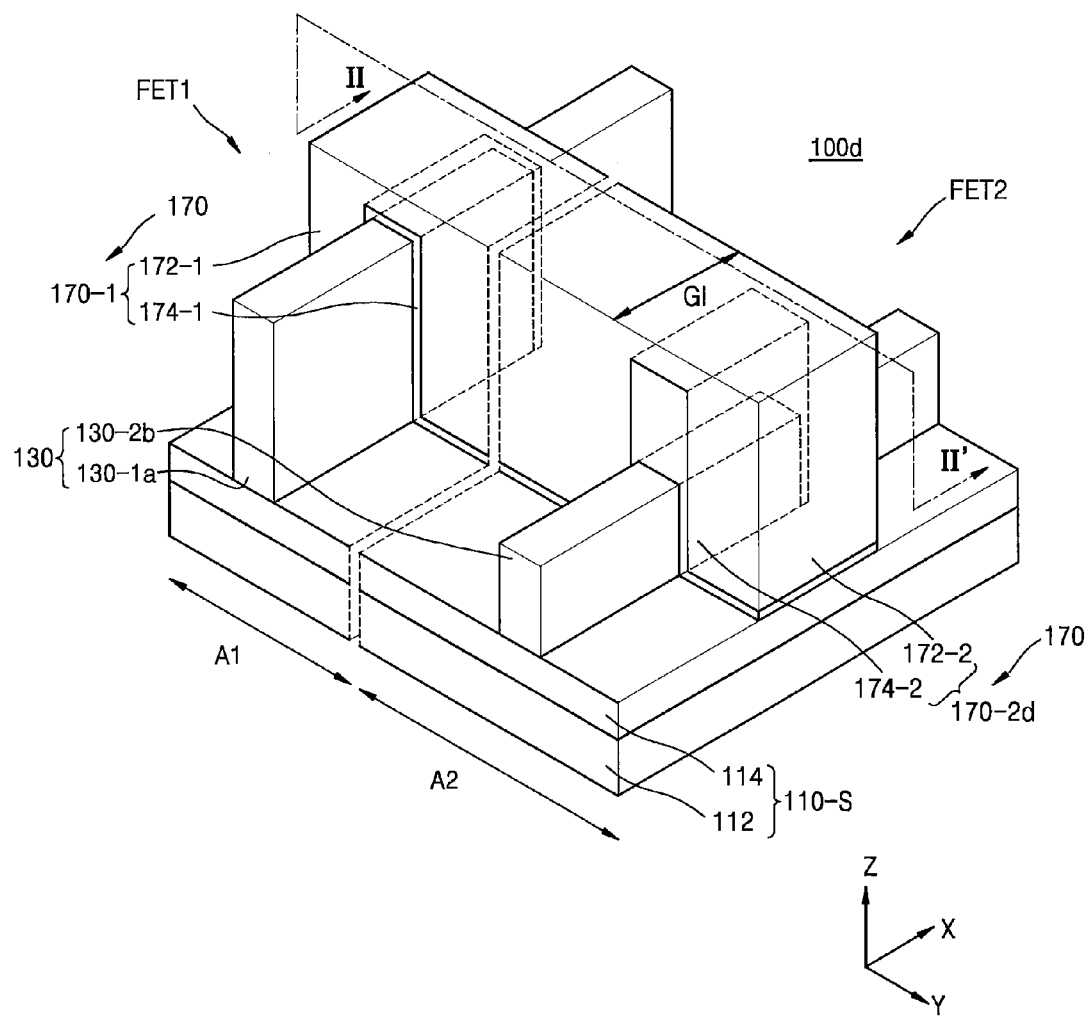
FIG. 6 is a perspective view illustrating a semiconductor device including FETs having different gate structures, according to further embodiments.
Figure 7:
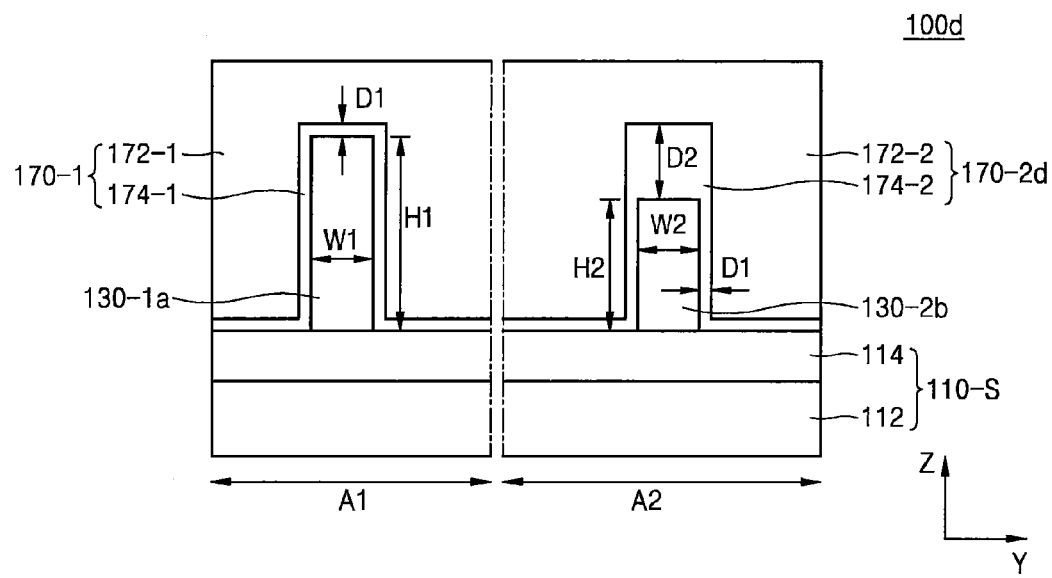
FIG. 7 is a cross-sectional view taken along line II-II' of the semiconductor device of FIG. 6, according to some embodiments.

FIG. 6 is a perspective view illustrating a semiconductor device 100d including FETs having different gate structures, according to further embodiments. FIG. 7 is a cross-sectional view taken along line II-II' of the semiconductor device 100d of FIG. 6, according to some embodiments. The description already made with reference to FIG. 1 will be briefly repeated or omitted for convenience of description.

Referring to FIGS. 6 and 7, a difference between the semiconductor device 100d of the present example embodiment and the semiconductor device 100 of FIG. 1 is a substrate 110-S is based on an SOI substrate.

In further detail, the substrate 110-S may include a base substrate 112 and a buried oxide (BOX) layer 114 that is formed on the base substrate 112. A first fin 130-1a and a second fin 130-2b may be formed on the BOX layer 114. The BOX layer 114 may perform the same function as that of the device isolation film 120 of the semiconductor device 100 of FIG. 1. In some embodiments, an additional device isolation film may be formed on the BOX layer 114 between the first fins 130-1a and between the second fins 130-2b.

A second gate structure 170-2d may have the same structure as that of the second gate structure 170-2 of FIG. 1, except that the second dielectric film 174-2 is formed on the BOX layer 114 instead of the device isolation film 120. As described above, when the additional device isolation film is formed on the BOX layer 114, the second dielectric film 174-2 may be formed on the additional device isolation film 120.

The first dielectric film 174-1 may surround the first fin 130-1a and may be formed to entirely have a uniform thickness, and the second dielectric film 174-2 may surround the second fin 130-2b and may be formed such that a thickness of the second dielectric film 174-2 on a top surface of the second fin 130-2b is greater than a thickness of the second dielectric film 1742 on both side surfaces of the second fin 130-2b. The first dielectric film 174-1 and the second dielectric film 174-2 may be formed on the BOX layer 114 by extending from the side surfaces of the first fin 130-1a and the second fin 130-2b. In some embodiments, the first dielectric film 174-1 and the second dielectric film 174-2 may not extend on or be formed on the BOX layer 114.

Even in the semiconductor device 100d of the present example embodiment, since the second gate structure 170-2d, including the second dielectric film 174-2, is formed, the second FinFET FET2 formed in the second region A2 may have a double-gate structure.

Figure 8:
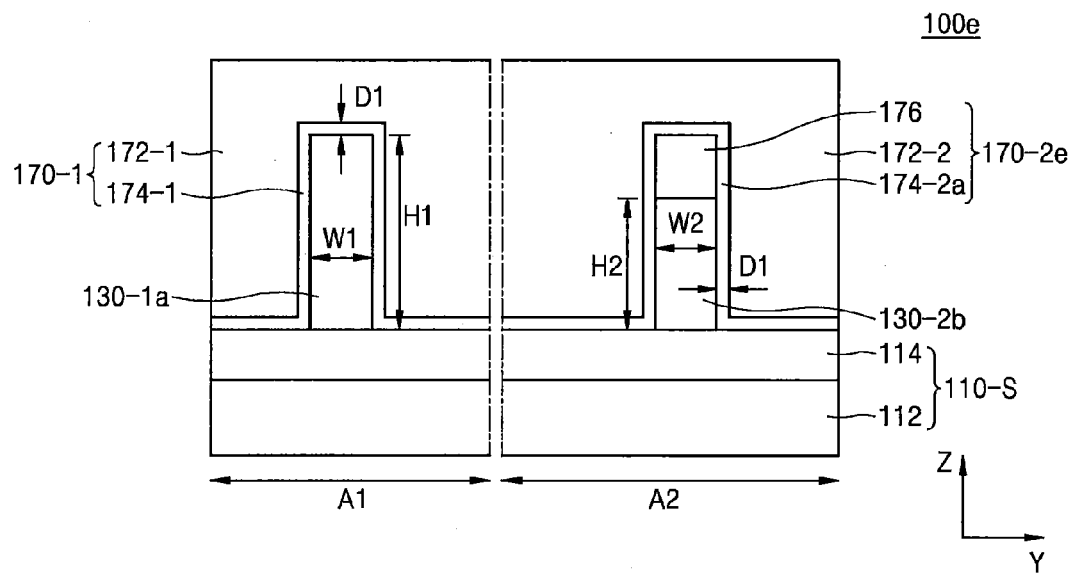
FIGS. 8 through 10 are cross-sectional views corresponding to the cross-sectional view taken along line II-II' of the semiconductor device of FIG. 6, according to some embodiments.
Figure 9:
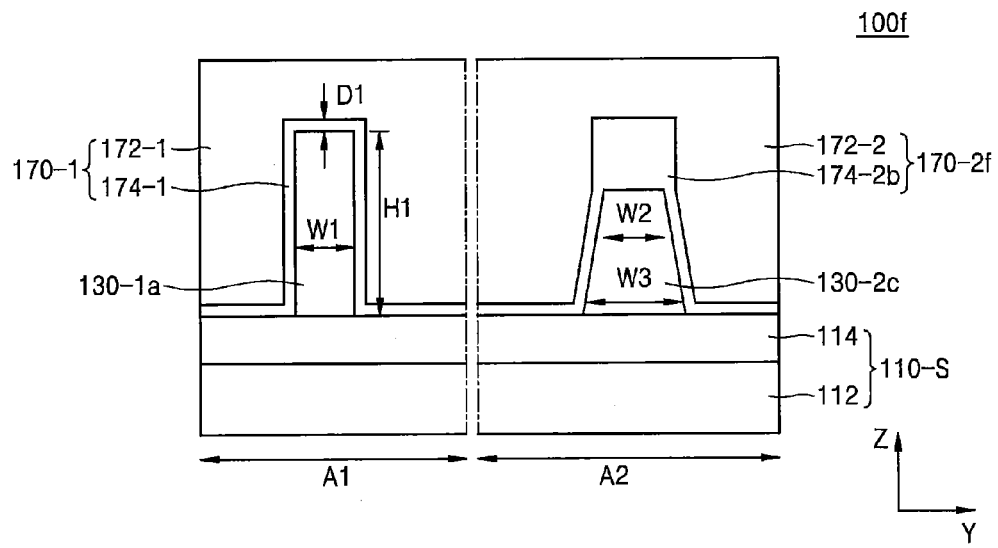
Figure 10:
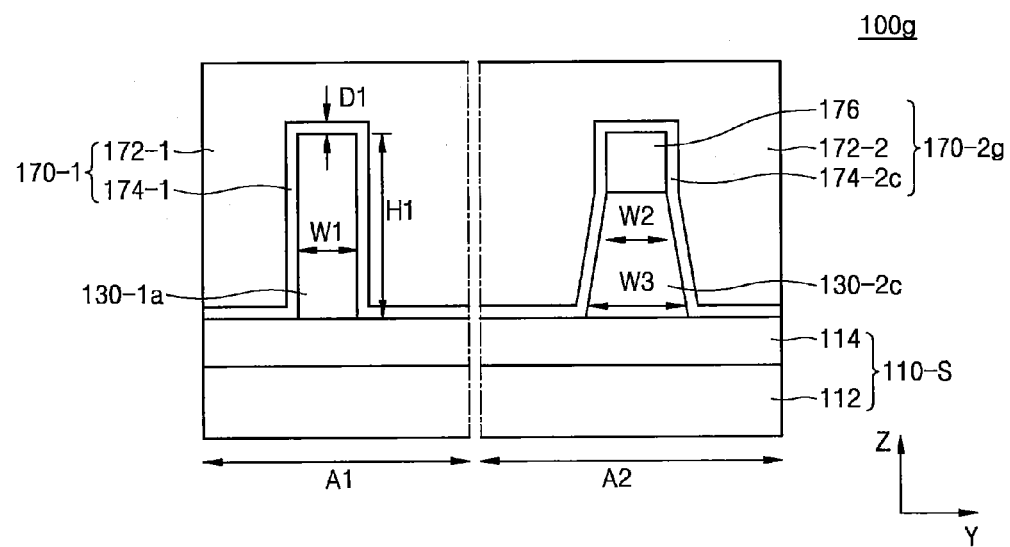

FIGS. 8 through 10 are cross-sectional views corresponding to the cross-sectional view taken along line II-II' of the semiconductor device 100d of FIG. 6, according to some embodiments. The description already made with reference to FIGS. 1 through 6 will be briefly repeated or omitted for convenience of description.

Referring to FIG. 8, a difference between a semiconductor device 100e of the present example embodiment and the semiconductor device 100d of FIG. 6 is a second gate structure 170-2e. In detail, the substrate 110-S in the semiconductor device 100e of the present example embodiment may be based on an SOI substrate, like in the semiconductor device 100d of FIG. 6. The first fin 130-1a and the second fin 130-2b may be formed on the BOX layer 114.

The second gate structure 170-2e may have a structure that is similar to that of the second gate structure 170-2a of the semiconductor device 100a of FIG. 3. That is, the second gate structure 170-2e may be formed in the second region A2, and may include the second dielectric film 174-2a, the capping insulating film 176, and the second gate electrode 172-2. The second dielectric film 174-2a may be formed to entirely have a uniform thickness, and may cover the second fin 130-2b and the capping insulating film 176. However, the second dielectric film 174-2a may be formed to extend on the BOX layer 114 instead of the device isolation film 120.

Referring to FIG. 9, some differences between a semiconductor device 100f of the present example embodiment and the semiconductor device 100d of FIG. 6 are a second fin 130-2c and a second gate structure 170-2f.

The second fin 130-2c may have a structure that is similar to that of the second fin 130-2a of the semiconductor device 100b of FIG. 4. For example, a vertical cross-section of the second fin 130-2c may have a trapezoidal shape or a tapered shape in which an upper side is narrow and a lower side is wide, as shown in FIG. 9. However, while a bottom surface of the second fin 130-2a of the semiconductor device 100b of FIG. 4 is integrally connected to the substrate 110 and the device isolation film 120 contacts both side surfaces of the second fin 130-2a, since the second fin 130-2c is formed on the BOX layer 114, a bottom surface of the second fin 130-2c may not be connected to the base substrate 112 and both side surfaces of the second fin 130-2c may not contact the BOX layer 114.

The second dielectric film 174-2b may be formed to be inclined along the side surfaces of the second fin 130-2c, like the second dielectric film 174-2b of the semiconductor device 100b of FIG. 4. Also, the second dielectric film 174-2b may be formed on the BOX layer 114 to extend from the side surfaces of the second fin 130-2c. In some embodiments, the second dielectric film 174-2b may not extend on or be formed on the BOX layer 114.

Referring to FIG. 10, a difference between a semiconductor device 100g of the present example embodiment and the semiconductor device 100e of FIG. 8 is a second gate structure 170-2g. In detail, the second gate structure 170-2g may be formed in the second region A2, and may include the second dielectric film 174-2c, the capping insulating film 176, and the second gate electrode 172-2.

A structure of the second fin 130-2c may be the same as that in the semiconductor device 100f of FIG. 9. That is, a vertical cross-section of the second fin 130-2c may have a trapezoidal shape or a tapered shape in which an upper side is narrow and a lower side is wide. The second fin 130-2c may be formed on the BOX layer 114, and a bottom surface of the second fin 130-2c may not be connected to the base substrate 112.

The second dielectric film 174-2c may be formed to entirely have a uniform thickness and may cover the second fin 130-2c and the capping insulating film 176, like the second dielectric film 174-2a of the semiconductor device 100e of FIG. 8. However, since side surfaces of the second fin 130-2c are formed to be inclined, the second dielectric film 174-2c may be formed to be inclined along the side surfaces of the second fin 130-2c.

Figure 11:
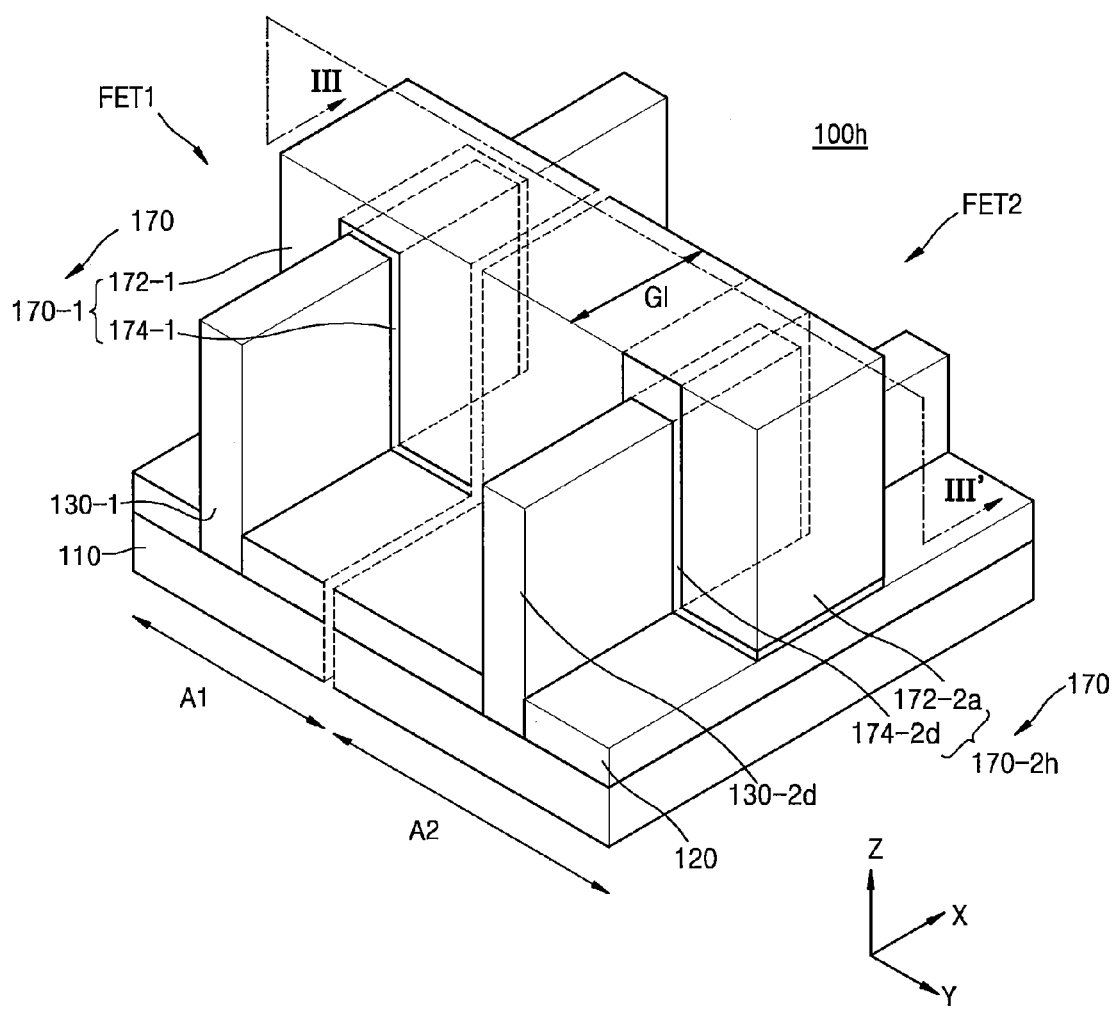
FIG. 11 is a perspective view illustrating a semiconductor device including FETs having different gate structures, according to further embodiments.
Figure 12:
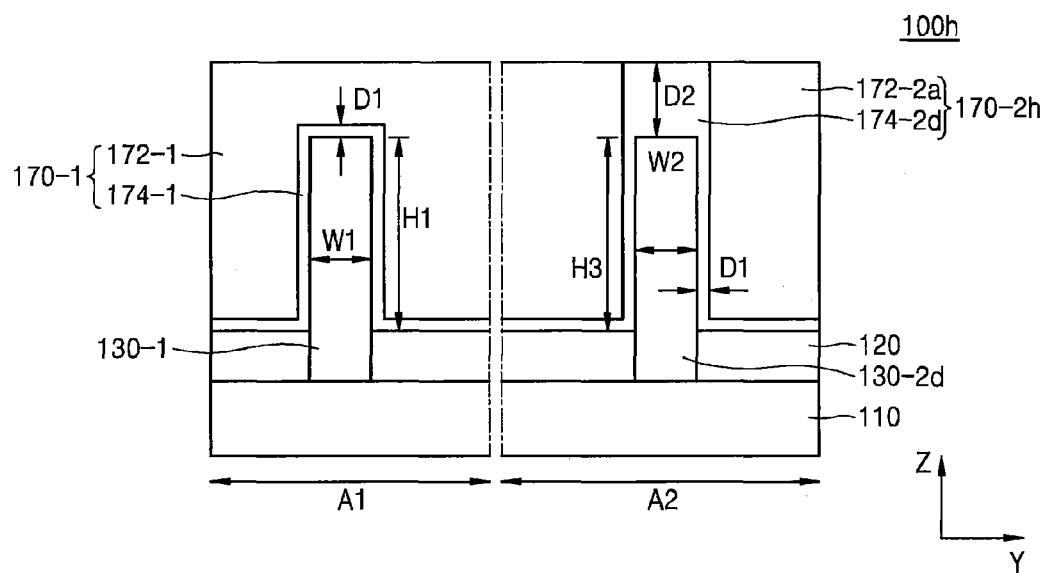
FIG. 12 is a cross-sectional view taken along line III-III' of the semiconductor device of FIG. 11, according to some embodiments.

FIG. 11 is a perspective view illustrating the semiconductor device 100h including FETs having different gate structures, according to further embodiments. FIG. 12 is a cross-sectional view taken along line III-III' of the semiconductor device 100h of FIG. 11, according to some embodiments. The description already made with reference to FIG. 1 will be briefly repeated or omitted for convenience of description.

Referring to FIGS. 11 and 12, some differences between the semiconductor device 100h of the present example embodiment and the semiconductor device 100 of FIG. 1 are the second fin 130-2d and a second gate structure 170-2h.

In the semiconductor device 100h of the present example embodiment, the second fin 130-2d may have the second width W2 in the second direction (y direction) and may have a third height H3 in the third direction (z direction) from a top surface of the device isolation film 120. The second width W2 of the second fin 130-2d may be equal to or greater than the first width W1 of the first fin 130-1. Also, the third height H3 of the second fin 130-2d may be equal to the first height H1 of the first fin 130-1. Also, in some embodiments, the third height H3 may be less or greater than the first height H1 of the first fin 130-1.

The second gate structure 170-2h may include a second dielectric film 174-2d and a second gate electrode 172-2a. The second dielectric film 174-2d may have a structure that is similar to that of the second dielectric film 174-2 of the semiconductor device 100 of FIG. 1. For example, the second dielectric film 174-2d may cover both side surfaces and a top surface of the second fin 130-2d, and a thickness of the second dielectric film 174-2d on the top surface of the second fin 130-2d may be greater than a thickness of the second dielectric film 174-2d on the both side surfaces of the second fin 130-2d. However, as a height of the second fin 130-2d is increased, a length of the second dielectric film 174-2d on the both side surfaces of the second fin 130-2d may be greater than a length of the second dielectric film 174-2 of the semiconductor device 100 of FIG. 1. Also, a height from the top surface of the device isolation film 120 to a top surface of the second dielectric film 174-2d may be greater than a height of the second dielectric film 174-2 of the semiconductor device 100 of FIG. 1.

The top surface of the second dielectric film 174-2d and a top surface of the second gate electrode 172-2a may be coplanar or on substantially the same plane, as shown in FIGS. 11 and 12. Accordingly, the top surface of the second dielectric film 174-2d may be exposed from the top surface of the second gate electrode 172-2a.

The second gate electrode 172-2a may be formed on both side surfaces of the second dielectric film 174-2d and may not extend on or be formed on the top surface of the second dielectric film 174-2d. Since the second gate electrode 172-2a is not formed on the top surface of the second dielectric film 174-2d, the problem of high BTBT or field on the top surface of the second fin 130-2d may be addressed or solved. Also, since the second gate electrode 172-2a is not formed on the top surface of the second dielectric film 174-2d, a channel may not be formed on the top surface of the second fin 130-2d. That is, a structure of the second gate electrode 172-2a of the present example embodiment may be suitable for a FinFET having a typical double-gate structure.

Although the second dielectric film 174-2d is formed such that the second dielectric film 174-2d on the top surface of the second fin 130-2d has a greater thickness, in the semiconductor device 100h of the present example embodiment, since the second gate electrode 172-2a is not formed on the top surface of the second dielectric film 174-2d, the second dielectric film 174-1d may not need to be formed to have a greater thickness on the top surface of the second fin 130-2d. However, during a manufacturing process, in order not to form the second gate electrode 172-2a on the top surface of the second dielectric film 174-2d, the second dielectric film 174-2d may be formed to have a greater thickness on the top surface of the second fin 130-2d.

If a height of the second fin 130-2d is greater than a height of the first fin 130-1 or if another material layer is formed on the second fin 130-2d, the second dielectric film 174-2d may not be formed to have a greater thickness on the top surface of the second fin 130-2d and may be formed to have a lesser thickness, like other portions.

FIGS. 13 through 16 are cross-sectional views corresponding to the cross-sectional view taken along line III-III' of the semiconductor device 100h of FIG. 11, according to some embodiments. The description already made with reference to FIGS. 1 through 5 and 11 will be briefly repeated or omitted for convenience of description.

Figure 13:
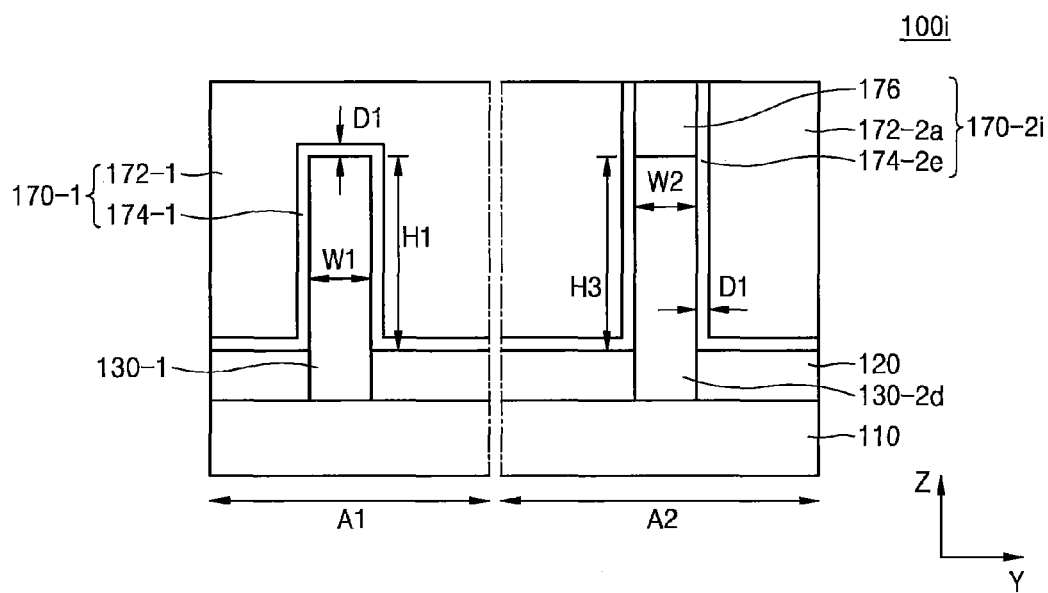
FIGS. 13 through 16 are cross-sectional views corresponding to the cross-sectional view taken along line III-III' of the semiconductor device of FIG. 11, according to some embodiments.

Referring to FIG. 13, a difference between a semiconductor device 100i of the present example embodiment and the semiconductor device 100h of FIG. 11 is a second gate structure 170-2i. In detail, the second gate structure 170-2i may be formed in the second region A2, and may include a second dielectric film 174-2e, the capping insulating film 176, and the second gate electrode 172-2a. The second fin 130-2d and the second gate electrode 172-2a are the same as those of the semiconductor device 100h of FIG. 11.

The second dielectric film 174-2e may be formed on both side surfaces of the second fin 130-2d and the capping insulating film 176 and may be formed to have a uniform thickness. The second dielectric film 174-2e may not extend on or be formed on a top surface of the capping insulating film 176. Accordingly, the top surface of the capping insulating film 176 may be exposed from a top surface of the second gate electrode 172-2a, and the top surface of the capping insulating film 176 and the top surface of the second gate electrode 172-2a may be coplanar or on substantially the same plane. A material of the second dielectric film 174-2e may be the same as that in the semiconductor device 100 of FIG. 1, and a structure or a material of the capping insulating film 176 may be the same as that in the semiconductor device 100a of FIG. 3.

Regarding a thickness of the capping insulating film 176, since the second gate electrode 172-2a is not formed on the top surface of the capping insulating film 176, the capping insulating film 176 may not need to maintain a greater thickness. However, in order not to form the second gate electrode 172-2a on the top surface of the capping insulating film 176 during a manufacturing process, the capping insulating film 176 may be formed to have a predetermined greater thickness, like the second dielectric film 174-2d of the semiconductor device 100h of FIG. 11.

Figure 14:
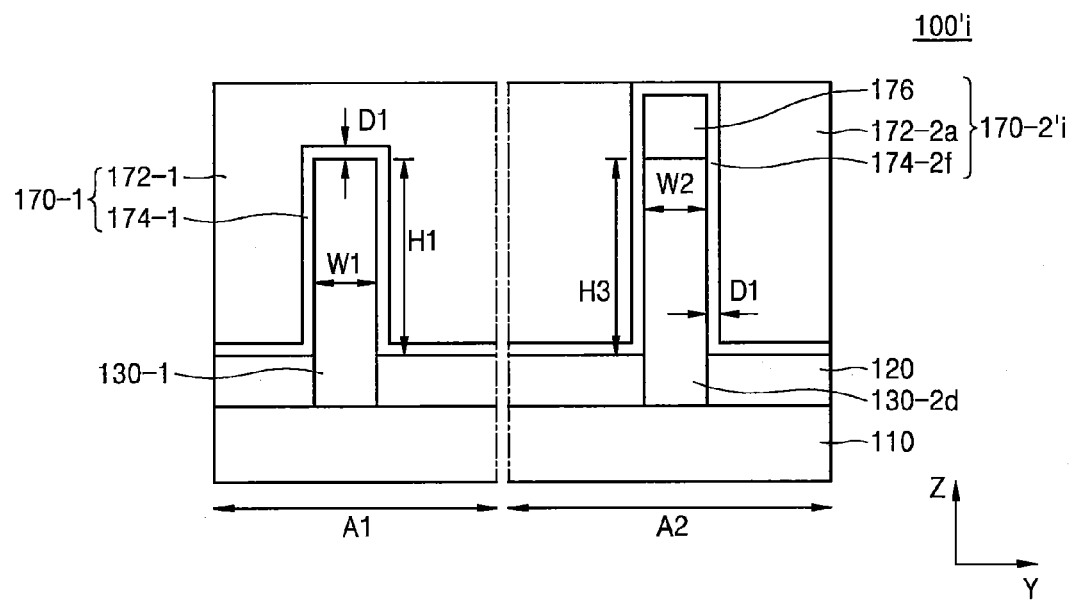

Referring to FIG. 14, a difference between a semiconductor device 100'i of the present example embodiment and the semiconductor device 100i of FIG. 13 is a second gate structure 170-2'i. For example, a second dielectric film 174-2f of the second gate structure 170-2'i may be formed to cover both side surfaces of the second fin 130-2d and the capping insulating film 176 and a top surface of the capping insulting film 176, and may be formed to entirely have a uniform thickness. Accordingly, a top surface of the second dielectric film 174-2f may be exposed from a top surface of the second gate electrode 172-2a, and the top surface of the second dielectric film 174-2f and the top surface of the second gate electrode 172-2a may be coplanar or on substantially the same plane.

For reference, whether to maintain or remove the second dielectric film 174-2f on the top surface of the capping insulating film 176 may be determined during a manufacturing process. For example, according to whether to use the second dielectric film 174-2f on the capping insulating film 176 as an etch-stop film or the capping insulating film 176 as an etch-stop film during a process of planarizing the second gate electrode 172-2a, the second dielectric film 174-2f on the capping insulating film 176 may be maintained or removed.

Figure 15:
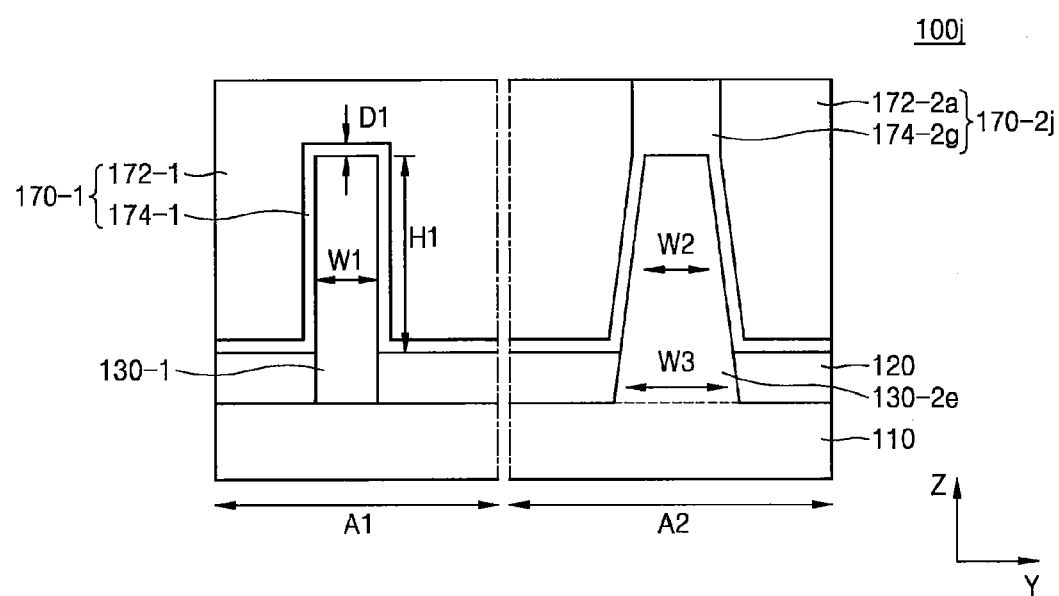

Referring to FIG. 15, some differences between a semiconductor device 100j of the present example embodiment and the semiconductor device 100h of FIG. 11 are a second fin 130-2e and a second gate structure 170-2j.

A structure of the second fin 130-2e may be similar to a structure of the second fin 130-2a of the semiconductor device 100b of FIG. 4. For example, a vertical cross-section of the second fin 130-2e may have a trapezoidal shape or a tapered shape in which an upper side is narrow and a lower side is wide. However, a height of the second fin 130-2e may be greater than a height of the second fin 130-2a of the semiconductor device 100b of FIG. 4.

A second dielectric film 174-2g may be formed to surround or otherwise on both side surfaces and a top surface of the second fin 130-2e, like the second dielectric film 174-2b of the semiconductor device 100b of FIG. 4. Also, as the side surfaces of the second fin 130-2e are formed to be inclined, the second dielectric film 174-2g may be formed to be inclined along the side surfaces of the second fin 130-2e. However, as the both side surfaces of the second fin 130-2e are increased, portions of the second dielectric film 174-2g corresponding to the both side surfaces of the second fin 130-2e may be increased. A top surface of the second dielectric film 174-2g and a top surface of the second gate electrode 172-2a may be coplanar or on substantially the same plane, and the top surface of the second dielectric film 174-2g may be exposed from the top surface of the second gate electrode 172-2a, like the second dielectric film 174-2d of the semiconductor device 100h of FIG. 11.

The second dielectric film 174-2g may be formed to have a lesser thickness on the both side surfaces of the second fin 130-2e and may be formed to have a greater thickness on the top surface of the second fin 130-2e. However, as described for the semiconductor device 100h of FIG. 11, since the second gate electrode 172-2a is not formed on the top surface of the second dielectric film 174-2g, the second dielectric film 174-2g on the top surface of the second fin 130-2e may not be formed to have a greater thickness.

Figure 16:
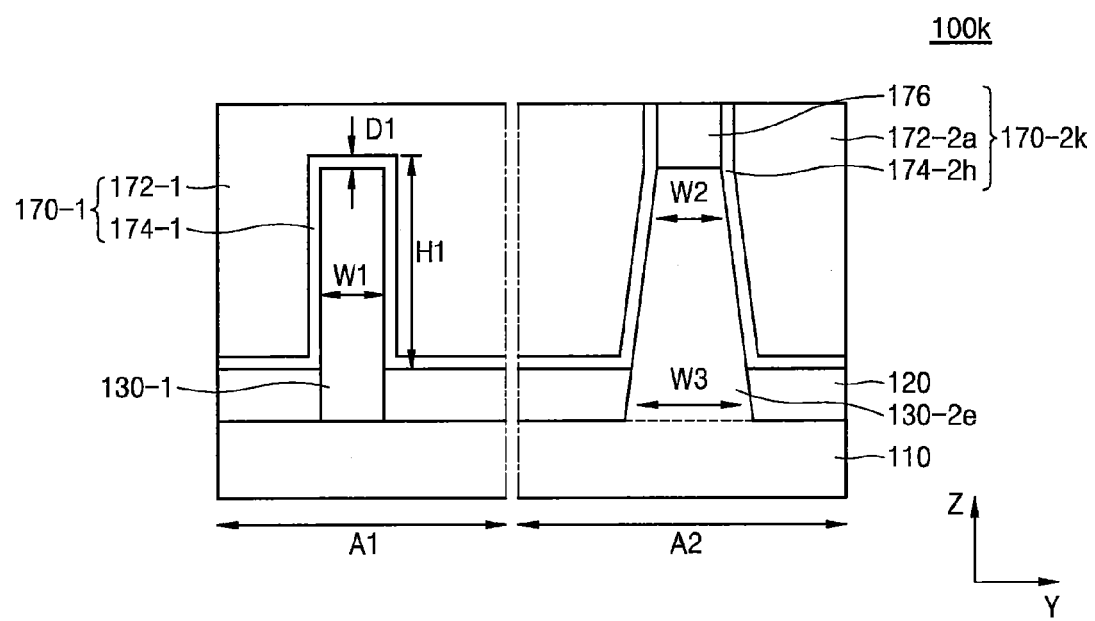

Referring to FIG. 16, some differences between a semiconductor device 100k of the present example embodiment and the semiconductor device 100i of FIG. 13 are the second fin 130-2e and a second gate structure 170-2k.

A structure of the second fin 130-2e may be the same as a structure of the second fin 130-2e of the semiconductor device 100j of FIG. 15. For example, a vertical cross-section of the second fin 130-2e may have a trapezoidal shape or a tapered shape in which an upper side is narrow and a lower side is wide. However, a height of the second fin 130-2e may be greater than a height of the second fin 130-2a of the semiconductor device 100b of FIG. 4.

A second dielectric film 174-2h may be formed to entirely have a uniform thickness and may cover both side surfaces of the second fin 130-2e and the capping insulating film 176, like the second dielectric film 174-2e of the semiconductor device 100i of FIG. 13. Also, the second dielectric film 174-2h may not extend on or be formed on a top surface of the capping insulating film 176, and thus, the top surface of the capping insulating film 176 may be exposed from a top surface of the second gate electrode 172-2a. However, since the side surfaces of the second fin 130-2e are formed to be inclined, the second dielectric film 174-2h may be formed to be inclined along the side surfaces of the second fin 130-2e.

Although the second dielectric film 174-2h is not formed on the top surface of the capping insulating film 176 in the semiconductor device 100k of the present example embodiment, the second dielectric film 174-2h may be formed on the top surface of the capping insulating film 176, like in the semiconductor device 100'i of FIG. 14.

Figure 17:
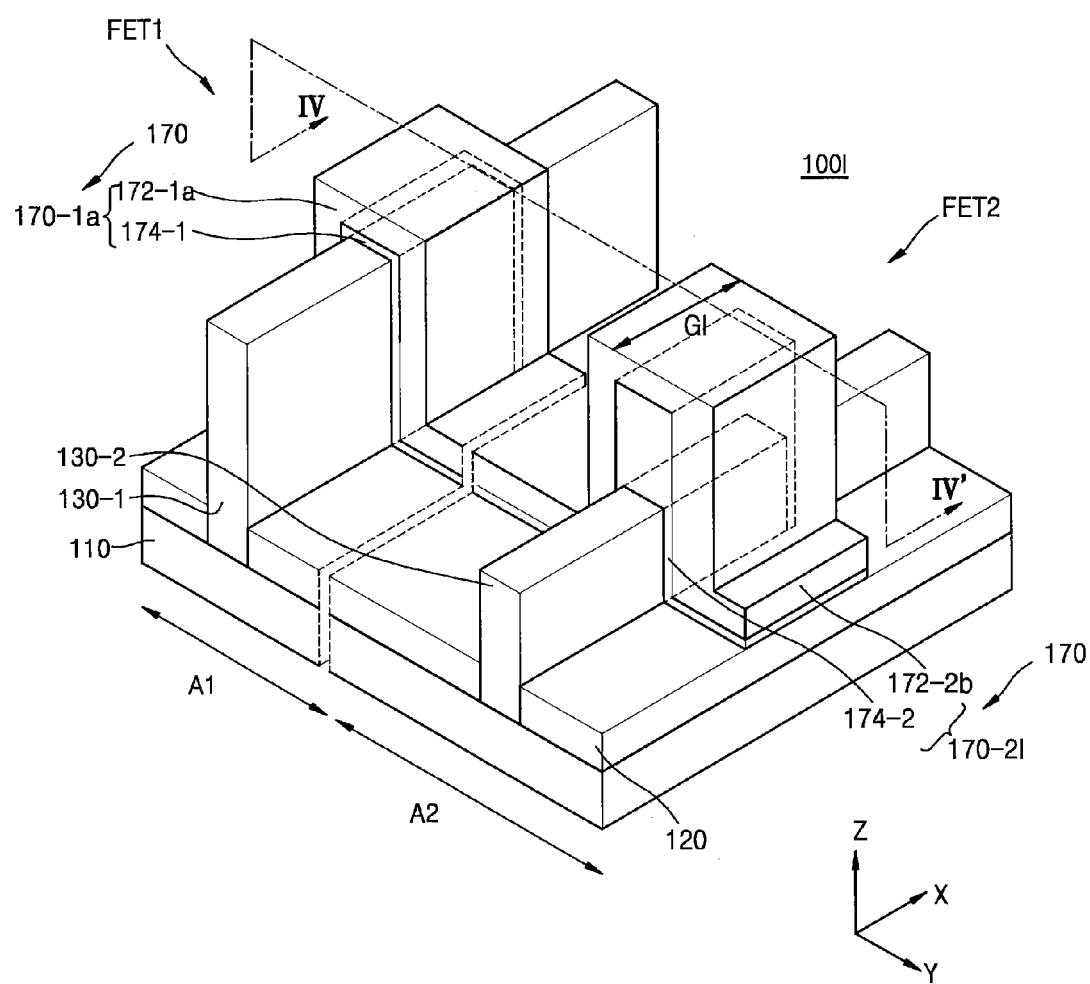
FIG. 17 is a perspective view illustrating a semiconductor device including FETs having different gate structures, according to further embodiments.
Figure 18:
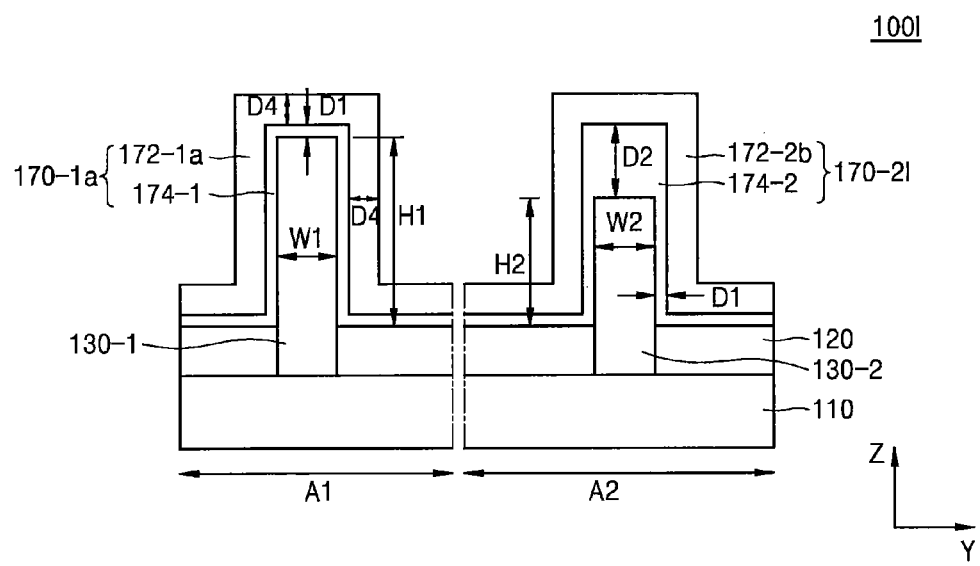
FIG. 18 is a cross-sectional view taken along line IV-IV' of the semiconductor device of FIG. 17, according to some embodiments.

FIG. 17 is a perspective view illustrating a semiconductor device 100l including FETs having different gate structures, according to further embodiments. FIG. 18 is a cross-sectional view taken along line IV-IV' of the semiconductor device 100l of FIG. 17, according to some embodiments. The description already made with reference to FIG. 1 will be briefly repeated or omitted for convenience of description.

Referring to FIGS. 17 and 18, some differences between the semiconductor device 100l of the present example embodiment and the semiconductor device 100 of FIG. 1 are a first gate structure 170-1a and a second gate structure 170-2l.

The first gate structure 170-1a may include the first dielectric film 174-1 and a first gate electrode 172-1a, and the second gate structure 170-2l may include the second dielectric film 174-2 and a second gate electrode 172-2b. Structures of the first dielectric film 174-1 and the second dielectric film 174-2 may be the same as structures of the first dielectric film 174-1 and the second dielectric film 174-2 of the semiconductor device 100 of FIG. 1.

Structures of the first gate electrode 172-1a and the second gate electrode 172-2b may be different from structures of the first gate electrode 172-1 and the second gate electrode 172-2 of the semiconductor device 100 of FIG. 1. For example, the first gate electrode 172-1a and the second gate electrode 172-2b may respectively cover the first fin 130-1 and the second fin 130-2 with the first dielectric film 174-1 and the second dielectric film 174-2 disposed between the first and second gate electrodes 172-1a and 172-2b and the first and second fins 130-1 and 130-2, and may have a uniform thickness. In other words, the first gate electrode 172-1a may maintain the same thickness on both side surfaces and a top surface of the first fin 130-1. For example, the first gate electrode 172-1a and the second gate electrode 172-2b may maintain a fourth thickness D4 throughout.

The first gate electrode 172-1a and the second gate electrode 172-2b may extend in the second direction (y direction), like the first gate electrode 172-1 and the second gate electrode 172-2 of the semiconductor device 100 of FIG. 1. Accordingly, the first gate electrode 172-1a a and the second gate electrode 172-2b may also be formed on the first dielectric film 174-1 and the second dielectric film 174-2 on the device isolation film 120. Also, the first gate electrode 172-1a and the second gate electrode 172-2b on the device isolation film 120 may also have the fourth thickness D4.

FIGS. 19 through 22 are cross-sectional views corresponding to the cross-sectional view taken along line IV-IV' of the semiconductor device 100l of FIG. 17, according to some embodiments. The description already made with reference to FIGS. 1 through 5 and 17 will be briefly repeated or omitted for convenience of description.

Figure 19:
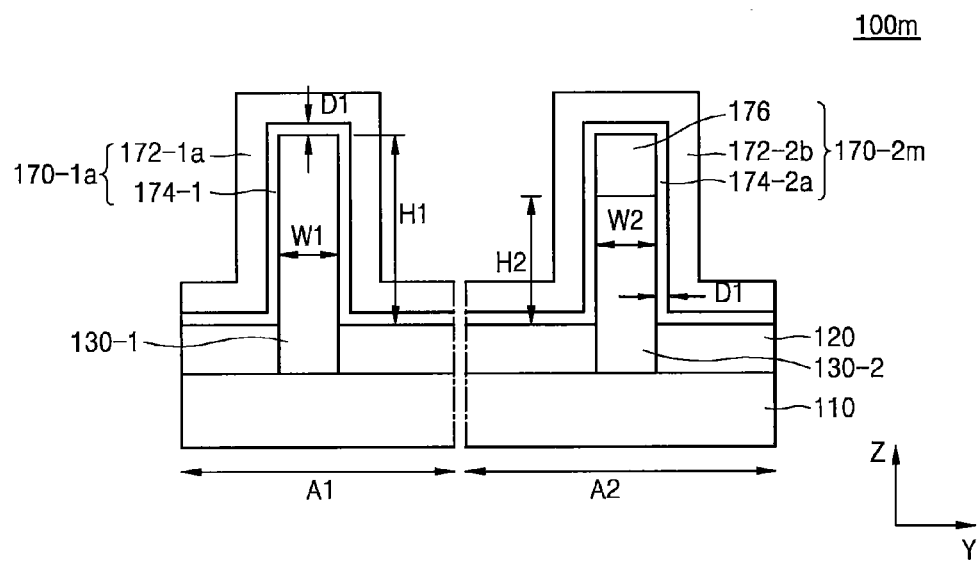
FIGS. 19 through 22 are cross-sectional views corresponding to the cross-sectional view taken along line IV-IV' of the semiconductor device of FIG. 17, according to some embodiments.

Referring to FIG. 19, a difference between a semiconductor device 100m of the present example embodiment and the semiconductor device 100l of FIG. 17 is a second gate structure 170-2m. In detail, the second gate structure 170-2m may be formed in the second region A2, and may include the second dielectric film 174-2a, the capping insulating film 176, and the second gate electrode 172-2b. The second fin 130-2 and the second gate electrode 172-2b are the same as those of the semiconductor device 100l of FIG. 17.

The second dielectric film 174-2a may have the same structure as that of the second dielectric film 174-2a of the semiconductor device 100a of FIG. 3. For example, the second dielectric film 174-2a may be formed on both side surfaces of the second fin 130-2 and the capping insulating film 176 and a top surface of the capping insulating film 176, and may be formed to have a uniform thickness. A material of the second dielectric film 174-2a can be the same as that described for the semiconductor device 100 of FIG. 1 and a structure, a thickness, or a material of the capping insulating film 176 can be the same as that described for the semiconductor device 100a of FIG. 3.

Figure 20:
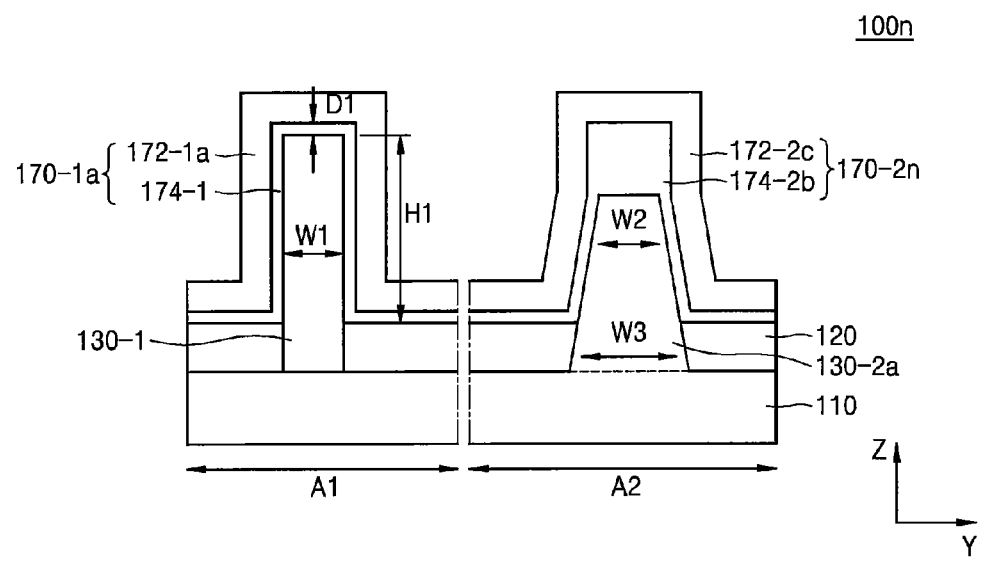

Referring to FIG. 20, some differences between a semiconductor device 100n of the present example embodiment may be different from the semiconductor device 100l of FIG. 17 are the second fin 130-2a and a second gate structure 170-2n.

A structure of the second fin 130-2a may be the same as a structure of the second fin 130-2a of the semiconductor device 100b of FIG. 4. For example, a vertical cross-section of the second fin 130-2a may have a trapezoidal shape or a tapered shape in which an upper side is narrow and a lower side is wide.

The second dielectric film 174-2b may be formed to surround or otherwise on both side surfaces and a top surface of the second fin 130-2a, like the second dielectric film 174-2b of the semiconductor device 100b of FIG. 4. Since the side surfaces of the second fin 130-2a are formed to be inclined, the second dielectric film 174-2b may also be formed to be inclined along the side surfaces of the second fin 130-2a. Also, the second dielectric film 174-2b may be formed to have a lesser thickness on the both side surfaces of the second fin 130-2a and to have a greater thickness on the top surface of the second fin 130-2a.

A second gate electrode 172-2c may entirely have a uniform thickness, like the second gate electrode 172-2b of the semiconductor device 100l of FIG. 17. However, since the second dielectric film 174-2b is formed to be inclined along the inclined side surfaces of the second fin 130-2a, the second gate electrode 172-2c that is formed on the second dielectric film 174-2b may also be formed to be inclined along the inclined side surfaces of the second fin 130-2a.

Figure 21:
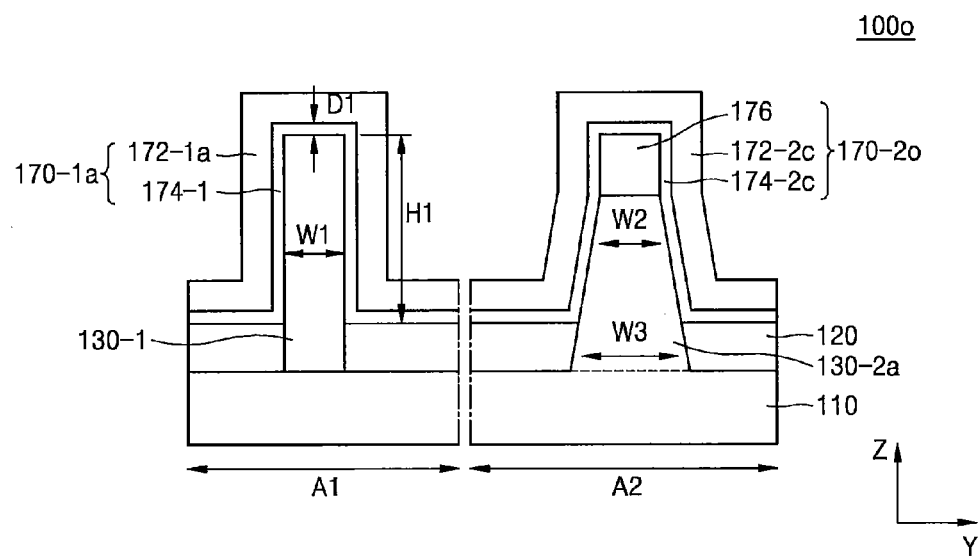

Referring to FIG. 21, some differences between a semiconductor device 100o of the present example embodiment and the semiconductor device 100m of FIG. 19 are the second fin 130-2a and a second gate structure 170-2o.

A structure of the second fin 130-2a may be the same as a structure of the second fin 130-2a of the semiconductor device 100b of FIG. 4. For example, a vertical cross-section of the second fin 130-2a may have a trapezoidal shape or a tapered shape in which an upper side is narrow and a lower side is wide.

The second dielectric film 174-2c may be formed to entirely have a uniform thickness, like the second dielectric film 174-2a of the semiconductor device 100m of FIG. 19, and may cover both side surfaces of the second fin 130-2a and the capping insulating film 176 and a top surface of the capping insulating film 176. However, since the side surfaces of the second fin 130-2a are formed to be inclined, portions of the second dielectric film 174-2c corresponding to the side surfaces of the second fin 130-2a may be formed to be inclined along the side surfaces of the second fin 130-2a.

The second gate electrode 172-2c may entirely have a uniform thickness, like the second gate electrode 172-2c of the semiconductor device 100n of FIG. 20. Also, since the second dielectric film 174-2c is formed to be inclined along the inclined side surfaces of the second fin 130-2a, the second gate electrode 172-2c that is formed on the second dielectric film 174-2c may also be formed to be inclined along the inclined side surfaces of the second fin 130-2a.

Figure 22:
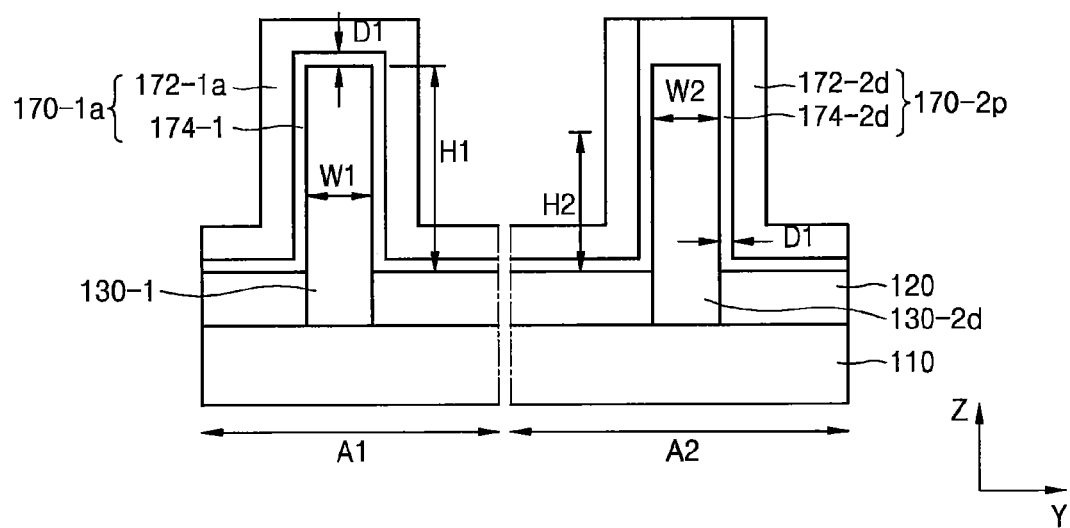

Referring to FIG. 22, a semiconductor device 100p of the present example embodiment may have a complex structure of the semiconductor device 100h of FIG. 11 and the semiconductor device 100l of FIG. 17. In detail, the first gate electrode 172-1a of the first gate structure 170-1a and a second gate electrode 172-2d of a second gate structure 170-2p may have a uniform thickness, like in the semiconductor device 100l of FIG. 17.

The second fin 130-2d may have substantially the same height as that of the first fin 130-1, like in the semiconductor device 100h of FIG. 11. Also, the second dielectric film 174-2d may be formed to cover both side surfaces and a top surface of the second fin 130-2d and may be formed such that the second dielectric film 174-2d on the top surface of the second fin 130-2d is thicker than the second dielectric film 174-2d on the both side surfaces of the second fin 130-2d. Furthermore, a top surface of the second dielectric film 174-2d may be exposed from a top surface of the second gate electrode 172-2d, and the top surface of the second dielectric film 174-2d and the top surface of the second gate electrode 172-2d may be coplanar or on substantially the same plane. Accordingly, the second gate electrode 172-2d may not extend on or be formed on the top surface of the second dielectric film 174-2d.

The second gate electrode 172-2d may be formed only on side surfaces of the second dielectric film 174-2d, and may entirely have a uniform thickness. The second gate electrode 172-2d may also be formed on the second dielectric film 174-2d on the device isolation film 120. In some embodiments, the second gate electrode 172-2d may not extend on or be formed on the device isolation film 120.

Figure 23:
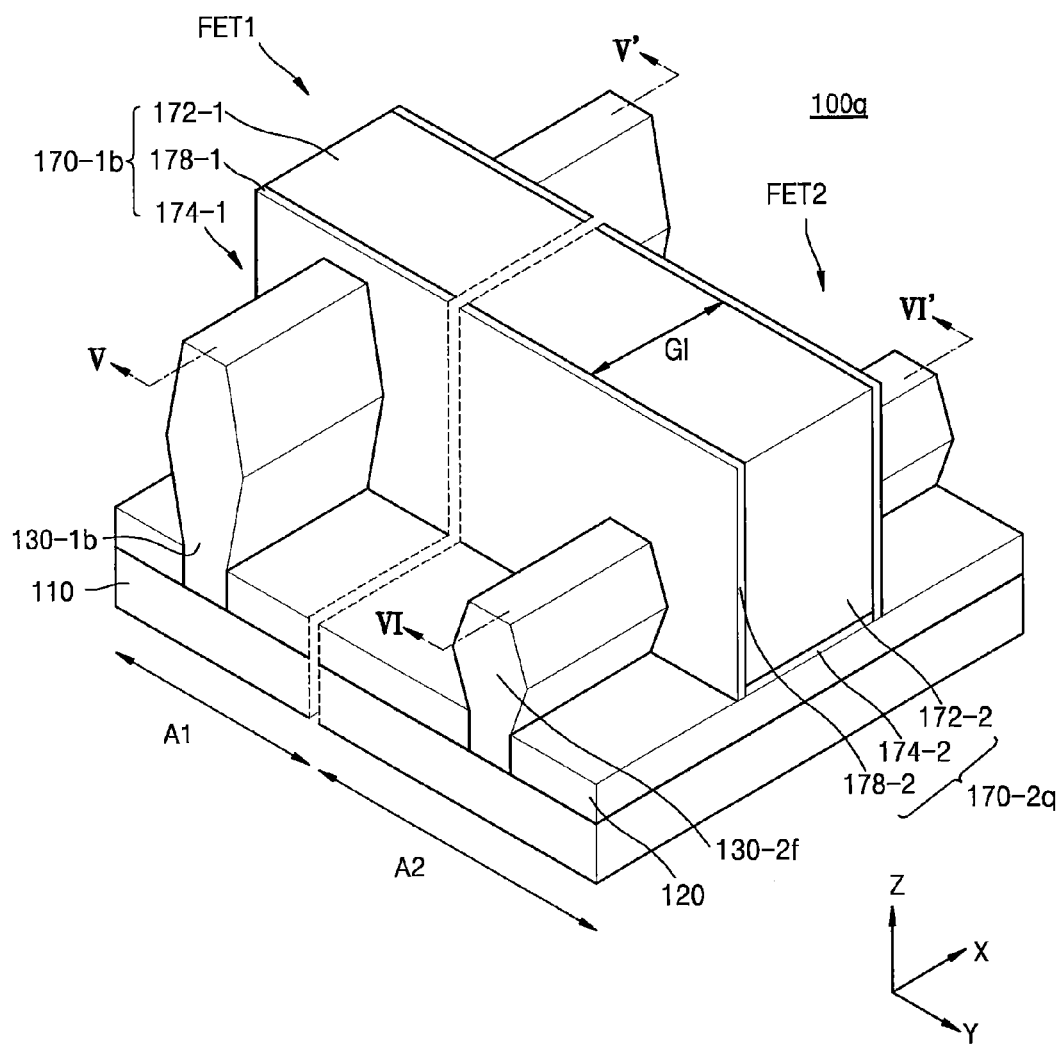
FIG. 23 is a perspective view illustrating a semiconductor device including FETs having different gate structures, according to further embodiments.
Figure 24:
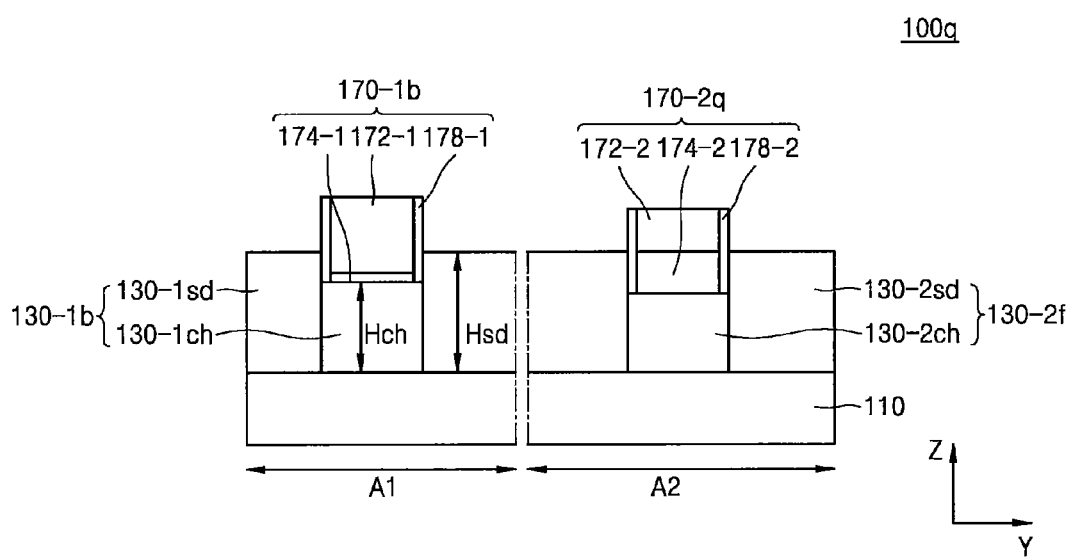
FIG. 24 is a cross-sectional view taken along lines V-V' and VI-VI' of the semiconductor device of FIG. 23, according to some embodiments.

FIG. 23 is a perspective view illustrating a semiconductor device 100q including FETs having different gate structures, according to further embodiments. FIG. 24 is a cross-sectional view taken along lines V-V' and VI-VI' of the semiconductor device 100q of FIG. 23, according to some embodiments. The description already made with reference to FIG. 1 will be briefly repeated or omitted for convenience of description.

Referring to FIGS. 23 and 24, some differences between the semiconductor device 100q of the present example embodiment and the semiconductor device 100 of FIG. 1 are a first fin 130-1b, a second fin 130-2f, a first gate structure 170-1b, and a second gate structure 170-2q. In detail, the first fin 130-1b may include a first source/drain region 130-1sd and a first channel region 130-1ch, and the second fin 130-2f may include a second source/drain region 130-2sd and a second channel region 130-2ch. First fins and second fins of the example embodiments described herein may also include a source/drain region and a channel region. However, structures of the source/drain region in the first fins and second fins may be the same as those of the channel region in the first fins and the second fins in the previous example embodiments, whereas structures of the source/drain region in the first fin 130-1b and the second fin 130-2f may be different than those of the channel region in the first fin 130-1b and the second fin 130-2f.

In the first and second source/drain regions 130-1sd and 130-2sd of the first fin 130-1b and the second fin 130-2f, cross-sections of portions of the source/drain regions 130-sd and 130-sd over the device isolation film 120 may have hexagonal shapes. However, structures of the first and second source/drain regions 130-1sd and 130-2sd are not limited thereto. In further detail, the first and second source/drain regions 130-1sd and 130-2sd may be formed again through epitaxial growth after the first gate structure 170-1b and the second gate structure 170-2q are formed. Accordingly, the cross-sections of the portions of the first and second source/drain regions 130-1sd and 130-2sd over the device isolation film 120 may have any of various shapes such as polygonal shapes, elliptical shapes, or circular shapes, based on an epitaxial growth condition. Also, since the first and second source/drain regions 130-1sd and 130-2sd are formed again through epitaxial growth, a source/drain height Hsd may be greater than a channel height Hch of each of the first and second channel regions 130-1ch and 130-2ch. In some embodiments, widths of the first and second source/drain regions 130-1sd and 130-2sd between the device isolation films 120 in the second direction (y direction) may also be greater than those in semiconductor devices of other embodiments. Structures of the first and second source/drain regions 130-1sd and 130-2sd will be explained below in detail with reference to FIG. 37.

The first gate structure 170-1b may include the first dielectric film 174-1, the first gate electrode 172-1, and a first gate spacer 178-1, and the second gate structure 170-2q may include the second dielectric film 174-2, the second gate electrode 172-2, and a second gate spacer 178-2. The first dielectric film 174-1, the second dielectric film 174-2, the first gate electrode 172-1, and the second gate electrode 172-2 are the same as those in the semiconductor device 100 of FIG. 1. Accordingly, a cross-sectional view of the semiconductor device 100q of the present example embodiment corresponding to the cross-sectional view taken along line I-I' of the semiconductor device 100 of FIG. 1 may be the same as the cross-sectional view of FIG. 2.

The first gate spacer 178-1 and the second gate spacer 178-2 may be formed to respectively cover both side surfaces of the first gate electrode 172-1 and the second gate electrode 172-2. The first gate spacer 178-1 and the second gate spacer 178-2 may be formed to prevent the first and second gate electrodes 172-1 and 172-2 from contacting the first and second fins 130-1b and 130-2f when the first fin 130-1b and the second fin 130-2f are grown through epitaxial growth. Also, when contact electrodes that are connected to the first fin 130-1b and the second fin 130-2f are subsequently formed, the first gate spacer 178-1 and the second gate spacer 178-2 may also prevent the contact electrodes from contacting the first and second gate electrodes 172-1 and 172-2.

Figure 25:
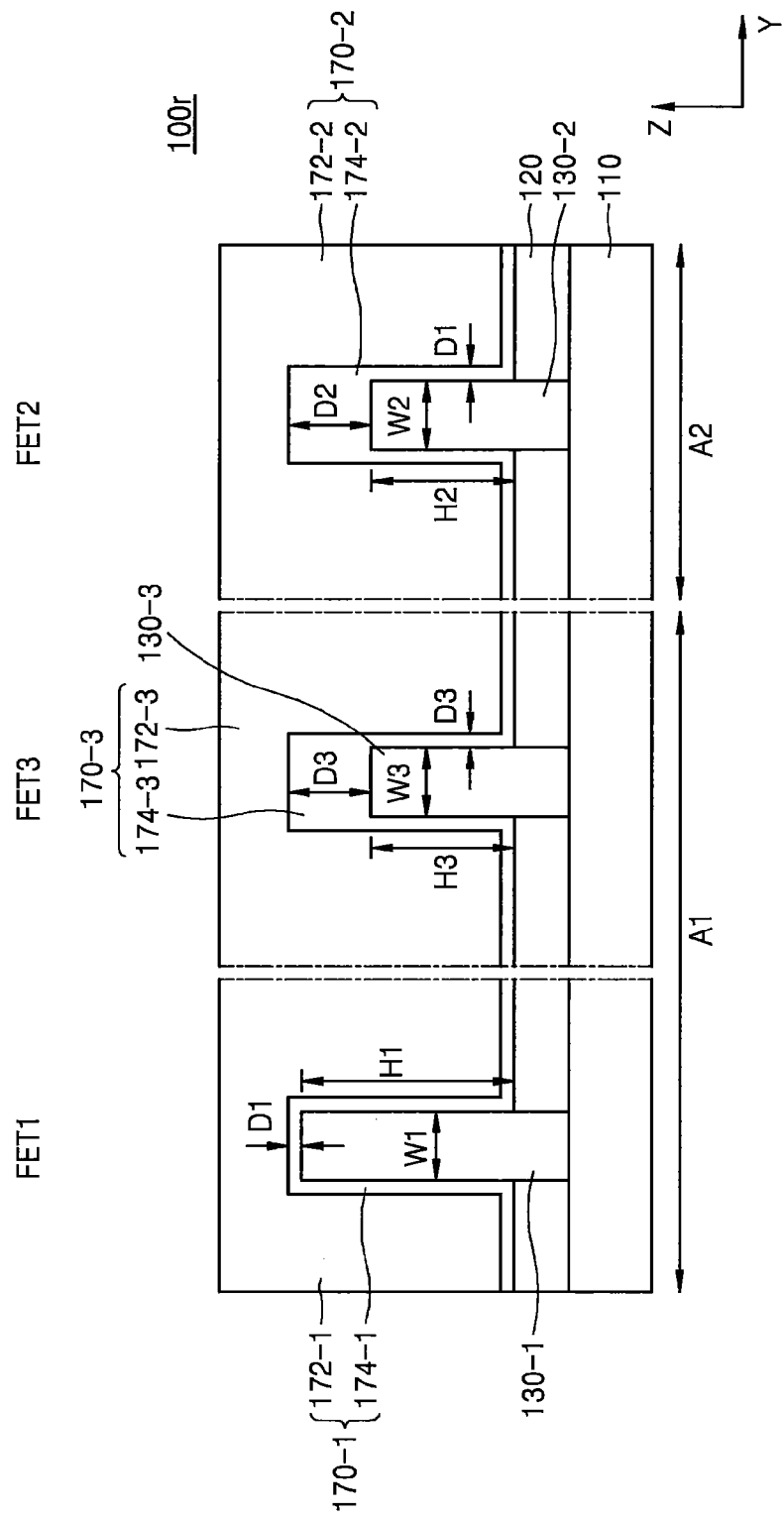
FIG. 25 is a cross-sectional view illustrating a semiconductor device including FETs having different gate structures, according to further embodiments.

FIG. 25 is a cross-sectional view illustrating a semiconductor device 100r including FETs having different gate structures, according to further embodiments. The description already made with reference to FIG. 1 will be briefly repeated or omitted for convenience of description.

Referring to FIG. 25, the semiconductor device 100r of the present example embodiment may be similar to the semiconductor device 100 of FIG. 1, except that the semiconductor device 100r further includes a third FinFET FET3 that is disposed in the first region A1. The third FinFET FET3 may have the same structure as that of the second FinFET FET2. For example, the third FinFET FET3 may include a third fin 130-3 and a third gate structure 170-3. The third fin 130-3 may have the same structure as that of the second fin 130-2, and the third gate structure 170-3 may have the same structure as that of the second gate structure 170-2.

In further detail, a height of the third fin 130-3 may be less than a height of the first fin 130-1. Also, the third gate structure 170-3 may include a third dielectric film 174-3 and a third electrode 172-3, and the third dielectric film 174-3 may be formed to have a lesser thickness on both side surfaces of the third fin 130-3 and to have a greater thickness on a top surface of the third fin 130-3. Accordingly, the third FinFET FET3 may have a double-gate structure.

FinFETs having various sizes and functions may be disposed in the first region A1 where logic devices are formed. At least one of the FinFETs may require an operating voltage that is equal to or greater than a predetermined voltage despite scaling, and in this case, a leakage current may be generated and reliability be reduced due to a high BTBT or field. In the semiconductor device 100r of the present example embodiment, since a FinFET having a double-gate structure is applied to the first region A1 where the logic devices are disposed according to functions of the logic devices, the performance of all of the logic devices in the first region A1 may be improved and the problem of I/O devices and the logic devices, that is, a leakage current and reduced reliability, may be addressed or solved.

In the semiconductor device 100r of the present example embodiment, the third FinFET FET3 having the same structure as that of the second FinFET FET2 of the semiconductor device 100 of FIG. 1 is disposed in the first region A1. However, a structure of the semiconductor device 100r of the present example embodiment is not limited thereto. For example, the third FinFET FET3 that is disposed in the first region A1 may have any of various structures of the second FinFET FET2 of FIGS. 3 through 24.

FIGS. 26A through 32B are perspective views and cross-sectional views for explaining a method of manufacturing the semiconductor device 100a of FIG. 3, according to some embodiments. FIGS. 26B, 27B, . . . , and 32B are cross-sectional views respectively taken along lines VII-VII' of FIGS. 26A, 27A, . . . , and 32A. The description already made with reference to FIGS. 1 and 3 will be briefly repeated or omitted for convenience of description.

Figure 26A:
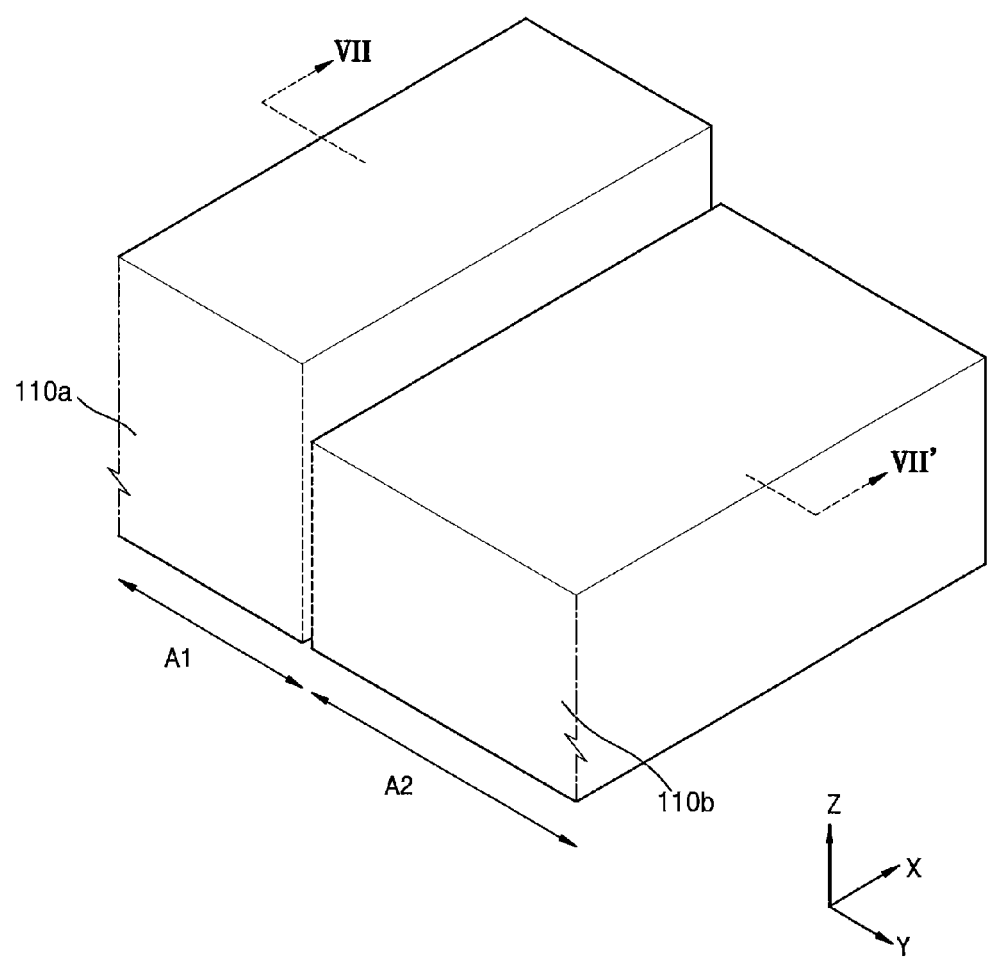
FIGS. 26A through 32B are perspective views and cross-sectional views for explaining a method of manufacturing the semiconductor device of FIG. 3, according to some embodiments, wherein FIGS. 26B, 27B, . . . , and FIG. 32B are cross-sectional views respectively taken along lines VII-VII' of FIGS. 26A, 27A, . . . , and 32A.
Figure 26B:
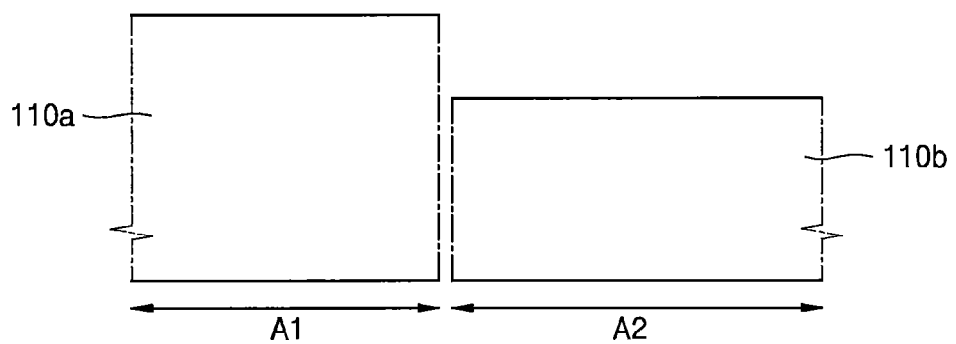

Referring to FIGS. 26A and 26B, a bulk substrate where the first region A1 and the second region A2 are defined is prepared. The bulk substrate may be a silicon bulk substrate. Next, a resist film is formed on a top surface of the substrate in the first region A1, and an upper portion of the substrate in the second region A2 may be selectively removed by using anisotropic etching by using the resist film as a mask to reduce a height of the substrate. The reduced height of the substrate in the second region A2 may be determined in consideration of a thickness of a dielectric film or a capping insulating film that is subsequently formed on a top surface of a fin. For example, the reduced height of the substrate may be determined so that a thickness of the dielectric film or the capping insulating film that is subsequently formed on the top surface of the fin is great enough not to form or sufficient to prevent formation of a channel on the top surface of the fin.

After the upper portion of the substrate in the second region A2 is etched, the resist film is removed. FIGS. 26A and 26B are views after the resist film is removed. It is found that a height of a substrate 110a in the first region A1 is greater than a height of a substrate 110b in the second region A2.

Figure 27A:
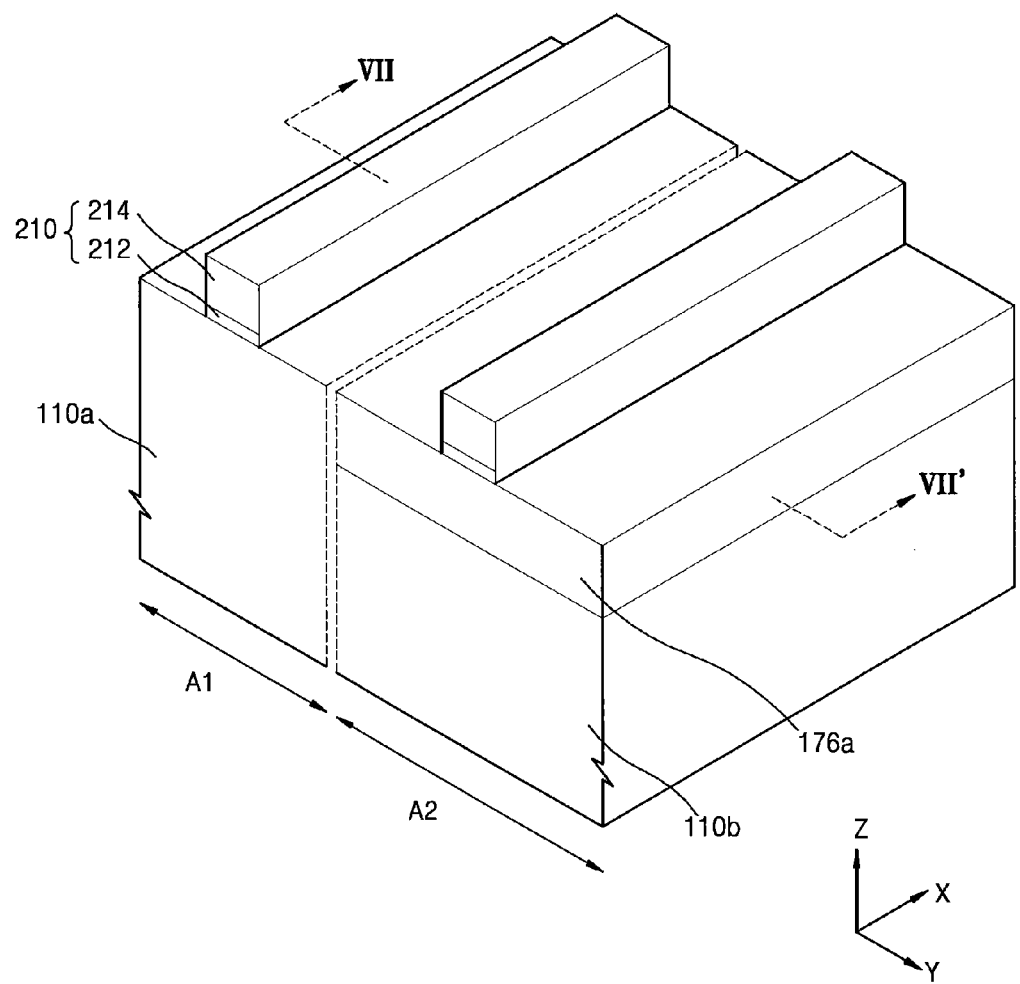
Figure 27B:
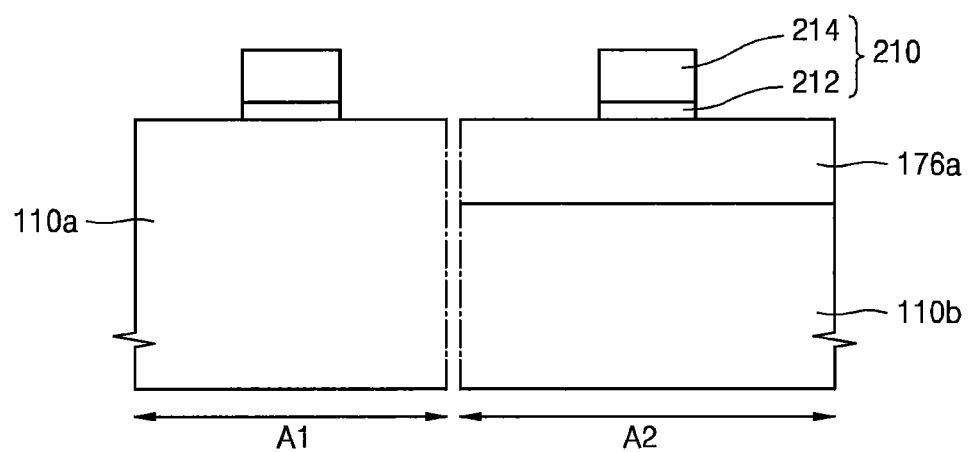

Referring to FIGS. 27A and 27B, an insulating material is deposited on top surfaces of the substrates 110a and 110b, and then planarization is performed to expose the top surface of the substrate 110a in the first region A1. Accordingly, an insulating film 176a may be formed on the substrate 110b in the second region A2. The insulating film 176a may be formed of any materials that are used to form the capping insulating film 176 of the semiconductor device 100a of FIG. 3.

After the insulating film 176a is formed, a mask pattern 210 that extends in the first direction (x direction) is formed on the top surface of the substrate 110a in the first region A1 and on a top surface of the insulating film 176a in the second region A2. The mask pattern 210 may include a first mask pattern 212 and a second mask pattern 214 that are sequentially formed. The first mask pattern 212 and the second mask pattern 214 may have an etch selectivity with respect to the substrates 110a and 110b and the insulating film 176a.

For example, the first mask pattern 212 may be formed of a hard mask film such as an oxide film or a nitride film, and the second mask pattern 214 may be formed of a photoresist. In some embodiments, both the first mask pattern 212 and the second mask pattern 214 may be formed of hard mask films, and may have an etch selectivity with respect to each other. The first mask pattern 212 may also have an etch selectivity with respect to a material film for subsequently forming a device isolation film.

Figure 28A:
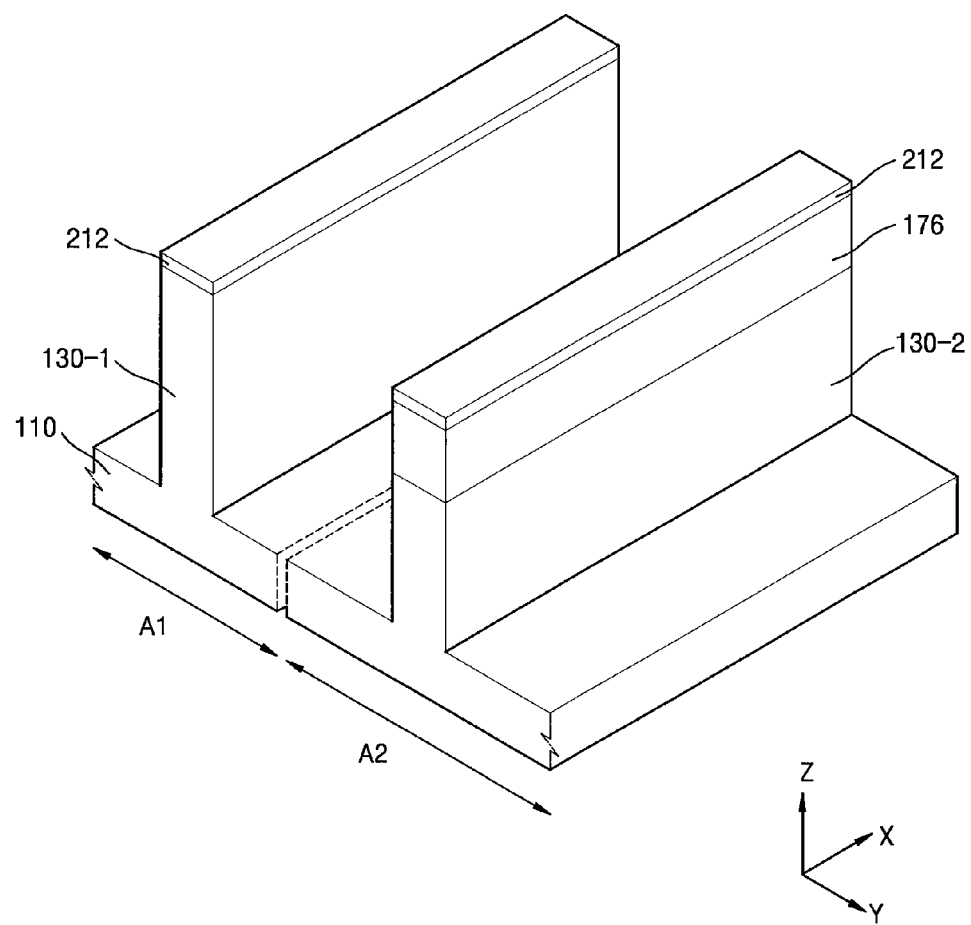
Figure 28B:
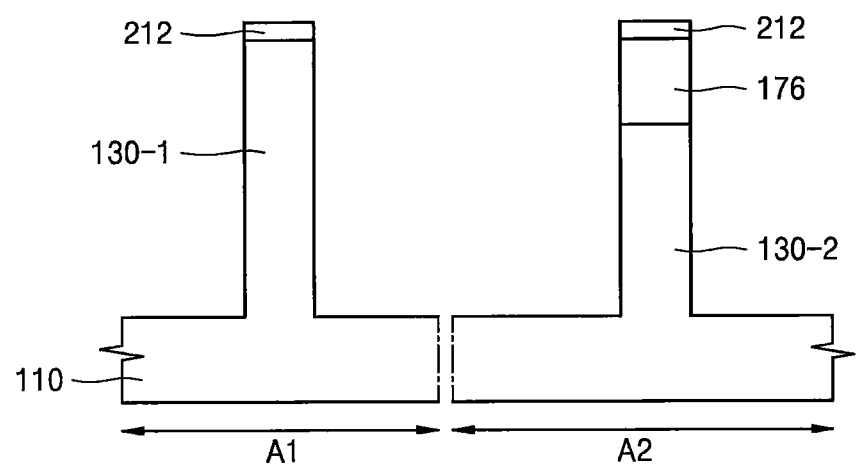

Referring to FIGS. 28A and 28B, an upper portion of the substrate 110a in the first region A1 is etched and upper portions of the insulating film 176a and the substrate 110b in the second region A2 are etched, by using the mask pattern 210 as a mask. Through the etching, the first fin 130-1 may be formed on the substrate 110 in the first region A1, the second fin 130-2 may be formed on the substrate 110 in the second region A2, and the capping insulating film 176 may be formed on the second fin 130-2. Next, the second mask pattern 214 is removed and only the first mask pattern 212 is maintained.

Figure 29A:
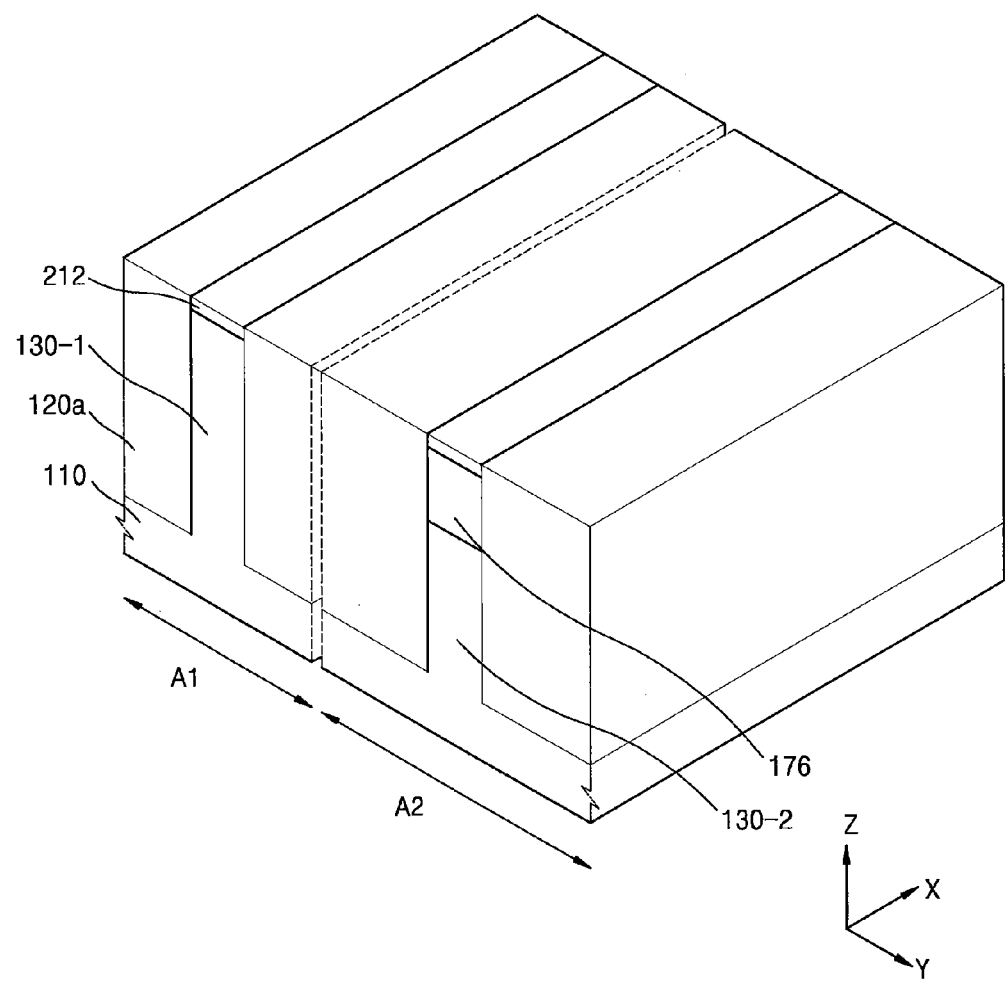
Figure 29B:
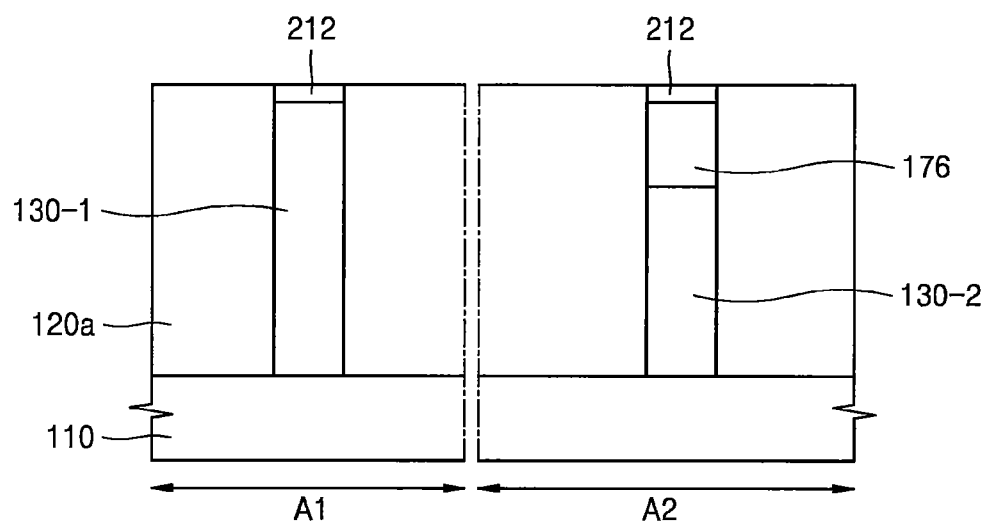

Referring to FIGS. 29A and 29B, an insulating material for forming a device isolation film is entirely deposited on a resultant structure of the substrate 110 and planarization is performed. The planarization may be performed by using an etching process such as chemical mechanical polishing (CMP) and/or etch-back. The first mask pattern 212 may be used as an etch-stop film. Through the planarization, an intermediate insulating film 120a may be filled between the first fins 130-1 and between the second fins 130-2, and a top surface of the intermediate insulating film 120a and a top surface of the first mask pattern 212 may be coplanar or on substantially the same plane.

Figure 30A:
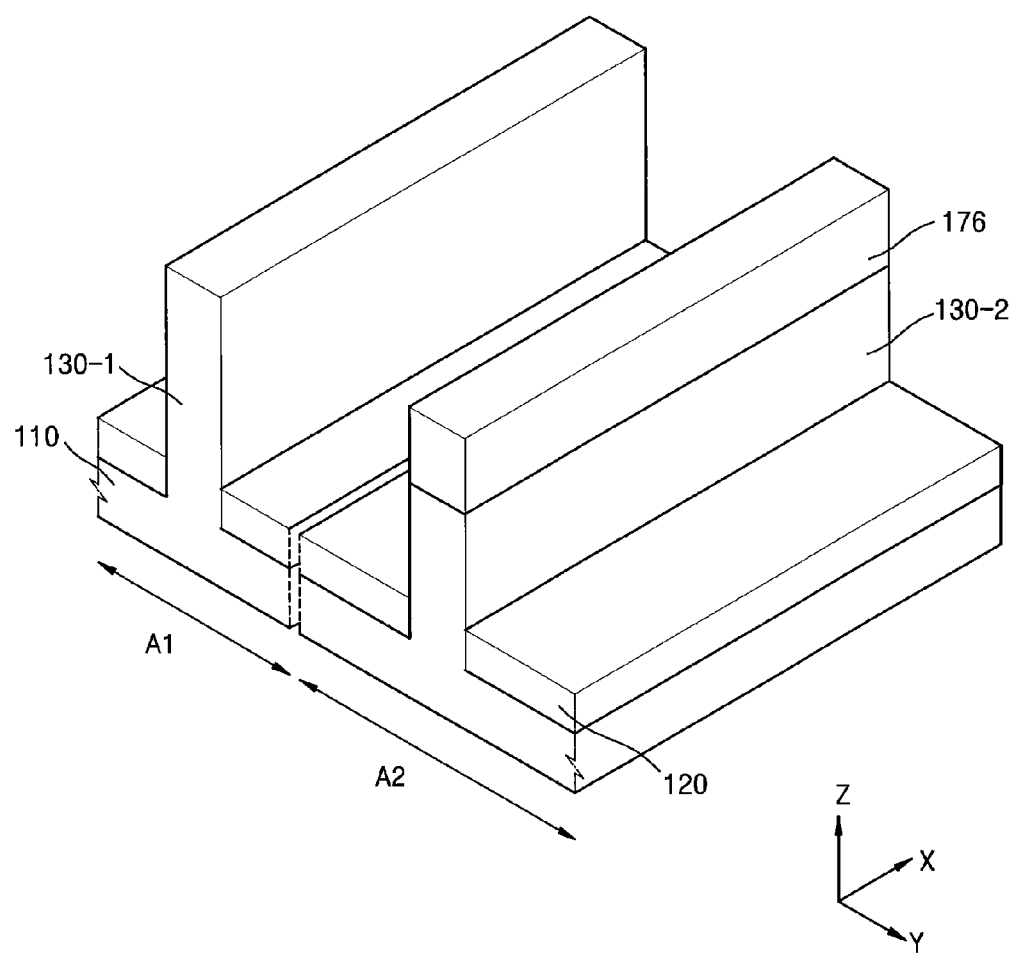
Figure 30B:
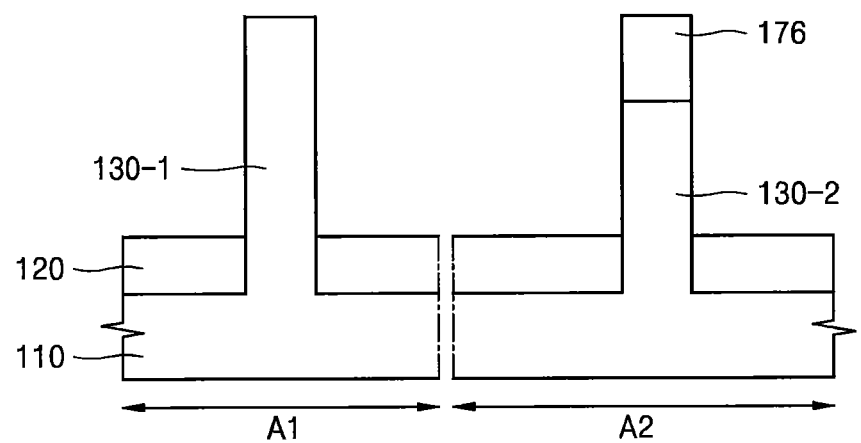

Referring to FIGS. 30A and 30B, the device isolation film 120 is formed by removing the intermediate insulating film 120a by a predetermined depth by using the first mask pattern 212 as a mask. The device isolation film 120 may have a predetermined thickness in consideration of a device isolation function and functions of the first fin 130-1 and the second fin 130-2.

In general, since an etch rate of an insulating material for forming a device isolation film between the first fins 130-1 and between the second fins 130-2 is less than an etch rate of an insulating material for forming a device isolation film over the first mask pattern 212, a planarization process may be omitted and an etching process may be directly performed, in some embodiments. However, in order to maintain a uniform thickness of the device isolation film 120, a planarization process may be performed first and then an etching process may be performed Referring to FIGS. 31A and 31B, after the device isolation film 120 is formed, a dielectric film 174 that covers up to the entire resultant structure of the substrate 110 is formed to have a predetermined thickness. For example, the dielectric film 174 may cover the device isolation film 120, both side surfaces and a top surface of the first fin 130-1, both side surfaces of the second fin 130-2, and both side surfaces and a top surface of the capping insulating film 176.

Figure 32A:
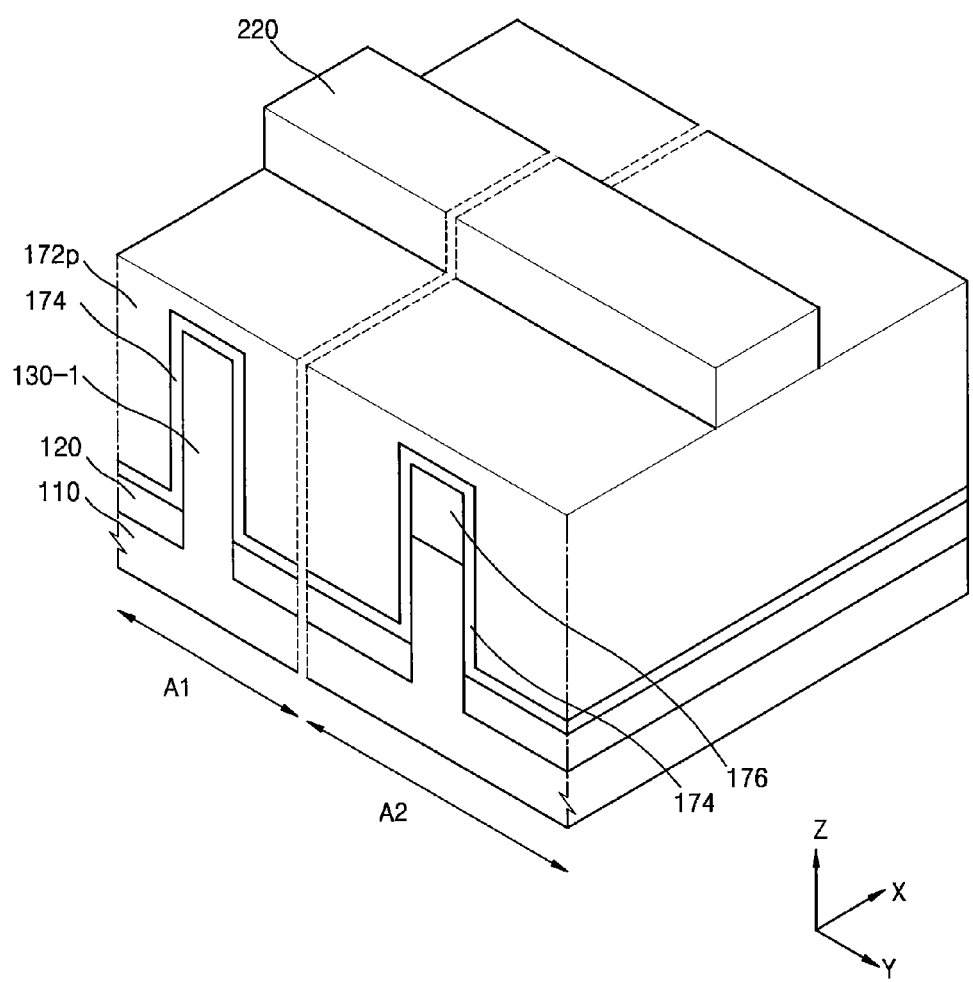
Figure 32B:
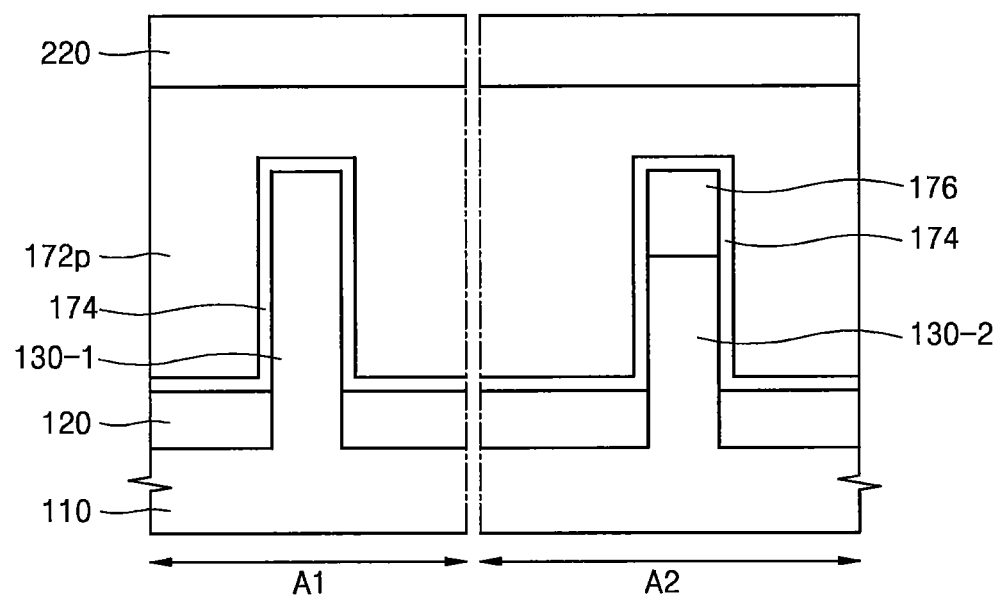

Referring to FIGS. 32A and 32B, after the dielectric film 174 is formed, a conductive film that covers up to the entire resultant structure of the substrate 110 is formed and planarization is performed. A material of the conductive material can be the same as that described for the first gate electrode 172-1 and the second gate electrode 172-2 of the semiconductor device 100 of FIG. 1. Next, a mask pattern 220 that has an etch selectivity with respect to the conductive film is formed on a planarized conductive film 172p. The mask pattern 220 may extend in the second direction (y direction).

Next, the first gate electrode 172-1 is formed in the first region A1 and the second gate electrode 172-2 is formed in the second region A2, by etching the planarized conductive film 172p by using the mask pattern 220 as a mask. The first gate structure 170-1 may be formed in the first region A1 and the second gate structure 170-2a may be formed in the second region A2, by forming the first dielectric film 174-1 and the second dielectric film 174-2 by also etching the dielectric film 174 that is disposed under the planarized conductive film 172p when the planarized conductive film 172p is etched. Accordingly, the semiconductor device 100a of FIG. 3 may be formed. In some embodiments, the dielectric film 174 may not be etched and may be maintained to form the first gate structure 170-1 and the second gate structure 170-2a.

FIGS. 33A through 33F are cross-sectional views for explaining a method of manufacturing the semiconductor device 100 of FIG. 1, according to some embodiments. The description already made with reference to FIGS. 1, and 26A through 32B will be briefly repeated or omitted for convenience of description.

Figure 33A:
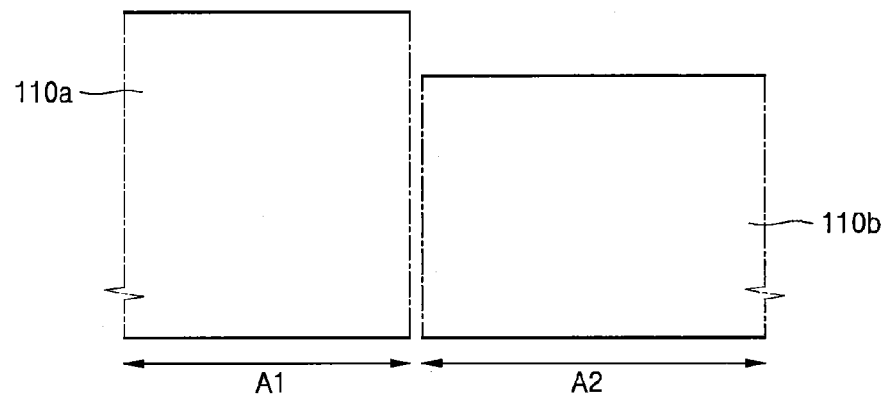
FIGS. 33A through 33F are cross-sectional views for explaining a method of manufacturing the semiconductor device of FIG. 1, according to some embodiments.

Referring to FIG. 33A, an upper portion of a substrate in the second region A2 is removed by a predetermined thickness, like in FIG. 26A. Accordingly, a height of the substrate 110a in the first region A1 may be greater than a height of the substrate 110b in the second region A2.

Figure 33B:
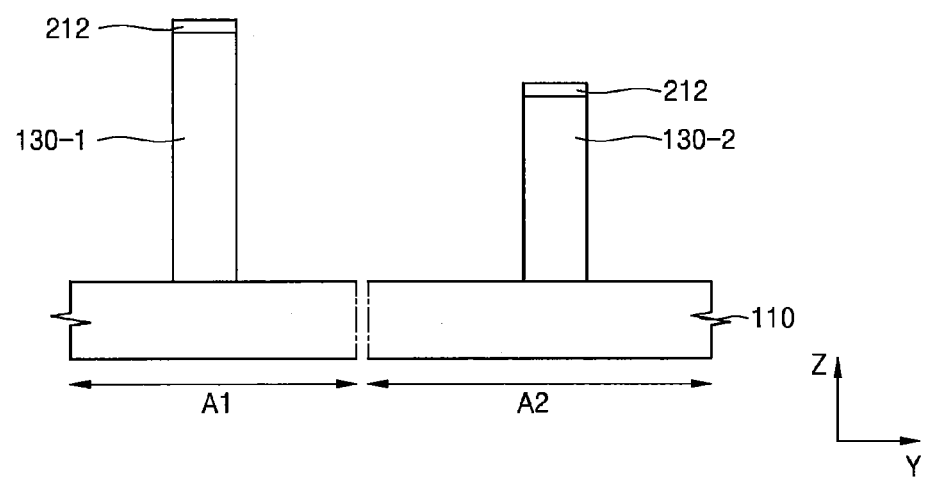

Referring to FIG. 33B, next, the mask pattern 210 (see FIG. 27A) that extends in the first direction is formed on a top surface of the substrate 110a in the first region A1 and on a top surface of the substrate 110b in the second region A2. The mask pattern 210 may include the first mask pattern 212 (see FIG. 27A) and the second mask pattern 214 (see FIG. 27A). The first fin 130-1 is formed on the substrate 110 in the first region A1 and the second fin 130-2 is formed on the substrate 110 in the second region A2 by removing an upper portion of the substrate 110a in the first region A1 and an upper portion of the substrate 110b in the second region A2 by a predetermined depth through etching by using the mask pattern 210 as a mask. After the first fin 130-1 and the second fin 130-2 are formed, the second mask pattern 214 is removed and the first mask pattern 212 is maintained.

Figure 33C:
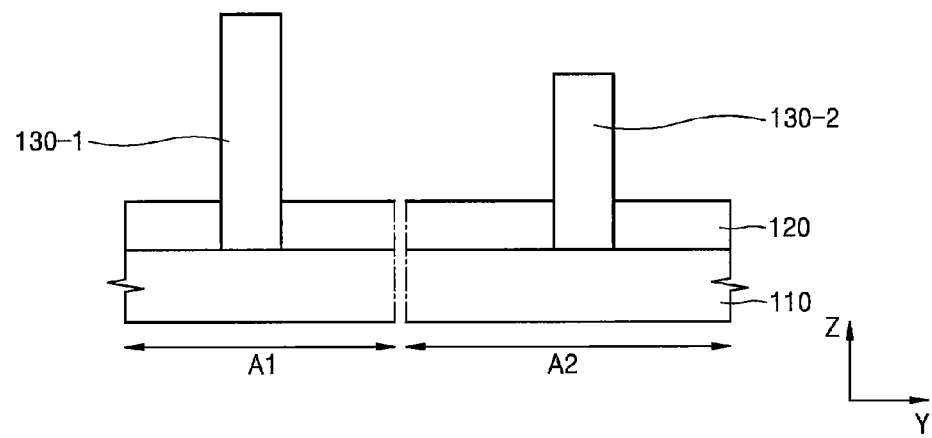

Referring to FIG. 33C, an insulating material for forming a device isolation film is deposited on an entire substrate resultant structure, planarization is performed, and then the device isolation film 120 is formed by etching the intermediate insulating film 120a (see FIG. 29A) by using the first mask pattern 212 as a mask. After the device isolation film 120 is formed, the first mask pattern 212 is removed.

Figure 33D:
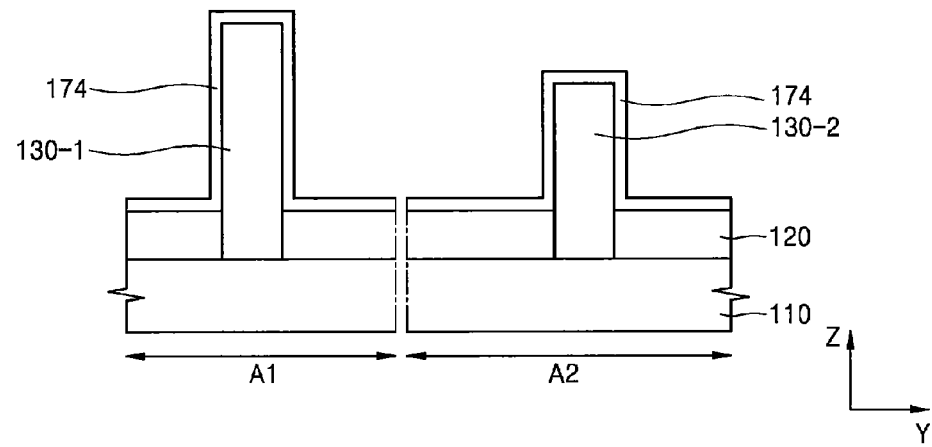

Referring to FIG. 33D, after the device isolation film 120 is formed, the dielectric film 174 is formed on up to the entire substrate resultant structure to have a predetermined thickness. For example, the dielectric film 174 may cover the device isolation film 120, both side surfaces and a top surface of the first fin 130-1, and both side surfaces and a top surface of the second fin 130-2.

Figure 33E:
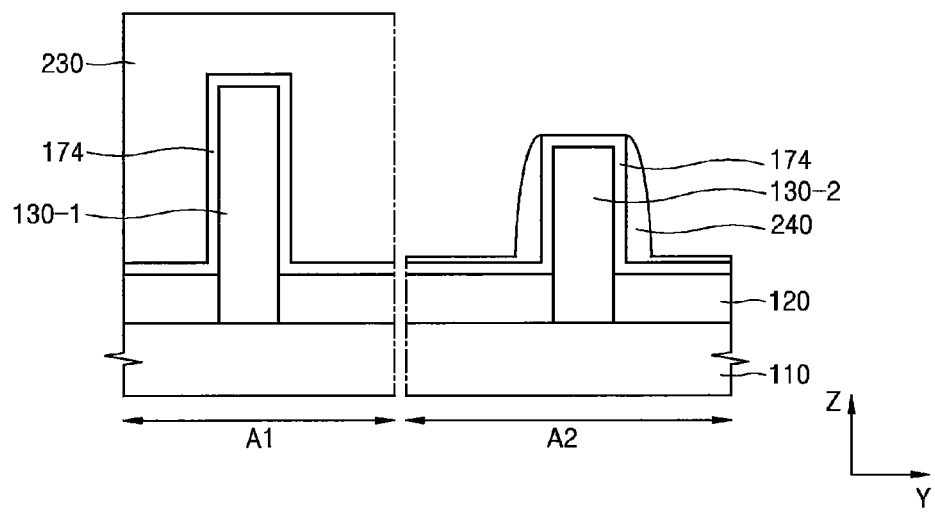

Referring to FIG. 33E, after the dielectric film 174 is formed, a mask layer 230 that covers up to the entire substrate resultant structure in the first region A1 is formed. After the mask layer 230 is formed, an insulating film for forming a fin spacer is deposited on up to the entire substrate resultant structure in the second region A2, and a fin spacer 240 that exposes the dielectric film 174 on the top surface of the second fin 130-2 is formed by performing an etch-back and/or anisotropic etching process. The fin spacer 240 may cover the both side surfaces of the second fin 130-2. The fin spacer 240 may exist on the device isolation film 120 to have a low thickness. This is because when the insulating film for forming the fin spacer is etched, an etch rate between the second fins 130-2 is less than an etch rate on the top surfaces of the second fins 130-2. That is, when the insulating film for forming the fin spacer is etched and the dielectric film 174 on the top surfaces of the second fins 130-2 is exposed due to an etch rate difference between positions, the insulating film for forming the fin spacer on the device isolation film 120 may remain with a low thickness. Accordingly, the dielectric film 174 on the device isolation film 120 may not be exposed.

However, in some embodiments, when the insulating film for forming the fin spacer is etched, the insulating film for forming the fin spacer on the device isolation film 120 may also be removed, and thus, the dielectric film 174 on the device isolation film 120 may be exposed.

Figure 33F:
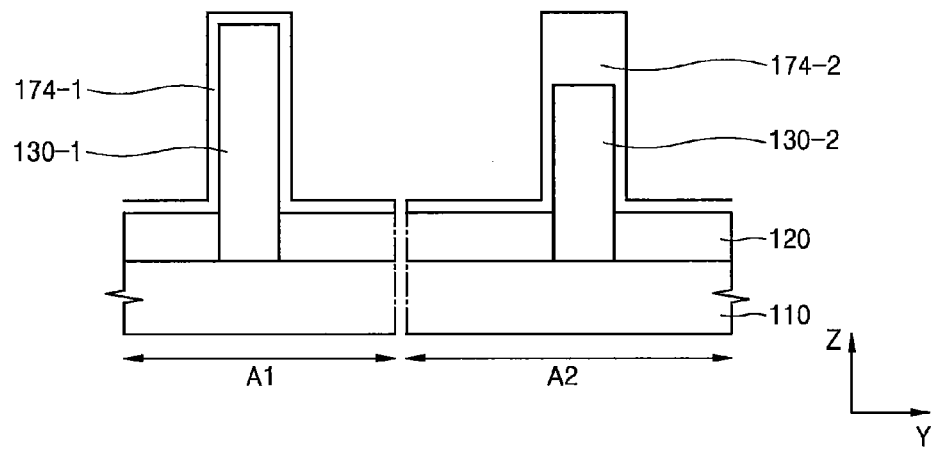

Referring to FIG. 33F, next, the dielectric film 174 that is exposed through the top surface of the second fin 130-2 is grown to have a greater thickness by using plasma/ionic oxidation and/or thermal oxidation. Due to the growth of the dielectric film 174, the second dielectric film 174-2 may be formed on the second fin 130-2. After the second dielectric film 174-2 is formed, the fin spacer 240 is removed and the mask layer 230 in the first region A1 is also removed.

Next, the first and second gate structures 170-1 and 170-2 may be formed by depositing a conductive film and performing patterning by using a mask pattern, like in FIGS. 32A and 32B. When the first and second gate structures 170-1 and 170-2 are formed in this manner, the semiconductor device 100 of FIG. 1 may be formed.

When the dielectric film 174 on the device isolation film 120 is exposed, the dielectric film 174 on the device isolation film 120 may also be grown to have a greater thickness during a process of growing the dielectric film 174. In this case, a height of the second fin 130-2 that protrudes may be reduced by a thickness of the dielectric film 174 that is grown.

FIGS. 34A through 34D are cross-sectional views for explaining a method of manufacturing the semiconductor device 100e of FIG. 8, according to some embodiments. The description already made with reference to FIGS. 1, 6, 8, and 26A through 32B will be briefly repeated or omitted for convenience of description.

Figure 34A:
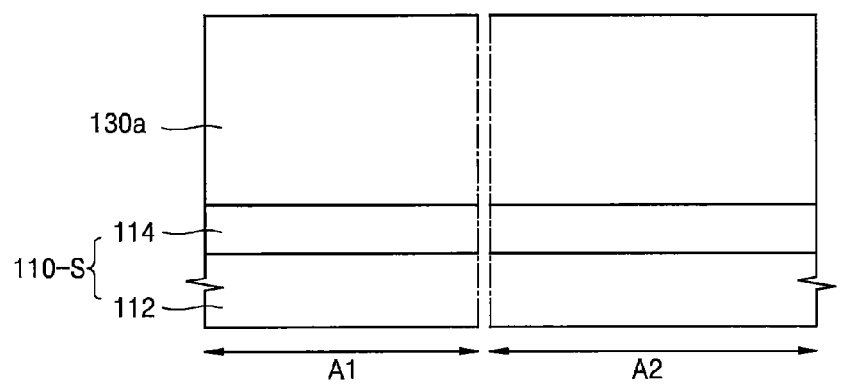
FIGS. 34A through 34D are cross-sectional views for explaining a method of manufacturing the semiconductor device of FIG. 8, according to some embodiments.

Referring to FIG. 34A, the substrate 110-S based on an SOI substrate is prepared. The substrate 110-S may include the base substrate 112 and the BOX layer 114 that is disposed on the base substrate 112. A semiconductor layer 130a is formed on the substrate 110-S. For example, the semiconductor layer 130a may be formed on the substrate 110-S by using silicon. The semiconductor layer 130a may be formed by using deposition or epitaxial growth. A thickness of the semiconductor layer 130a may be determined according to a plurality of FinFETs that are formed in the first region A1 and/or the second region A2, especially, a FinFET that requires a highest fin. The semiconductor layer 130a may include impurity ions. The impurity ions of the semiconductor layer 130a may be included during epitaxial growth or may be included during ion doping after growth.

Figure 34B:
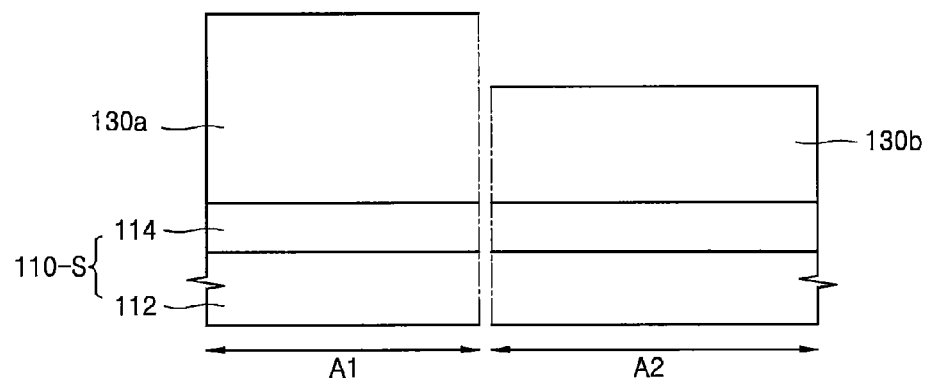

Referring to FIG. 34B, an upper portion of the semiconductor layer 130a in the second region A2 is removed by a predetermined thickness, like in FIG. 26a. Accordingly, a height of the semiconductor layer 130a in the first region A1 may be greater than a height of a semiconductor layer 130b in the second region A2.

Figure 34C:
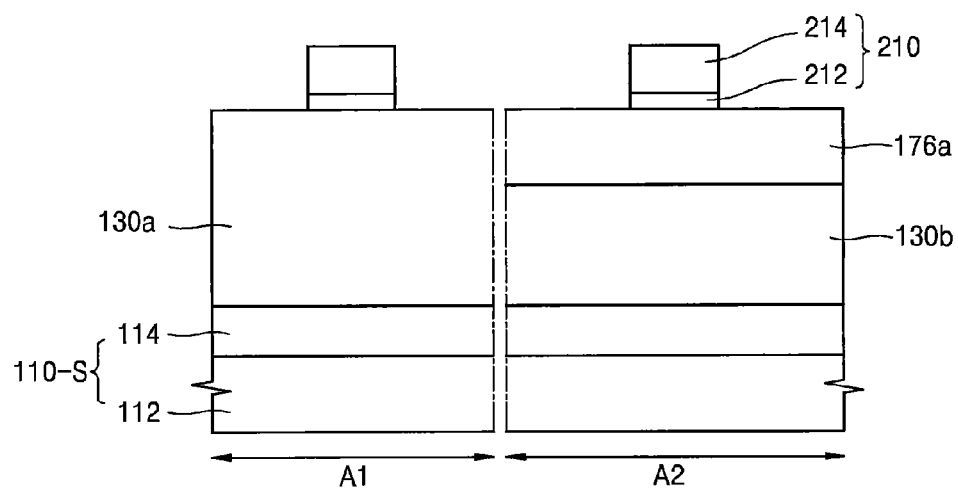

Referring to FIG. 34C, an insulating film 176a is formed on the semiconductor layer 130b in the second region A2 and the mask pattern 210 that extends in the first direction (x direction) is formed on the insulating film 176a in the second region A2 and a top surface of the semiconductor layer 130a in the first region A1, like in FIG. 27A. The mask pattern 210 may include the first mask pattern 212 and the second mask pattern 214.

Figure 34D:
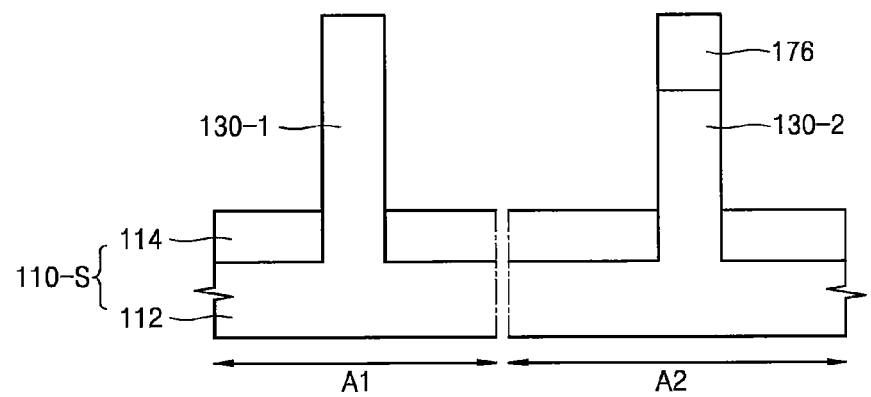

Referring to FIG. 34D, an upper portion of the semiconductor layer 130a in the first region A1 is etched and upper portions of the semiconductor layer 130b and the insulating film 176a in the second region A2 are etched, by using the mask pattern 210 as a mask. Through the etching, the first fin 130-1 may be formed on the substrate 110-S in the first region A1, the second fin 130-2 may be formed on the substrate 110-S in the second region A2, and the capping insulating film 176 may be formed on the second fin 130-2 in the second region A2. Next, the second mask pattern 214 may be removed, and the semiconductor device 100e of FIG. 8 may be formed by performing processes of FIGS. 31A through 32B.

For reference, when an SOI substrate is used, since the BOX layer 114 may function as a device isolation film, a process of forming a device isolation film may not be performed. For example, processes of FIGS. 29A through 30B may be omitted. In some embodiments, an additional device isolation film may be further formed on the BOX layer 114, and in this case, processes of FIGS. 29A through 30B may be additionally performed.

In addition, in the method of manufacturing the semiconductor device 100e of the present example embodiment, the semiconductor device 100d of FIG. 6 may be formed by performing the process of FIGS. 33A through 33F by using the SOI substrate. However, a process of forming a device isolation film, like in FIG. 33C, may be omitted due to the existence of the BOX layer 114.

FIGS. 35A through 35D are cross-sectional views for explaining a method of manufacturing the semiconductor device 100i of FIG. 13, according to some embodiments. The description already made with reference to FIGS. 1, 11, 13, and 26A through 32B will be briefly repeated or omitted for convenience of description.

Figure 35A:
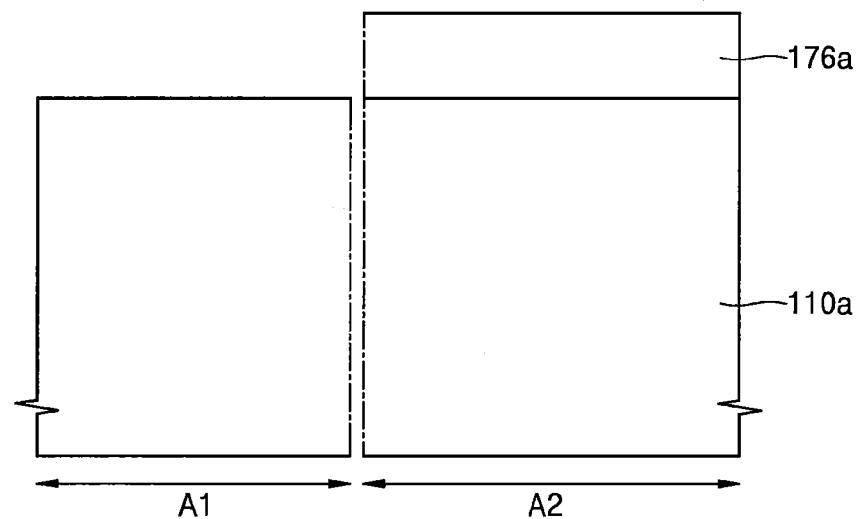
FIGS. 35A through 35D are cross-sectional views for explaining a method of manufacturing the semiconductor device of FIG. 13, according to some embodiments.

Referring to FIG. 35A, the insulating film 176a is formed on the substrate 110a in the second region A2 to have a predetermined thickness. A material of the insulating film 176a may be the same as that of the capping insulating film 176 of the semiconductor device 100a of FIG. 3. A thickness of the insulating film 176a may be the same as that of the capping insulating film 176 of FIG. 13.

Figure 35B:
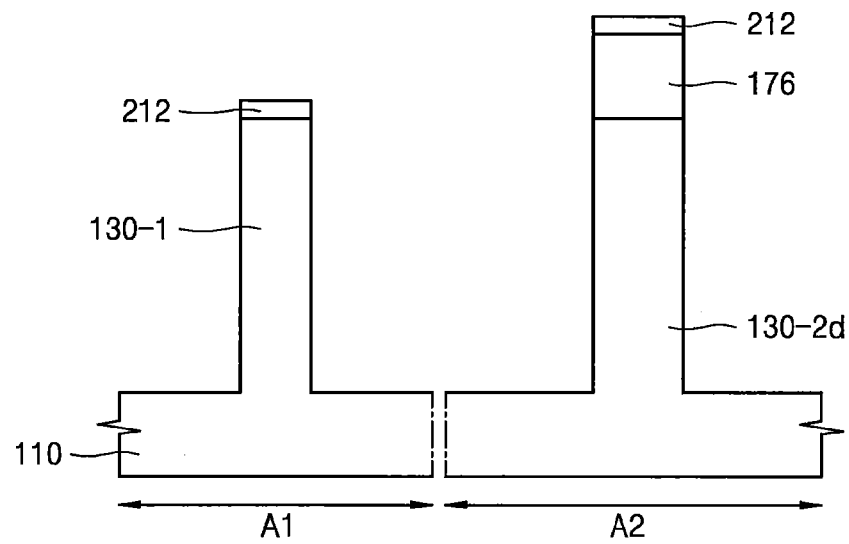

Referring to FIG. 35B, the mask pattern 210 (see FIG. 27A) is formed on a top surface of the substrate 110a in the first region A1 and on a top surface of the insulating film 176a in the second region A2. The mask pattern 210 may include the first mask pattern 212 and the second mask pattern 214. An upper portion of the substrate 110a in the first region A1 is etched and upper portions of the insulating film 176a and the substrate 110a in the second region A2 are etched, by using the mask pattern 210 as a mask. Through the etching, the first fin 130-1 may be formed on the substrate 110 in the first region A1, the second fin 130-2d may be formed on the substrate 110 in the second region A2, and the capping insulating film 176 may be formed on the second fin 130-2d in the second region A2. As shown in FIG. 35B, the height of the first fin 130-1 may be substantially the same as that of the second fin 130-2d. Next, the second mask pattern 214 is removed and only the first mask pattern 212 is maintained.

Figure 35C:
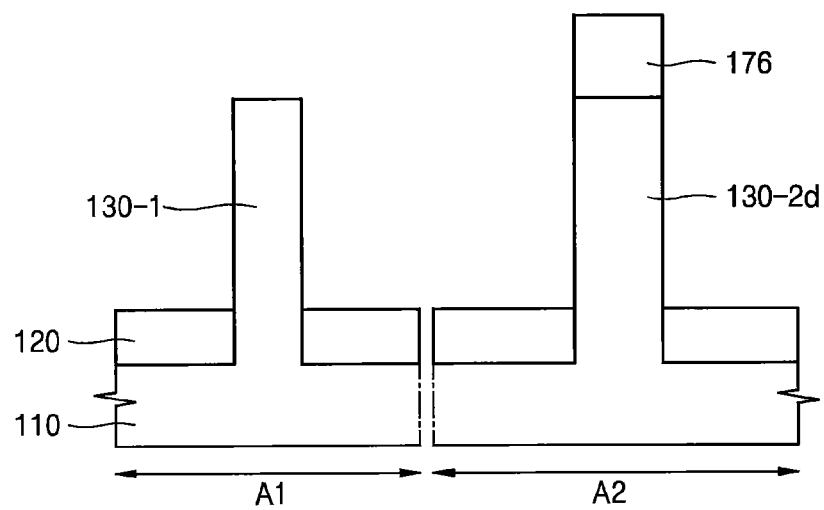

Referring to FIG. 35C, the device isolation film 120 is formed on the substrate 110 between the first fins 130-1 and the second fins 130-2d by performing processes of FIGS. 29A through 30B. After the device isolation film 120 is formed, the first mask pattern 212 is removed.

Figure 31A:
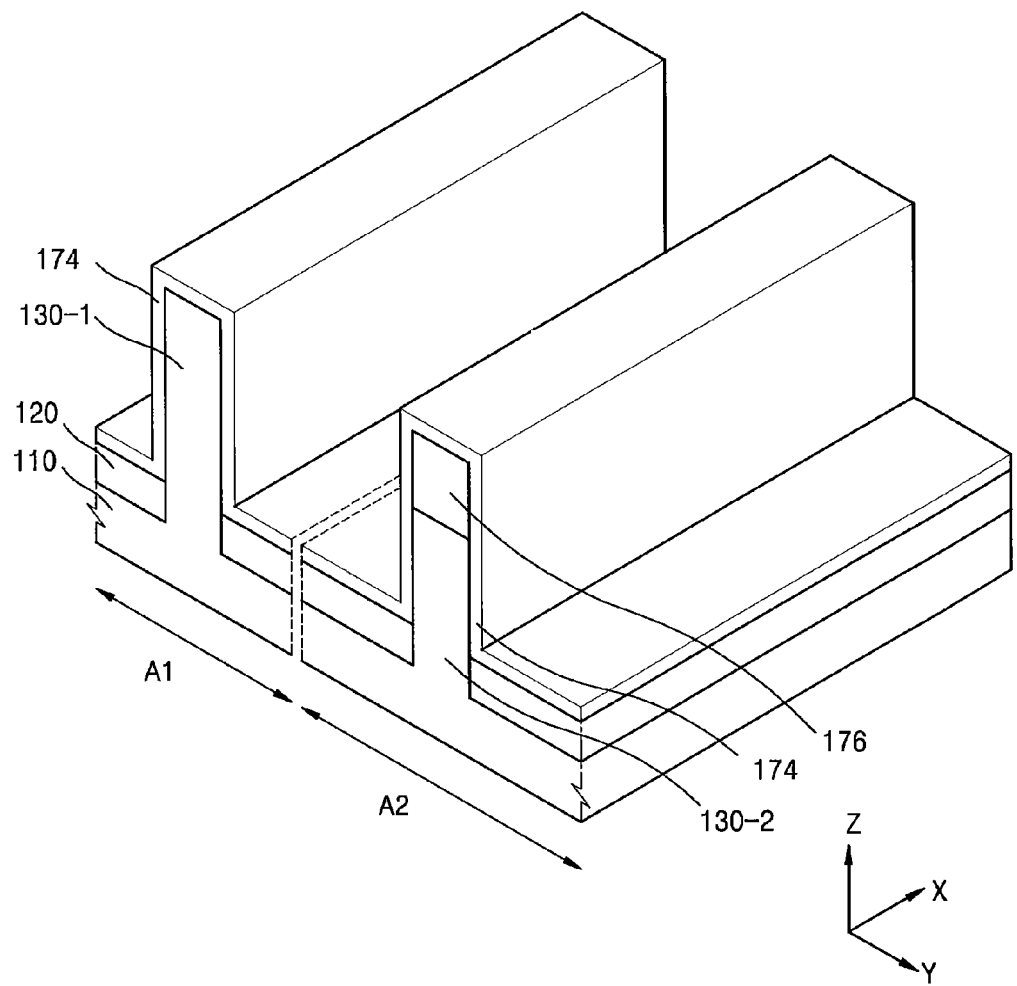
Figure 31B:
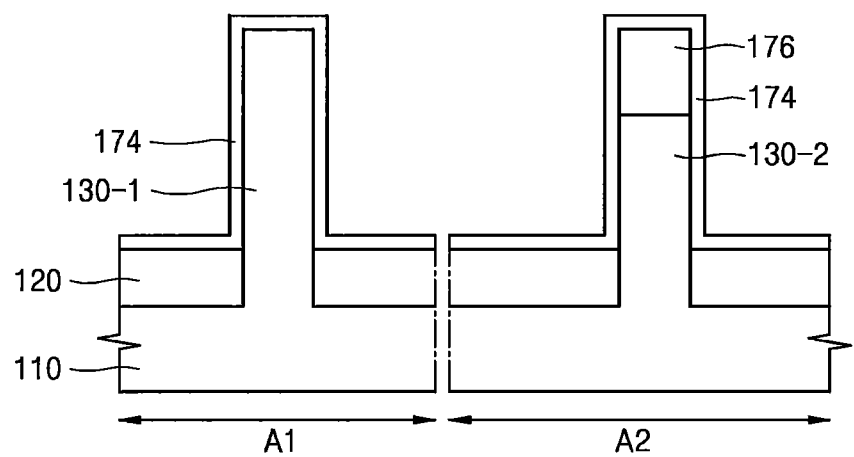
Figure 35D:
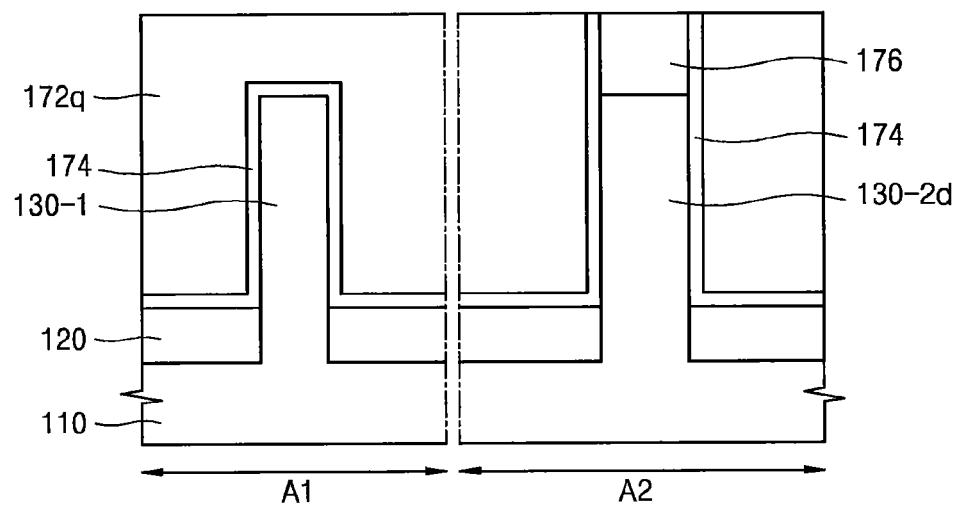

Referring to FIG. 35D, the dielectric film 174 (see FIG. 31A) is formed on an entire substrate resultant structure, like in FIG. 31A. For example, the dielectric film 174 may cover the device isolation film 120, both side surfaces and a top surface of the first fin 130-1, both side surfaces of the second fin 130-2d, and both side surfaces and a top surface of the capping insulating film 176.

Next, a conductive film is deposited on up to the entire substrate resultant structure and planarization is performed. The top surface of the capping insulating film 176 in the second region A2 may be exposed due to the planarization. For example, the top surface of the capping insulating film 176 and a top surface of a planarized conductive film 172q may be coplanar or on substantially the same plane, and the top surface of the capping insulating film 176 may be exposed from the top surface of the planarized conductive film 172q. A top surface of the dielectric film 174, instead of the top surface of the capping insulating film 176, may be exposed by adjusting an etched thickness of the conductive film.

After the conductive film is planarized, the semiconductor device 100i of FIG. 13 may be formed by forming the first gate structure 170-1 and the second gate structure 170-2i by using the mask pattern 220 (see FIGS. 32A-32B).

Figure 36A:
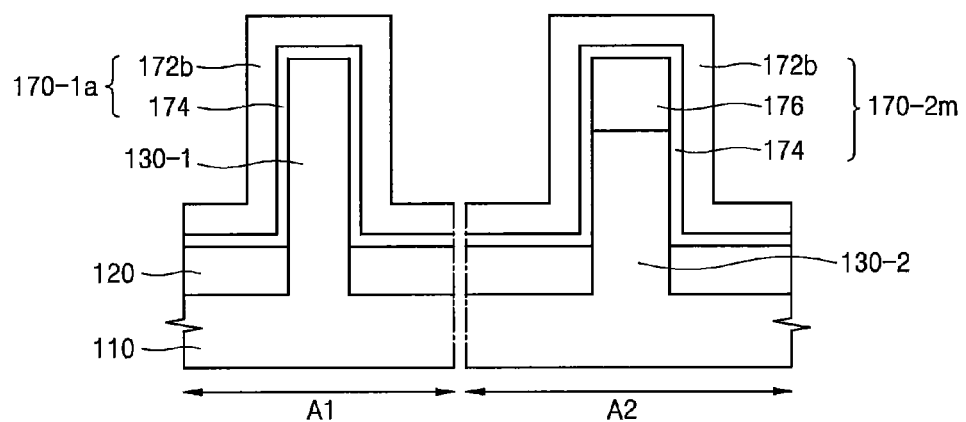
FIGS. 36A and 36B are cross-sectional views for explaining a method of manufacturing the semiconductor device of FIG. 19, according to some embodiments.
Figure 36B:
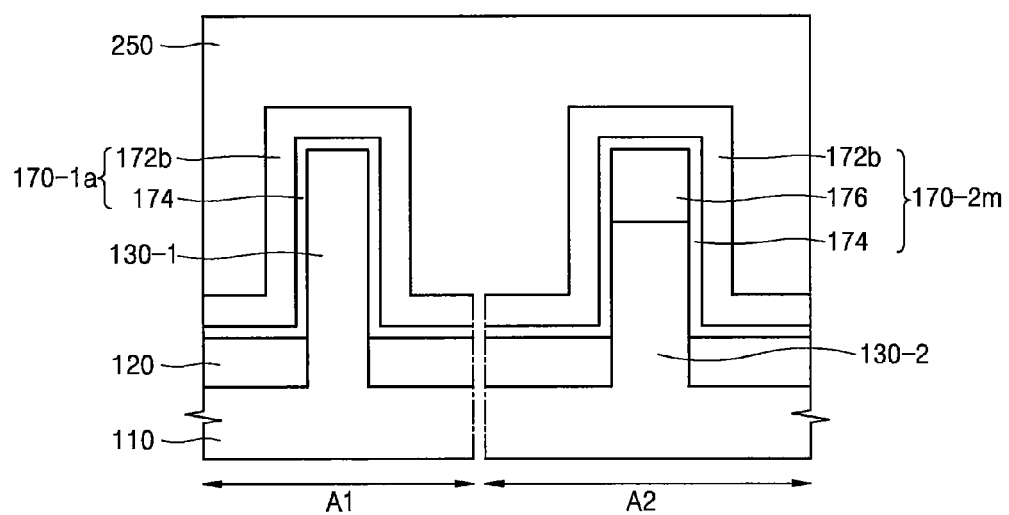

FIGS. 36A and 36B are cross-sectional views for explaining a method of manufacturing the semiconductor device 100m of FIG. 19, according to some embodiments. The description already made with reference to FIGS. 1, 17, 19, and 26A through 32B will be briefly repeated or omitted for convenience of description.

Referring to FIG. 36A, the dielectric film 174 is formed on an entire substrate resultant structure, like in FIG. 31A, and then, a conductive film 172b is formed on the dielectric film 174 to have a uniform thickness. For example, the conductive film 172b may have the same thickness on side surfaces and top surfaces of the first and second fins 130-1 and 130-2. Also, a thickness of the conductive film 172b on the device isolation film 120 may also be substantially the same as a thickness of the conductive film 172b on the first and second fins 130-1 and 130-2.

Referring to FIG. 36B, after the conductive film 172b is formed, a sacrificial film 250 is formed on up to the entire substrate resultant structure, and planarization is performed. The sacrificial film 250 may be an insulating film such as an oxide film or a nitride film. The sacrificial film 250 may be formed in order to pattern the conductive film 172b. Next, the mask pattern 220 that extends in the second direction (y direction) is formed on the sacrificial film 250, like in FIG. 32A, and the sacrificial film 250 and the conductive film 172b are patterned by using the mask pattern 220. Next, the semiconductor device 100m of FIG. 19 may be formed by removing the sacrificial film 250.

Figure 37:
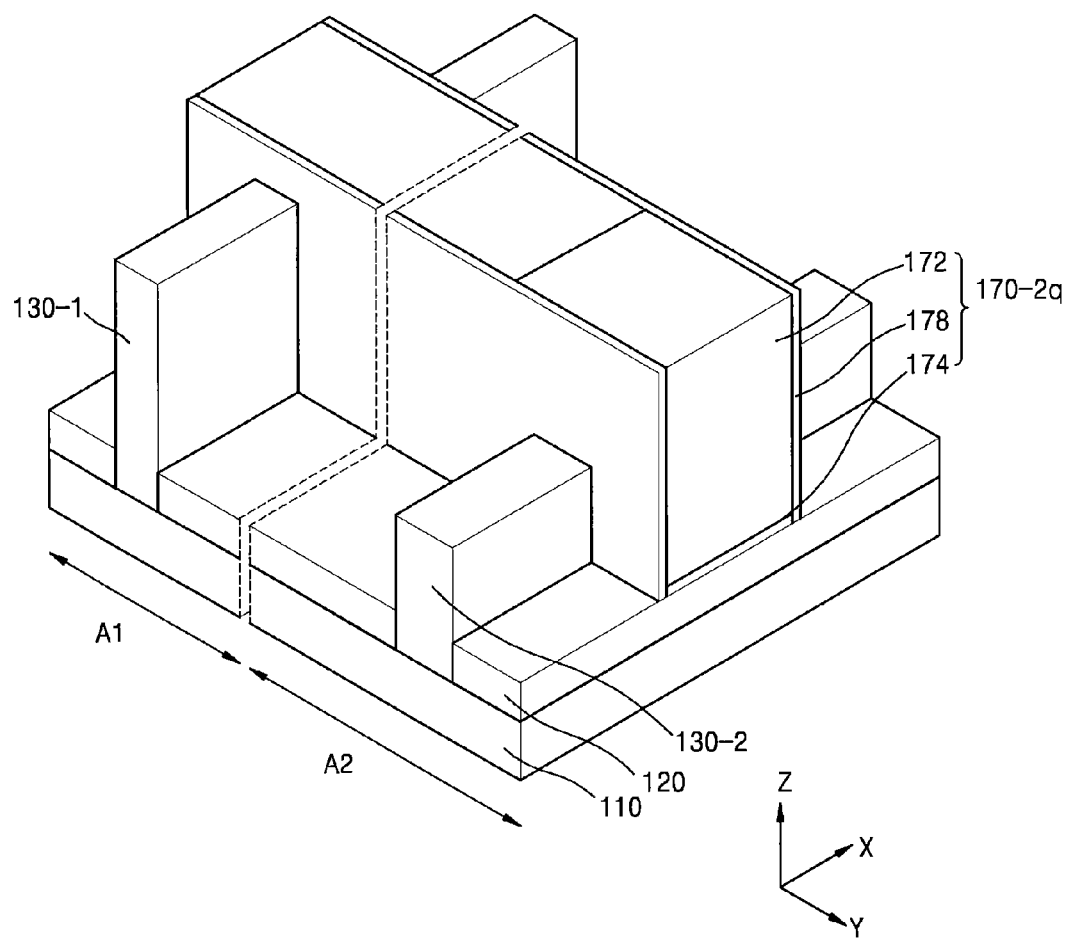
FIG. 37 is a cross-sectional view for explaining a method of manufacturing the semiconductor device of FIG. 23, according to some embodiments.

FIG. 37 is a cross-sectional view for explaining a method of manufacturing the semiconductor device 100q of FIG. 23, according to some embodiments. The description already made with reference to FIGS. 1, 23, and 33A through 33F will be briefly repeated or omitted for convenience of description.

Referring to FIG. 37, a structure such as the semiconductor device 100 of FIG. 1 is formed by using the process of FIGS. 33A through 33F, and then, the gate structure 170 is formed by forming a gate spacer 178 on both side surfaces of the gate electrode 172. The gate structure 170 may include the first gate structure 170-1b and a second gate structure 170-2q, like in the semiconductor device 100q of FIG. 23.

Next, the first fin 130-1b and the second fin 130-2f as in FIG. 23 are formed by epitaxially growing the first and second fins 130-1 and 130-2 on both side surfaces of the gate spacer 178. The epitaxial growth of the first and second fins 130-1 and 130-2 may be performed by epitaxially growing the first and second fins 130-1 and 130-2, or by removing upper portions of the first and second fins 130-1 and 130-2 by using the gate structure 170 as a mask and epitaxially growing lower portions of the first and second fins 130-1 and 130-2 remaining between the device isolation films 120. In some embodiments, portions of the first and second fins 130-1 and 130-2 between the device isolation films 120 and portions of the device isolation films 120 may be removed and epitaxial growth may be performed based on the substrate 110. In this case, widths of the first and second fins 130-1 and 130-2 between the device isolation films 120 in the second direction (y direction) may be increased.

Figure 38:
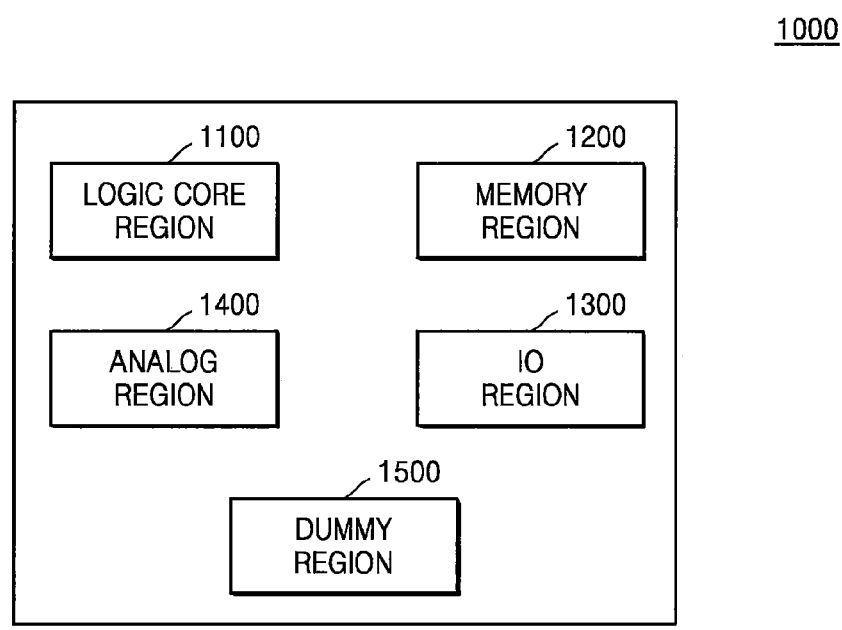
FIG. 38 is a block diagram illustrating device regions of a semiconductor device, according to some embodiments.

FIG. 38 is a block diagram illustrating device regions of a semiconductor device 1000, according to some embodiments.

Referring to FIG. 38, the semiconductor device 1000 of the present example embodiment may include a logic core region 1100, a memory region 1200, an I/O region 1300, an analog region 1400, and a dummy region 1500. The logic core region 1100 may correspond to the first region A1 where logic devices are formed in the semiconductor device 100 of FIG. 1. The I/O region 1300 may correspond to the second region A2 where I/O devices are formed in the semiconductor device 100 of FIG. 1. The I/O region 1300 may be referred to as a peripheral device region. Memory devices such as static random-access memory (SRAM) may be disposed in the memory region 1200. Dummy patterns may be formed in the dummy region 1500.

In the semiconductor device 1000 of the present example embodiment, a FinFET having a triple-gate structure may be disposed in the logic core region 1100 or the memory region 1200, and a FinFET having a double-gate structure may be disposed in the I/O region 1300 or the analog region 1400. Also, FinFETs having a double-gate structure (as well as FinFETs having a triple-gate structure) may be disposed in the logic core region 1100 or the memory region 1200. Since a FinFET having a double-gate structure and a FinFET having a triple-gate structure are appropriately combined and disposed, the performance of the semiconductor device 1000 may be improved and the problem of a leakage current and reduced reliability may be effectively addressed or solved.

Figure 39:
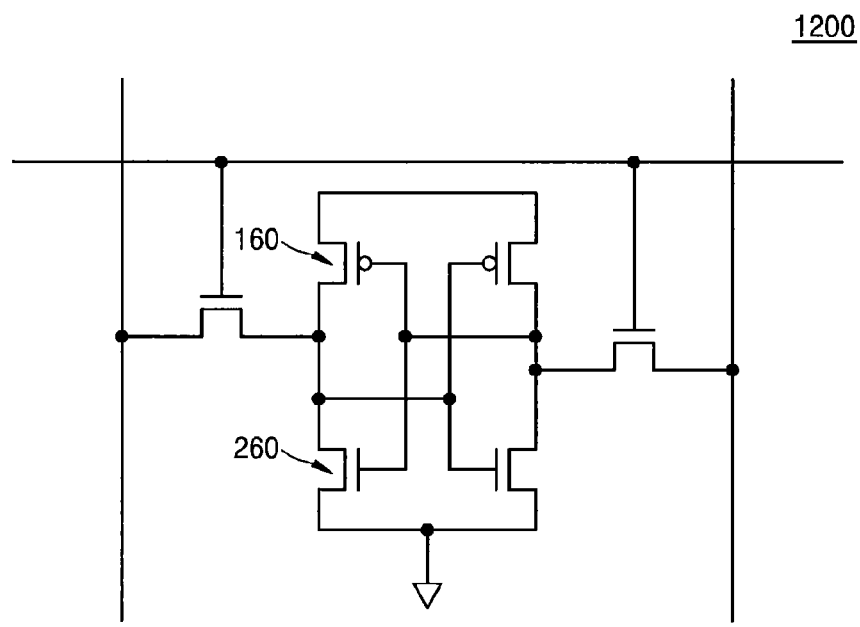
FIG. 39 is a circuit diagram illustrating static random-access memory (SRAM) including fin field-effect transistors (FinFETs) having different gate structures, according to some embodiments.

FIG. 39 is a circuit diagram illustrating SRAM 1200 including FinFETs having different gate structures, according to some embodiments.

Referring to FIG. 39, the SRAM 1200 may include 6 FinFETs. Two of the 6 FinFETs may be p-type FinFETs 160 and four of the 6 FinFETs may be n-type FinFETs 260. In the SRAM 1200, each of the p-type FinFETs 160 may be a pull-up transistor and each of the n-type FinFETs 260 may be a pull-down transistor. In the SRAM 1200 of the present example embodiment, the p-type FinFET 160 may be formed to have a triple-gate structure and the n-type FinFET 260 may be formed to have a double-gate structure. Since the p-type FinFET 160 is formed to have a triple-gate structure and the n-type FinFET 260 is formed to have a double-gate structure, a low hole mobility of the p-type FinFET 160 compared to a high electron mobility of the n-type FinFET 260 may be compensated for. Accordingly, the performance of the p-type FinFET 160 and the performance of the n-type FinFET 260 may be balanced.

Figure 40:
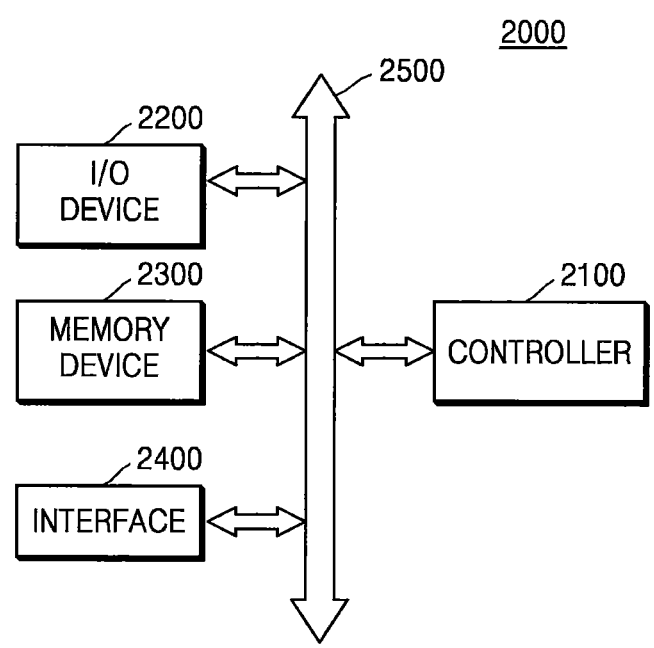
FIG. 40 is a block diagram illustrating an electronic system including FETs having different gate structures, according to some embodiments.

FIG. 40 is a block diagram illustrating an electronic system 2000 including FETs having different gate structures, according to some embodiments.

Referring to FIG. 40, the electronic system 2000 may include a controller 2100, an I/O device 2200, a memory device 2300, an interface 2400, and a bus 2500. The controller 2100, the I/O device 2200, the memory device 2300, and/or the interface 2400 may be connected to one another via the bus 2500. The bus 2500 may be a path through which data is transmitted between elements.

The controller 2100 may include a microprocessor, a digital signal processor, a microcontroller, and/or logic devices for performing similar functions thereto. The controller 2100 may include logic devices that are formed in the first region A1 of any of the semiconductor devices 100, 100a, . . . , and 100r of the example embodiments described herein. The I/O device 2200 may include a keypad, a keyboard, and/or a display device. The I/O device 2200 may include I/O devices that are formed in the second region A2 of any of the semiconductor devices 100, 100a, . . . , and 100r of the example embodiments described herein. The memory device 2300 may store data and/or commands. Also, the memory device 2300 may further include another type of semiconductor memory device, for example, a nonvolatile memory device and/or SRAM. FinFETs having different gate structures of any of the semiconductor devices 100, 100a, . . . , and 100r according to the example embodiments described herein may also be applied to the memory device 2300. The interface 2400 may transmit data to a communication network or receive data from the communication network. The interface 2400 may be a wired interface or a wireless interface. For example, the interface 2400 may include an antenna or a wired/wireless transceiver. The interface 2400 may include a FinFET having a double-gate structure that is formed in the second region A2 of any of the semiconductor devices 100, 100a, . . . , and 100r of the example embodiments described herein.

The electronic system 2000 may be applied to a personal digital assistant (PDA), a portable computer, a web tablet, a wireless phone, a mobile phone, a digital music player, a memory card, and/or any electronic product for wirelessly transmitting and/or receiving information.

As described above, in a semiconductor device including FinFETs having different gate structures according to the one or more embodiments, since a FinFET having a triple-gate structure is formed in a first region where logic devices are formed and a FinFET having a double-gate structure is formed in a second region where I/O devices are formed, the performance of the logic devices may be improved, the reliability of the I/O devices may be improved, and a leakage current may be reduced or prevented.

Also, in a semiconductor device including FinFETs having different gate structures according to the one or more embodiments, FinFETs having a triple-gate structure and a double-gate structure are combined and formed in a first region to be suitable for functions of logic devices in the first region, the performance of all of the logic devices may be improved.

While the inventive concepts have been particularly shown and described with reference to example embodiments thereof, it will be understood that various changes in form and details may be made therein without departing from the spirit and scope of the following claims. Accordingly, the scope of the inventive concepts is defined by the appended claims.

What is claimed is:

1. A semiconductor device comprising:
a substrate;
a first fin field-effect transistor (FinFET) having a triple-gate structure that is on the substrate; and
a second FinFET having a double-gate structure that is on the substrate,
wherein the first FinFET is disposed in a first region of the substrate comprising logic transistors, and the second FinFET is disposed in a second region of the substrate comprising input/output (I/O) transistors.

2. The semiconductor device of claim 1, further comprising a third FinFET having a double-gate structure that is disposed in the first region of the substrate comprising the logic transistors.

3. The semiconductor device of claim 1, wherein a first fin of the first FinFET has a first height from the substrate, extends in a first direction, and, has a first width in a second direction that is perpendicular to the first direction, and
a second fin of the second FinFET has a second height from the substrate, extends in the first direction, and has a second width in the second direction,
wherein the second height is less than or equal to the first height.

4. The semiconductor device of claim 3, wherein the second width is greater than or equal to the first width.

5. The semiconductor device of claim 3, wherein:
the first FinFET comprises at least one first gate electrode that surrounds a channel region of the first fin, and the first FinFET has a first gate length corresponding to a width of the at least one first gate electrode in the first direction; and
the second FinFET comprises at least one second gate electrode that surrounds a channel region of the second fin, and the second FinFET has a second gate length corresponding to a width of the at least one second gate electrode in the first direction, wherein the first gate length is less than or equal to the second gate length.

6. The semiconductor device of claim 3, wherein a cross-section of the second fin, perpendicular to the first direction, has a rectangular shape.

7. The semiconductor device of claim 3, wherein a cross-section of the second fin, perpendicular to the first direction, has a trapezoidal shape in which a lower side is longer than an upper side.

8. The semiconductor device of claim 3, wherein in the first FinFET, a channel is to be formed on opposing side surfaces and a top surface of the first fin, and in the second FinFET, a channel is to be formed on opposing side surfaces of the second fin but not on a top surface thereof.

9. The semiconductor device of claim 8, wherein the second FinFET comprises a gate electrode on the opposing side surfaces and the top surface of the second fin, wherein a dielectric film is disposed between the gate electrode and the second fin, and the dielectric film on the top surface of the second fin is thicker than the dielectric film on the opposing side surfaces of the second fin.

10. The semiconductor device of claim 9, wherein the dielectric film on the top surface of the second fin comprises a capping insulating film on the top surface of the second fin and an outer dielectric film that extends from the dielectric film on the opposing side surfaces of the second fin and covers the capping insulating film.

11. The semiconductor device of claim 8, wherein the second FinFET comprises a gate electrode on the opposing side surfaces of the second fin and a capping insulating film on a top surface of the second fin.

12. The semiconductor device of claim 1, wherein the substrate comprises one selected from the group consisting of silicon (Si), germanium (Ge), a group IV-IV compound semiconductor, and a group III-V compound semiconductor.

13. The semiconductor device of claim 1, wherein the substrate is a silicon bulk substrate or a silicon-on-insulator (SOI) substrate.

14. A semiconductor device comprising:
a substrate;
a first fin field-effect transistor (FinFET) having a triple-structure that is in a first region on the substrate; and
a second FinFET having a double-gate structure that is in a second region on the substrate,
wherein logic transistors are disposed in the first region and input/output (I/O) transistors are disposed in the second region,
wherein a height of a first fin of the first FinFET relative to the substrate is greater than or equal to a height of a second fin of the second FinFET relative to the substrate.

15. The semiconductor device of claim 14, wherein a first dielectric film on a top surface of the first fin is thinner than a second dielectric film on a top surface of the second fin.

16. The semiconductor device of claim 15, wherein:
the first FinFET comprises a first gate electrode that surrounds a channel region of the first fin with the first dielectric film disposed between the first gate electrode and the first fin; and
the second FinFET comprises a second gate electrode that surrounds a channel region of the second fin with the second dielectric film disposed between the second gate electrode and the second fin, wherein a height of a top surface of the first gate electrode is substantially the same as that of the second gate electrode relative to the substrate.

17. The semiconductor device of claim 15, wherein the second fin extends in a first direction,
wherein a vertical cross-section of the second fin, perpendicular to the first direction, has a rectangular shape or a trapezoidal shape in which a lower side is longer than an upper side.

18. The semiconductor device of claim 14, wherein:
the first FinFET comprises a first gate electrode on opposing side surfaces and a top surface of the first fin with a dielectric film disposed between the first gate electrode and the first fin, and
the second FinFET comprises a second gate electrode on opposing side surfaces of the second fin with a dielectric film disposed between the second gate electrode and the second fin and a capping insulating film on a top surface of the second fin.

19. A semiconductor device, comprising:
a substrate comprising a logic device region including logic transistors thereon and an input/output (I/O) device region including I/O transistors thereon adjacent the logic device region;
a first fin field-effect transistor (FinFET) on the logic device region, the first FinFET comprising a first semiconductor fin protruding from the substrate and a triple-gate structure comprising a first gate dielectric layer and a first gate electrode thereon; and
a second FinFET on the I/O device region, the second FinFET comprising a second semiconductor fin protruding from the substrate and a double-gate structure comprising a second gate dielectric layer and a second gate electrode thereon,
wherein the first and second gate dielectric layers have different thicknesses.

20. The device of claim 19, wherein:
a thickness of the second gate dielectric layer at a top portion of the second semiconductor fin is sufficient to prevent formation of a channel region at the top portion thereof during operation of the second FinFET; and
a thickness of the first gate dielectric layer at a top portion of the first semiconductor fin is sufficient to allow formation of a channel region at the top portion thereof during operation of the first FinFET.

21. The device of claim 20, wherein the second gate dielectric layer comprises:
a capping insulating film on the top portion of the second semiconductor fin; and
an outer dielectric film having a uniform thickness that extends on the capping insulating film and along opposing sidewalls of the second semiconductor fin,
wherein the outer dielectric film has a same thickness as the first gate dielectric layer.

22. The device of claim 21, wherein the capping insulating film and/or the outer dielectric film comprise an etch-stop film.

23. The device of claim 20, wherein the first and second gate electrodes comprise electrically isolated portions of a same conductive layer.

24. The device of claim 23, wherein the first and second gate electrodes have a substantially uniform thickness on sidewalls and on top surfaces of the respective first and second semiconductor fins.

25. The device of claim 19, wherein a top portion of the second semiconductor fin is free of the second gate electrode, and wherein a surface of the second gate dielectric layer opposite the top portion of the second semiconductor fin is coplanar with a surface of a second gate electrode.

26. The device of claim 19, wherein a height of the first semiconductor fin relative to a surface of the substrate is greater than or equal to a height of the second semiconductor fin relative to the surface of the substrate, and/or wherein a width of the second semiconductor fin is greater than or equal to a width of the first semiconductor fin.

27. The device of claim 19, further comprising:
   a third FinFET on the logic device region, the third FinFET comprising a third semiconductor fin protruding from the substrate and a double-gate structure comprising a third gate dielectric layer and a third gate electrode thereon, wherein a thickness of the third gate dielectric layer is greater than that of the first gate dielectric layer.

28. The device of claim 19, further comprising:
   respective gate spacers on the first and second semiconductor fins between the first and second gate electrodes thereon and respective source/drain regions at ends thereof,
   wherein the respective source/drain regions comprise epitaxial structures that are larger than respective channel regions of the first and second semiconductor fins in at least one dimension.

* * * * *